(12) United States Patent
Lin et al.

(10) Patent No.: US 12,154,828 B2
(45) Date of Patent: Nov. 26, 2024

(54) SEMICONDUCTOR DEVICE HAVING A 2-D MATERIAL LAYER INCLUDING A CHANNEL REGION AND SOURCE/DRAIN REGIONS AND METHOD FOR FORMING THE SAME

(71) Applicants: TAIWAN SEMICONDUCTOR MANUFACTURING COMPANY, LTD., Hsinchu (TW); National Yang Ming Chiao Tung University, Hsinchu (TW)

(72) Inventors: Chiung-Yuan Lin, Hsinchu County (TW); Tsung-Fu Yang, Hsinchu (TW); Weicheng Chu, Tainan (TW); Ching Liang Chang, Tainan (TW); Chen Han Chou, Tainan (TW); Chia-Ho Yang, Taoyuan (TW); Tsung-Kai Lin, Nantou County (TW); Tsung-Han Lin, Hsinchu (TW); Chih-Hung Chung, Hsinchu (TW); Chenming Hu, Oakland, CA (US)

(73) Assignees: TAIWAN SEMICONDUCTOR MANUFACTURING COMPANY, LTD., Hsinchu (TW); NATIONAL YANG MING CHIAO TUNG UNIVERSITY, Hsinchu (TW)

( * ) Notice: Subject to any disclaimer, the term of this patent is extended or adjusted under 35 U.S.C. 154(b) by 394 days.

(21) Appl. No.: 17/575,147

(22) Filed: Jan. 13, 2022

(65) Prior Publication Data

US 2023/0023186 A1  Jan. 26, 2023

Related U.S. Application Data

(60) Provisional application No. 63/225,809, filed on Jul. 26, 2021.

(51) Int. Cl.
*H01L 21/8234* (2006.01)
*H01L 21/02* (2006.01)
(Continued)

(52) U.S. Cl.
CPC ............ *H01L 21/823412* (2013.01); *H01L 21/02568* (2013.01); *H01L 29/24* (2013.01);
(Continued)

(58) Field of Classification Search
CPC ....... H01L 21/02568; H01L 21/823412; H01L 21/823418; H01L 29/1606; H01L 29/24;
(Continued)

(56) References Cited

U.S. PATENT DOCUMENTS 10,141,412 B2  11/2018 Wu et al.
2013/0164928 A1  6/2013 Lim et al.
(Continued)

FOREIGN PATENT DOCUMENTS

JP  6493003 B2  4/2019
TW  202215604 A  4/2022

OTHER PUBLICATIONS

Zhihui Cheng et al., "Immunity to Contact Scaling in MoS2 Transistors Using in Situ Edge Contacts", Nano Letters, vol. 19, 2019, pp. 5077-5085.
(Continued)

*Primary Examiner* — Cheung Lee
(74) *Attorney, Agent, or Firm* — Birch, Stewart, Kolasch & Birch, LLP

(57) ABSTRACT

A semiconductor device includes a substrate, a 2-D material layer, source/drain contacts, and a gate electrode. The 2-D material layer is over the substrate, the 2-D material layer includes source/drain regions and a channel region between the source/drain regions, in which the 2-D material layer is made of a transition metal dichalcogenide (TMD). The
(Continued)

source/drain contacts are in contact with source/drain regions of the 2-D material layer, in which a binding energy of transition metal atoms at the channel region of the 2-D material layer is different from a binding energy of the transition metal atoms at the source/drain regions of the 2-D material layer. The gate electrode is over the substrate.

20 Claims, 49 Drawing Sheets

(51) Int. Cl.
    *H01L 29/24*     (2006.01)
    *H01L 29/66*     (2006.01)
    *H01L 29/76*     (2006.01)
    *H01L 29/778*    (2006.01)
    *H01L 29/786*    (2006.01)

(52) U.S. Cl.
    CPC .... *H01L 29/66969* (2013.01); *H01L 29/7606* (2013.01); *H01L 29/778* (2013.01); *H01L 29/78618* (2013.01)

(58) Field of Classification Search
    CPC ......... H01L 29/41725; H01L 29/41766; H01L 29/42356; H01L 29/512; H01L 29/66969; H01L 29/7606; H01L 29/778; H01L 29/78618; H01L 29/78681; H01L 29/78696
    See application file for complete search history.

(56) References Cited

U.S. PATENT DOCUMENTS

| | | | |
|---|---|---|---|
| 2018/0114839 A1* | 4/2018 | Wu | H01L 29/778 |
| 2020/0098657 A1* | 3/2020 | Sen Gupta | H01L 29/401 |
| 2023/0023186 A1 | 1/2023 | Lin et al. | |

OTHER PUBLICATIONS

Koma et al., "Fabrication of ultrathin heterostructures with van der Waals epitaxy," Journal of Vacuum Science & Technology B, 1985, vol. 3, No. 2, pp. 724, total 2 pages.

Lu et al., "Janus monolayers of transition metal dichalcogenides", Nature Nanotechnology, Aug. 2017, vol. 12, pp. 744-749.

* cited by examiner

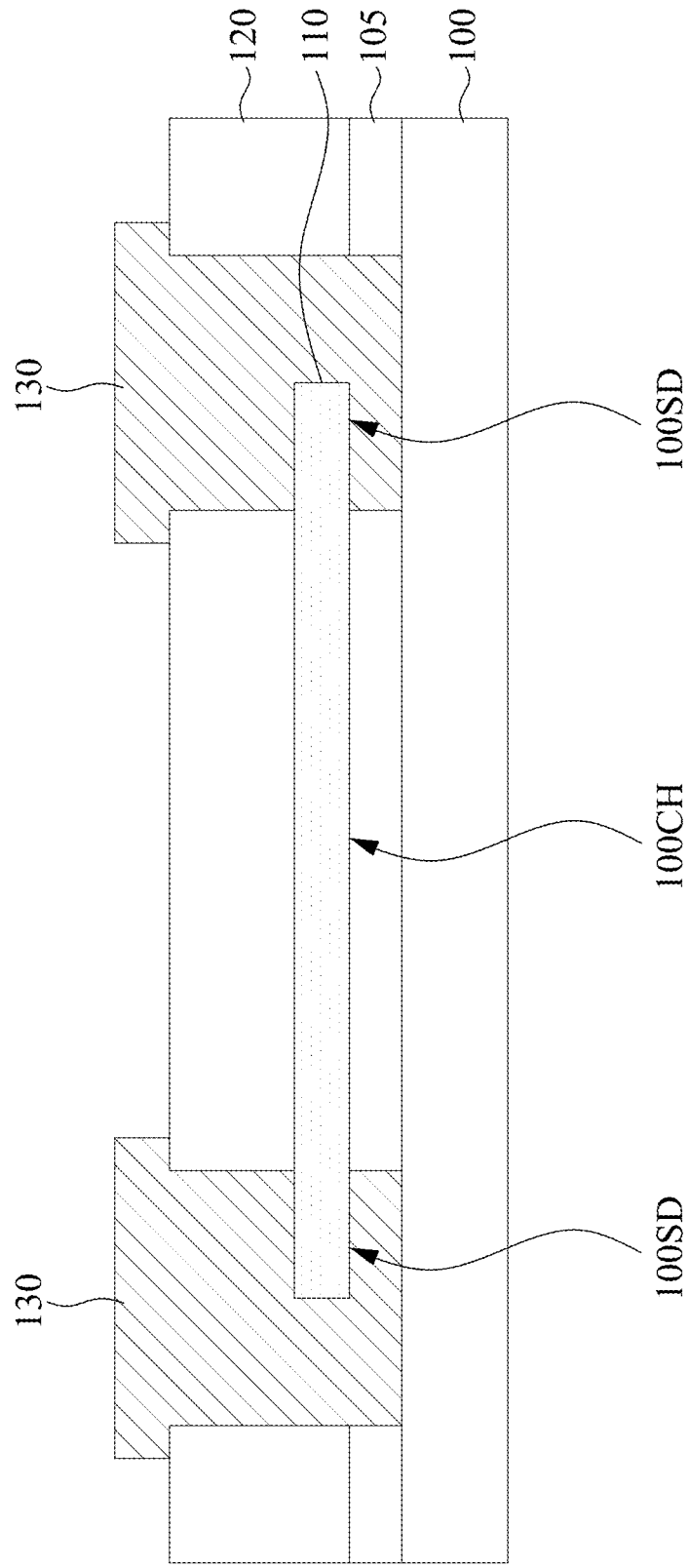

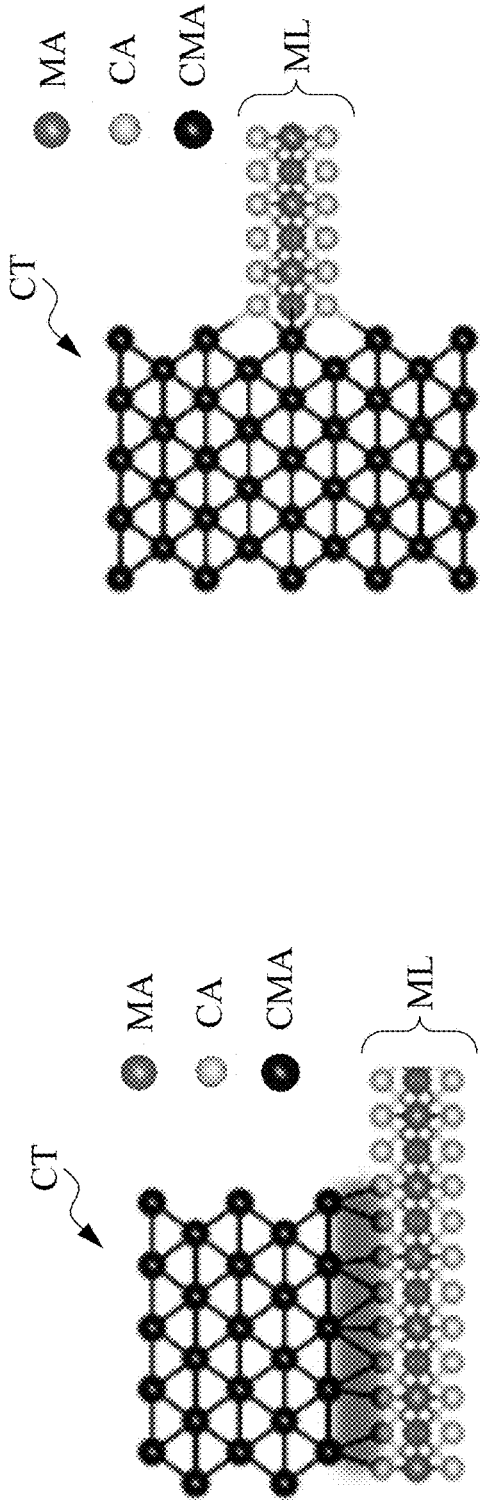
Fig. 23A
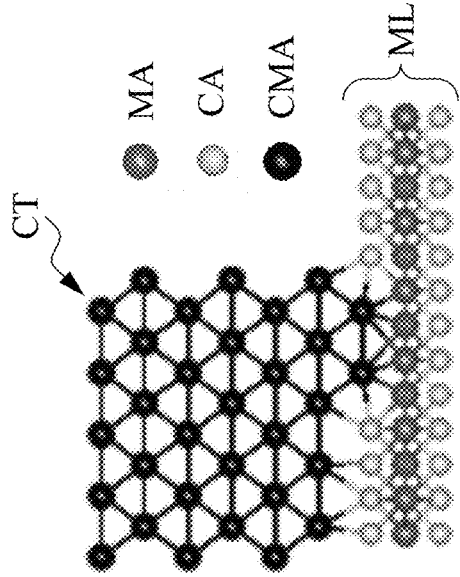
Fig. 23B
Fig. 23C

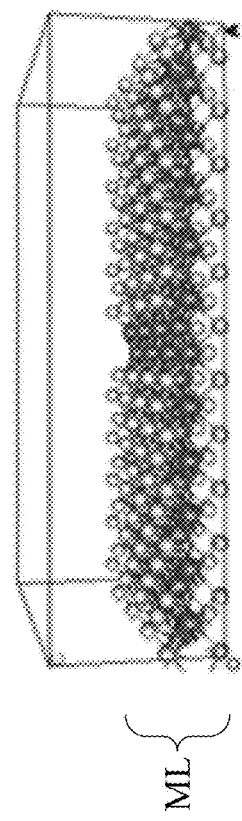
Fig. 25A
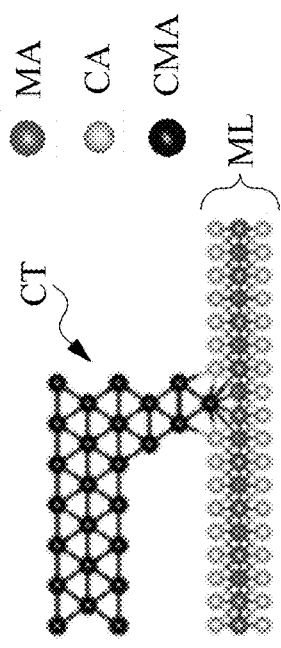
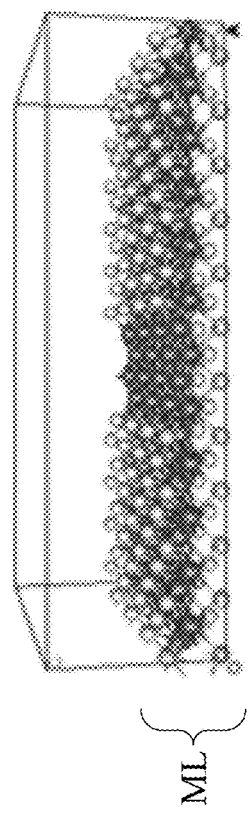
Fig. 25B
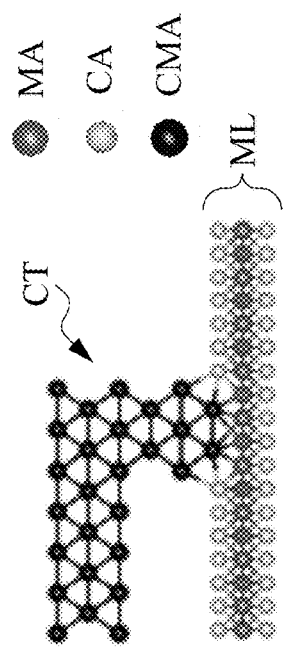
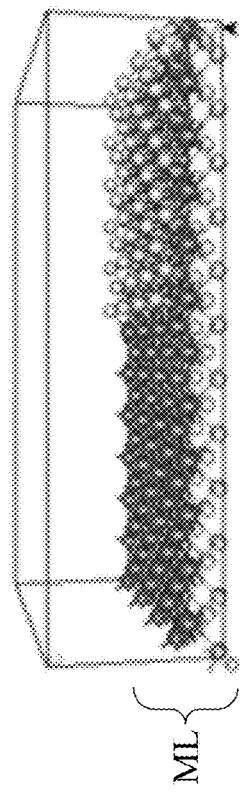
Fig. 25C
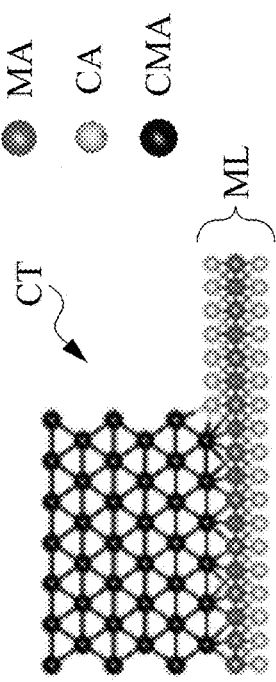

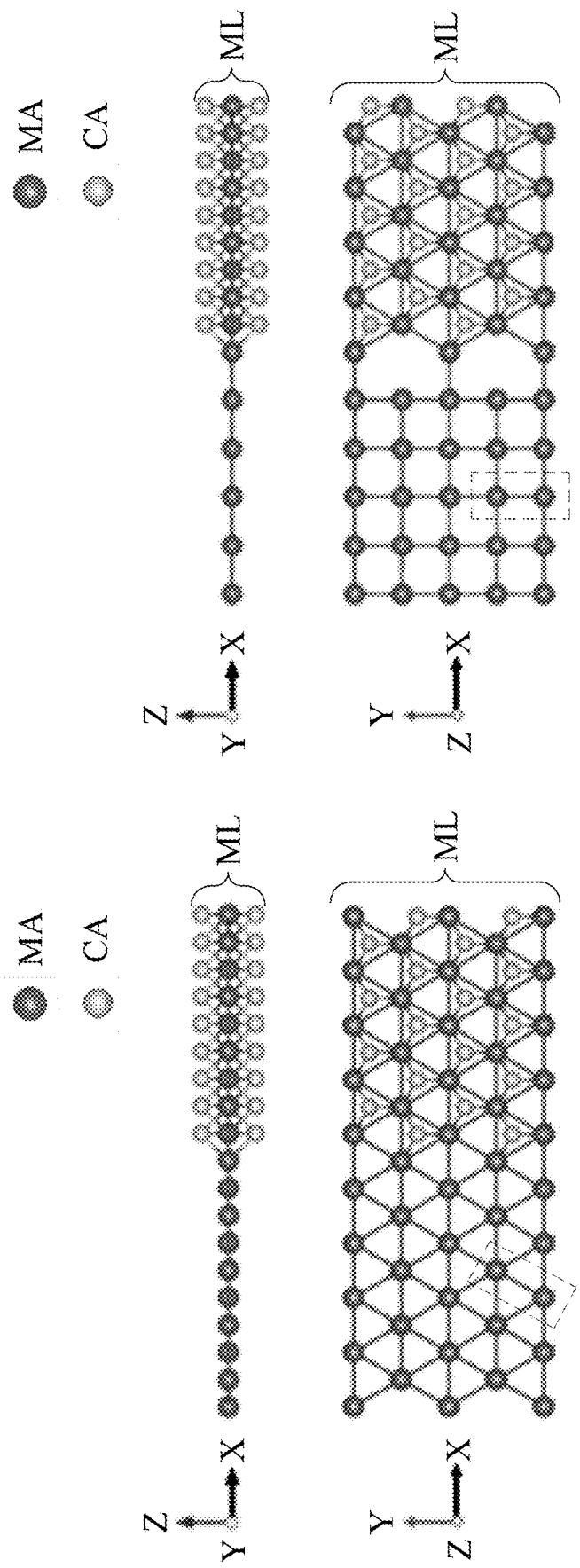

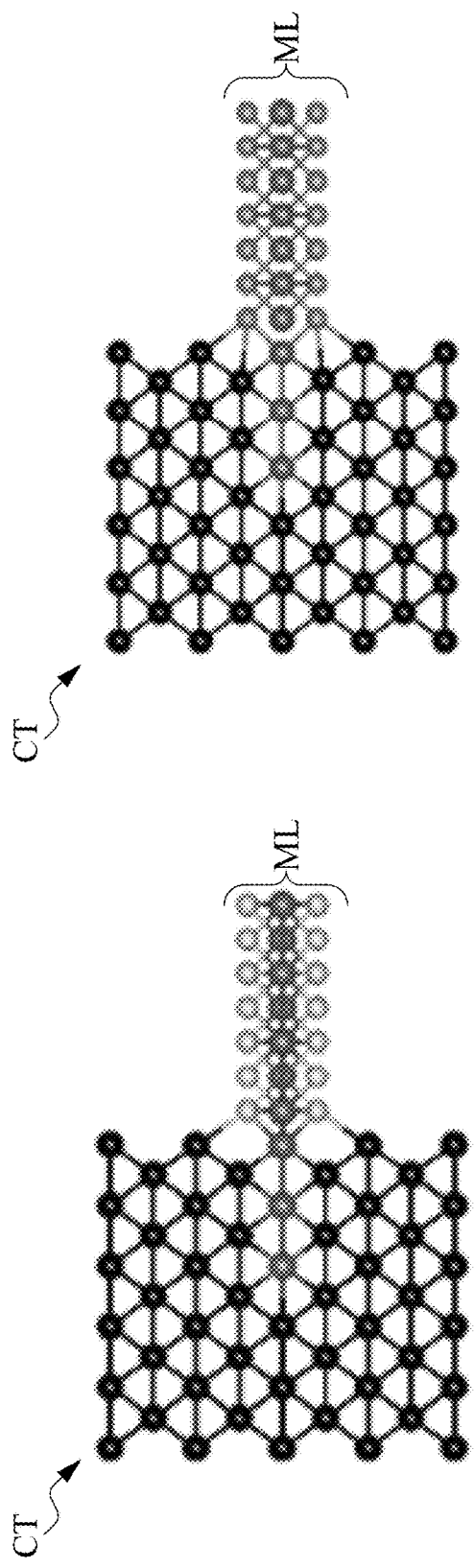
Fig. 32A
Fig. 32B
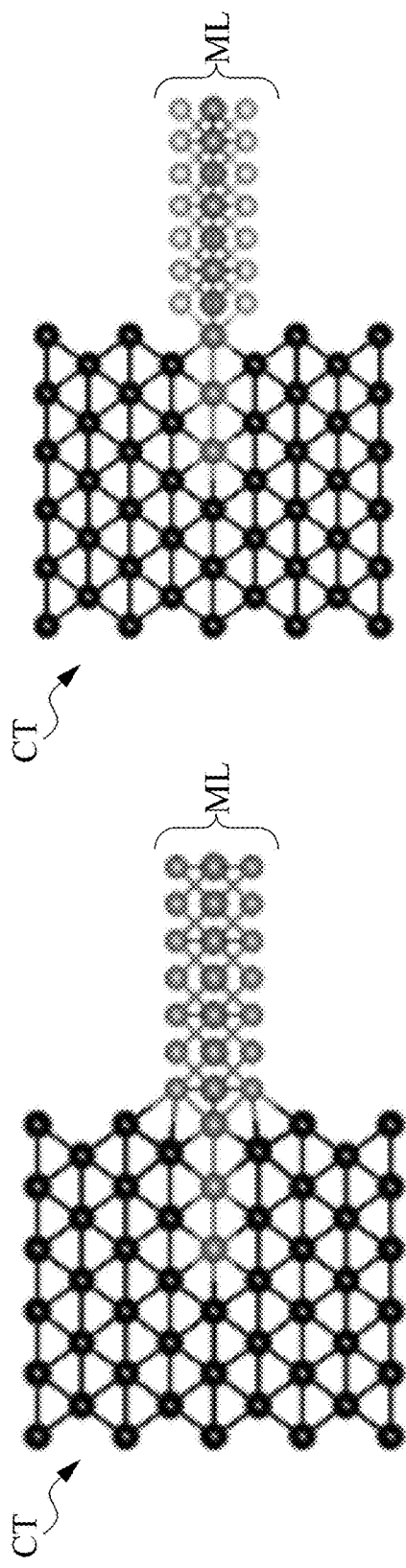
Fig. 32C
Fig. 32D

SEMICONDUCTOR DEVICE HAVING A 2-D MATERIAL LAYER INCLUDING A CHANNEL REGION AND SOURCE/DRAIN REGIONS AND METHOD FOR FORMING THE SAME

PRIORITY CLAIM AND CROSS-REFERENCE

The present application claims priority to U.S. Provisional Application Ser. No. 63/225,809, filed Jul. 26, 2021, which is herein incorporated by reference.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 23A, 23B, 23C, 23D, and 23E illustrate crystal structures of a monolayer of a 2-D material layer and a metal contact in accordance with some example embodiments.

FIGS. 25A, 25B, and 25C illustrate crystal structures of a monolayer of a 2-D material layer and a metal contact in accordance with some example embodiments.

FIGS. 27A and 27B illustrate crystal structures of a monolayer of a 2-D material layer in accordance with some example embodiments.

FIGS. 32A, 32B, 32C, and 32D illustrate crystal structures of a monolayer of a 2-D material layer and a metal contact in accordance with some example embodiments.

DETAILED DESCRIPTION

Figure 1A:
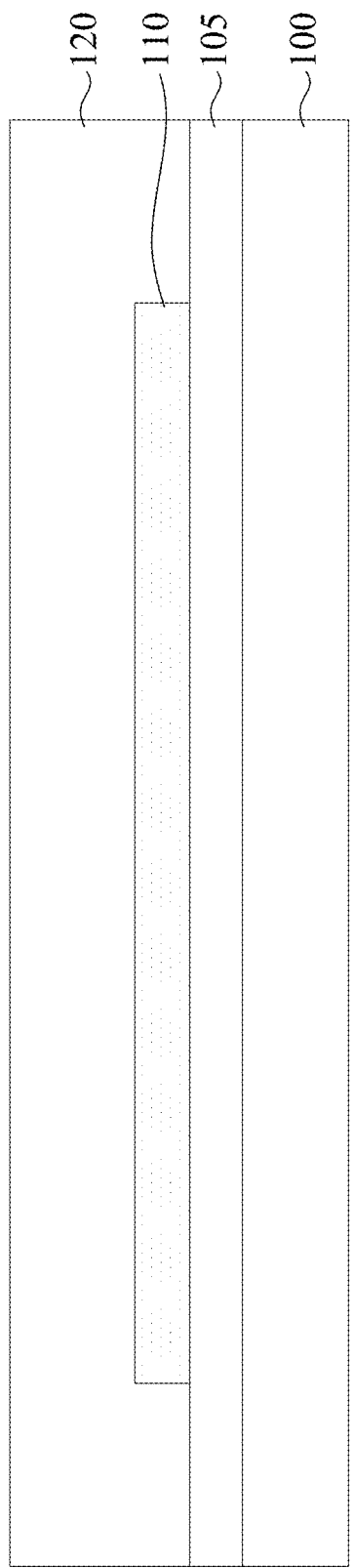
FIGS. 1A to 5 illustrate a method in various stages of fabricating the memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 5 illustrate a method in various stages of fabricating a semiconductor device in accordance with some embodiments of the present disclosure. Although the views shown in FIGS. 1A to 5 are described with reference to a method, it will be appreciated that the structures shown in FIGS. 1A to 5 are not limited to the method but rather may stand alone separate of the method. Although FIGS. 1A to 5 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 1B:
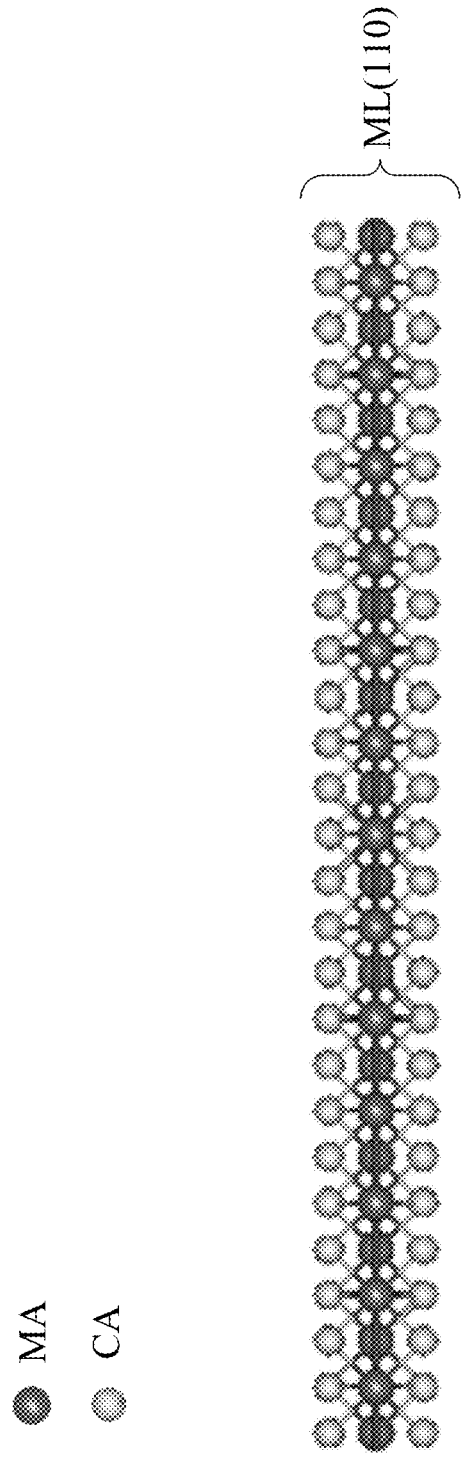

Reference is made to FIGS. 1A and 1B, in which FIG. 1A illustrates a cross-sectional view of an intermediate stage for fabricating a semiconductor device, and FIG. 1B illustrates a crystal structure of a monolayer of a 2-D material layer in accordance with some example embodiments. Shown there is a substrate 100. Generally, the substrate 100 illustrated in FIG. 1A may include a bulk semiconductor substrate. The bulk semiconductor generally include the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped. Other substrates that may be used include multi-layered substrates, gradient substrates, or hybrid orientation substrates. In some other embodiments, the substrate 100 may include sapphire (e.g. crystalline $Al_2O_3$), e.g. a large grain or a single crystalline layer of sapphire or a coating of sapphire. As another example, the substrate 100 may be a sapphire substrate, e.g. a transparent sapphire substrate comprising, as an example, $\alpha$-$Al_2O_3$. Other elementary semiconductors like germanium may also be used for substrate 100.

In some embodiments where the substrate 100 is a doped substrate 100, the dopant concentrations may be in a range from about $1\times10^{20}$ $cm^{-3}$ to about $1\times10^{21}$ $cm^{-3}$. In some embodiments, the substrate 100 may act as a part of a gate structure (i.e., the gate structure 150 of FIG. 5). Accordingly, if the dopant concentration of the substrate 100 is too low (e.g., much lower than about $1\times10^{20}$ $cm^{-3}$), the substrate 100 may not provide sufficient conductivity. On the other hand, if the dopant concentration of the substrate 100 is too high (e.g., much higher than about $1\times10^{21}$ $cm^{-3}$), the performance of the device may not be significantly improved.

A gate dielectric layer 105 is deposited over the substrate 100. In greater details, the gate dielectric layer 105 is deposited on a front side of the substrate 100. The gate dielectric layer 105 includes, for example, an oxide, such as silicon oxide ($SiO_2$), aluminum oxide ($Al_2O_3$). In some other embodiments, the gate dielectric layer 105 may include a high-k dielectric material such as oxides of metals (e.g., oxides of Hf, Al, Zr, La, Mg, Ba, Ti, and other metals), and the like, or combinations thereof, or multilayers thereof. In some embodiments, the gate dielectric layer 105 may be deposited by suitable deposition process, such as thermal evaporation, a chemical vapor deposition (CVD) process, a physical vapor deposition (PVD) process, an atomic layer deposition (ALD) process, or other suitable deposition process.

A 2-D material layer 110 is formed over the gate dielectric layer 105. In some embodiments, the 2-D material layer 110 is in direct contact with the top surface of the gate dielectric layer 105. Accordingly, the 2-D material layer 110 is vertically separated from the substrate 100 by the gate dielectric layer 105. In some embodiments, the 2-D material layer 110 may be patterned, such as by a photolithography process, such that portions of the top surface of the gate dielectric layer 105 are exposed.

As used herein, consistent with the accepted definition within solid state material art, a "2-D material" may refer to a crystalline material consisting of a single layer of atoms. As widely accepted in the art, "2-D material" may also be referred to as a "monolayer" material. In this disclosure, "2-D material" and "monolayer" material are used interchangeably without differentiation in meanings, unless specifically pointed out otherwise. The 2-D material layer 110 may be 2-D materials of suitable thickness. In some embodiments, a 2-D material includes a single layer of atoms in each of its monolayer structure, so the thickness of the 2-D material refers to a number of monolayers of the 2-D material, which can be one monolayer or more than one monolayer. The coupling between two adjacent monolayers of 2-D material includes van der Waals forces, which are weaker than the chemical bonds between/among atoms within the single monolayer.

In some embodiments, the 2-D material layer 110 may be 2-D semiconductor materials, which may be single-layer, or may be few-layer thick and exist as stacks of strongly bonded layers with weak interlayer van der Waals attraction, allowing the layers to be mechanically or chemically exfoliated into individual, atomically thin layers. The 2-D semiconductor materials are promising candidates of the channel, source, drain materials of transistors. Examples of 2D semiconductor materials include transition metal dichalcogenides (TMDs), graphene, layered III-VI chalcogenide, graphene, hexagonal Boron Nitride (h-BN), black phosphorus or the like. The 2-D semiconductor may include one or more layers and can have a thickness within the range of about 0.5-100 nm in some embodiments. One advantageous feature of the few-layered 2D semiconductor is the high electron mobility value.

FIG. 1B illustrates a crystal structure of a monolayer ML of an example TMD in accordance with some example embodiments. In FIG. 1B, the one-molecule thick TMD material layer includes transition metal atoms MA and chalcogen atoms CA. The transition metal atoms MA may form a layer in a middle region of the one-molecule thick TMD material layer, and the chalcogen atoms CA may form a top layer over the middle layer of transition metal atoms MA, and a bottom layer underlying the middle layer of transition metal atoms MA. The transition metal atoms MA may be W atoms, Mo atoms, or Pt atoms, while the chalcogen atoms CA may be S atoms, Se atoms, or Te atoms. In some embodiments of FIG. 1B, each of the transition metal atoms MA is bonded (e.g. by polar-covalent bonds) to six chalcogen atoms CA, and each of the chalcogen atoms CA is bonded (e.g. by polar-covalent bonds) to three transition metal atoms MA. Throughout the description, the illustrated cross-bonded layers including one layer of transition metal atoms MA and two layers of chalcogen atoms CA in combination are referred to as a TMD monolayer ML. In some embodiments, the TMD monolayer ML may be $WS_2$, $WSe_2$, $WTe_2$, $MoS_2$, $MoSe_2$, $MoTe_2$, $PtS_2$, $PtSe_2$, $PtTe_2$, or the like.

Referring back to FIG. 1A, a passivation layer 120 is deposited over the 2-D material layer 110. In some embodiments, the passivation layer 120 may be insulating dielectric material. The passivation layer 120 may include silicon oxide ($SiO_2$), silicon nitride ($Si_3N_4$), silicon oxynitride (SiON), phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the passivation layer 120 may be deposited using any suitable method, such as CVD, physical vapor deposition (PVD), ALD, PEALD, PECVD, SACVD, FCVD, spin-on coating, and/or the like, or a combination thereof.

Figure 2:
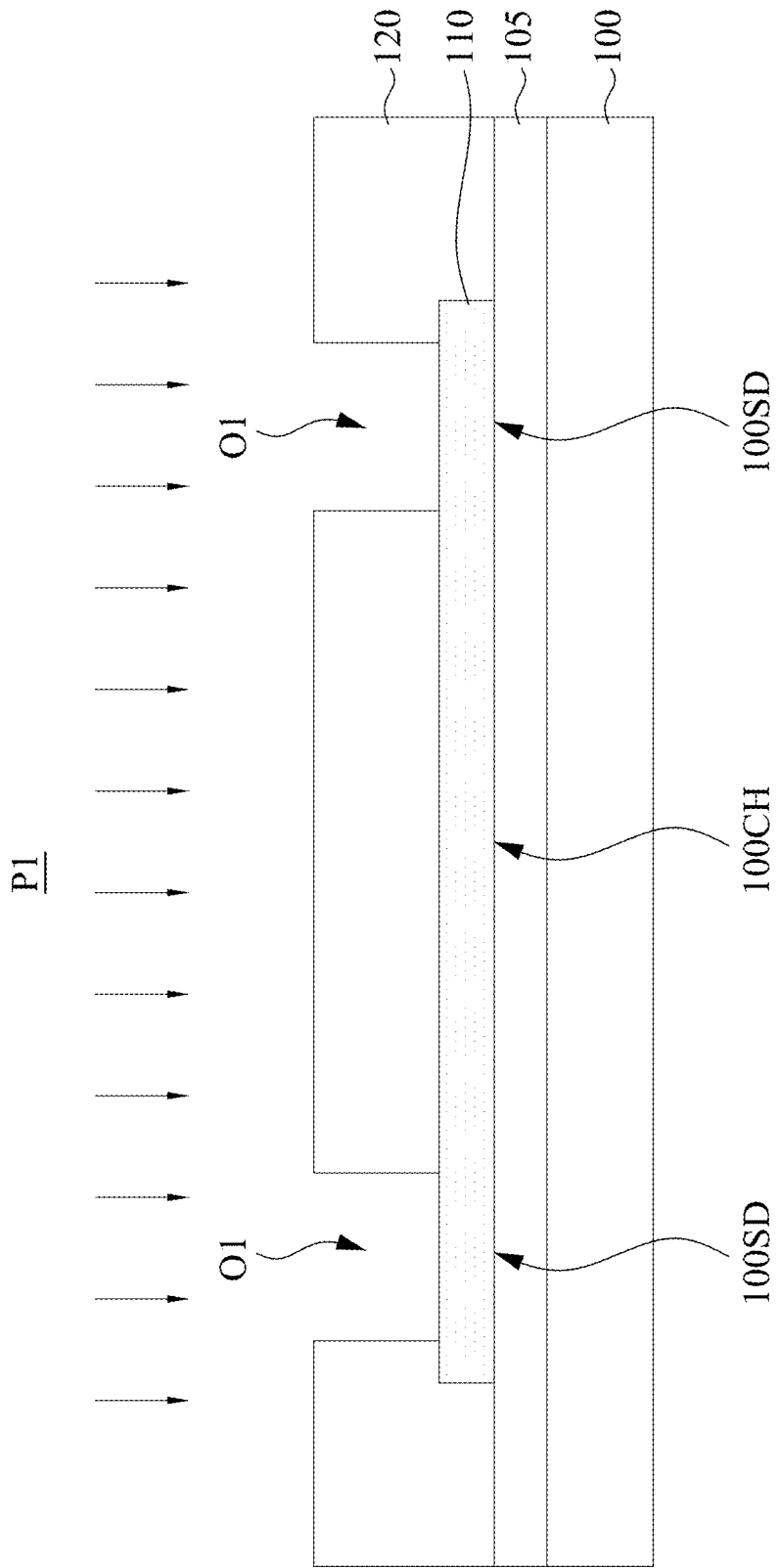

Reference is made to FIG. 2, in which FIG. 2 illustrates a cross-sectional view of an intermediate stage for fabricating a semiconductor device. A patterning process P1 is performed to the passivation layer 120, so as to form openings O1 in the passivation layer 120. In greater details, the openings O1 extend through the passivation layer 120 and expose the 2-D material layer 110. In some embodiments, the patterning process P1 may be performed by suitable photolithography process. For example, a mask layer (e.g. a photoresist) is deposited over the passivation layer 120, the mask layer is patterned to form openings that expose unwanted portions of the passivation layer 120, an etching process is performed to remove the unwanted portions of the passivation layer 120 through the openings of the mask layer, and then the mask layer is removed.

After the patterning process P1 is completed, source/drain regions 110SD may be formed in the 2-D material layer 110 through the openings O1 of the passivation layer 120. In some embodiments, the source/drain regions 110SD may be doped regions in the 2-D material layer 110. The doped regions may be formed, for example, by implanting n-type or p-type dopants (e.g., As, P, B, In, or the like) into source/drain regions 110SD of the 2-D material layer 110 by using an ion implantation process, except for the portions of the 2-D material layer 110 that are covered by the passivation layer 120; or by first depositing a dopant source layer over source/drain regions of the 2-D material layer 110 and then diffusing dopants from the dopant source layer into the 2-D material layer 110 by annealing. In some embodiments, the portion of the 2-D material layer 110 between the source/drain regions 110SD will act as a channel region of a transistor, and can be referred to as a channel region 110CH.

Figure 3A:
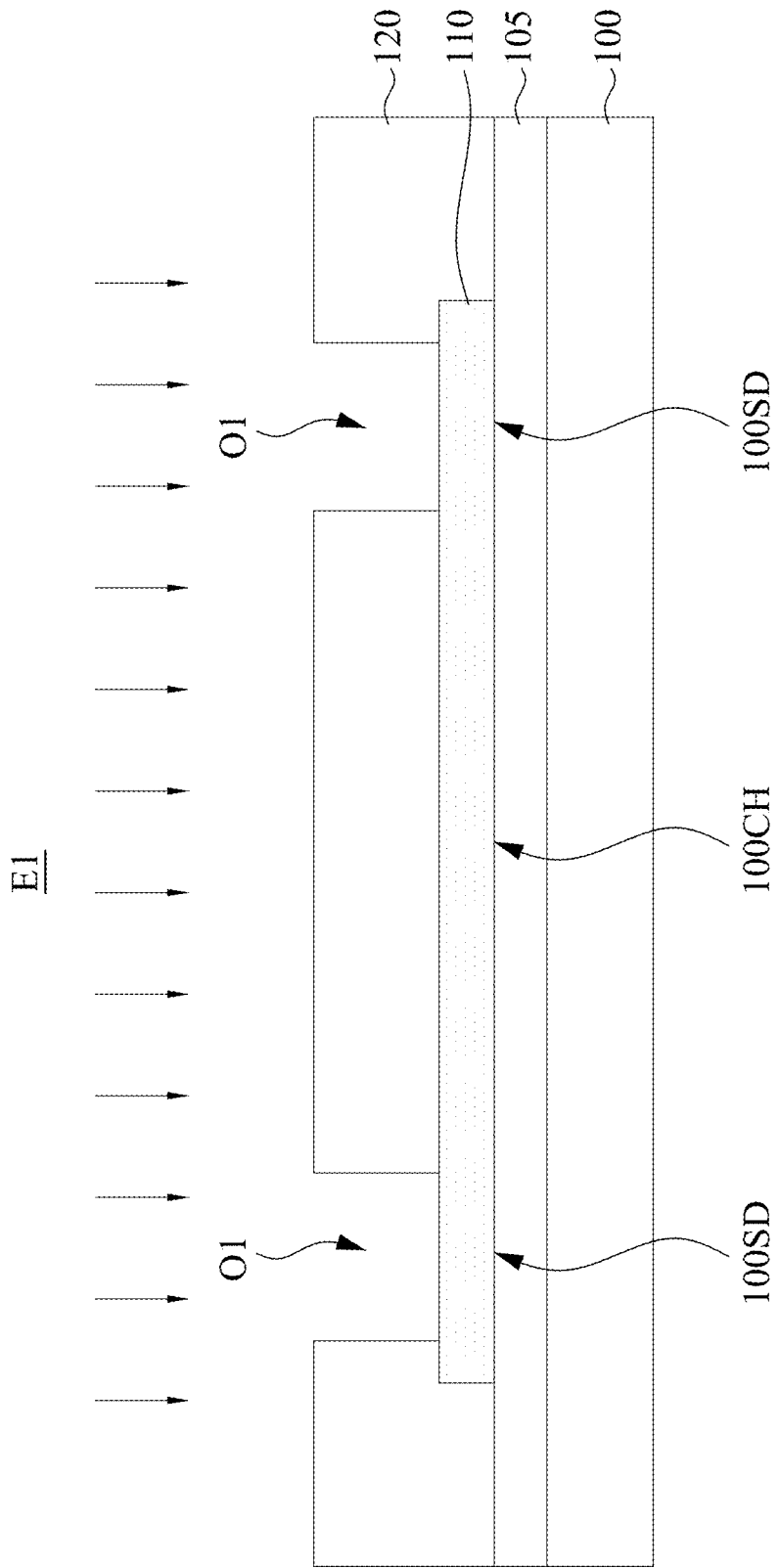
Figure 3B:
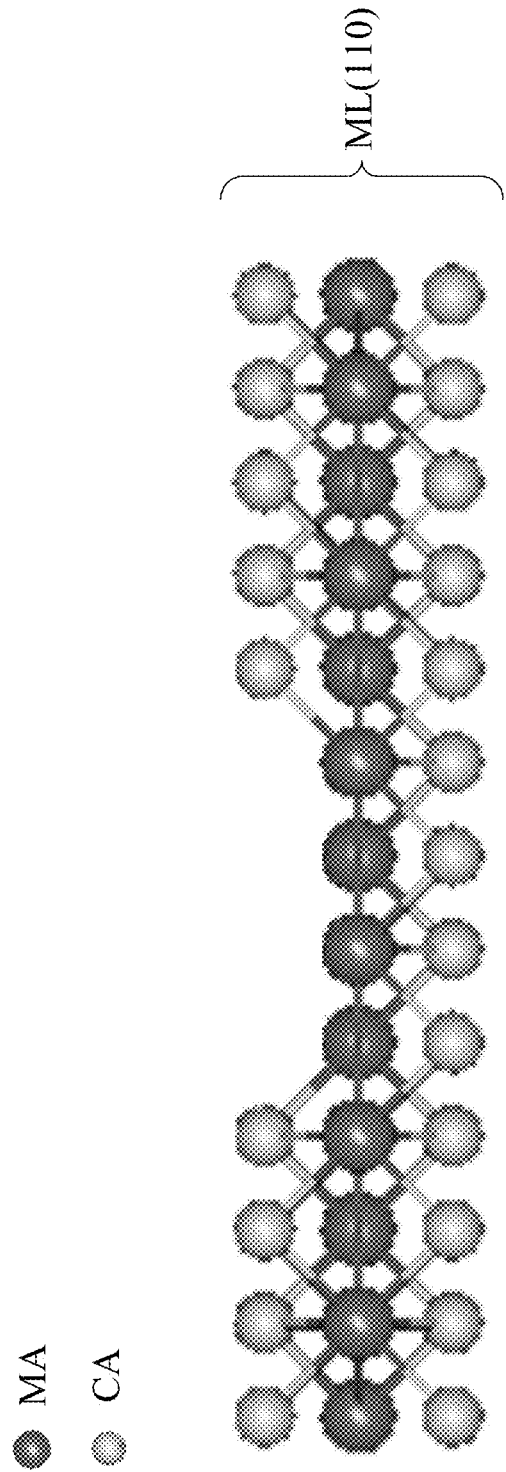

Reference is made to FIGS. 3A and 3B, in which FIG. 3A illustrates a cross-sectional view of an intermediate stage for fabricating a semiconductor device, and FIG. 3B illustrates a crystal structure of a monolayer of a 2-D material layer in accordance with some example embodiments. An etching process E1 is performed to the 2-D material layer 110 through the openings O1 of the passivation layer 120. In some embodiments, the etching process E1 is performed to the source/drain regions 110SD of the 2-D material layer 110. In some embodiments, the etching process E1 may be performed using an accelerated ($H_2$) plasma under the combination of its energetic power, flow rate, pressure and temperature that lead to an incident kinetic energy of each plasma ion ranging from 5~6 eV (just above the dissociation energy per bond within a TMD).

As shown in FIG. 3B, when the 2-D material layer 110 is made of TMD, the etching process E1 is performed to remove the chalcogen atoms CA of the TMD layer 110 exposed by the passivation layer 120. As mentioned above, the TMD layer 110 may include a layer of transition metal atoms MA in the middle region, a top layer of chalcogen atoms CA over the middle layer of transition metal atoms MA, and a bottom layer of chalcogen atoms CA underlying the middle layer of transition metal atoms MA. The etching process E1 may remove only the chalcogen atoms CA in the top layer through the openings O1 of the passivation layer 120, while leaving the transition metal atoms MA in the middle layer and the chalcogen atoms CA in the bottom layer substantially intact. In some embodiments, the bonds (e.g., polar-covalent bonds) between the chalcogen atoms CA of the top layer and the transition metal atoms MA may be broken throughout thermal cracking caused by the etching process E1). Accordingly, after the etching process E1 is completed, the transition metal atoms MA of the TMD layer 110 may be exposed through the openings O1 of the passivation layer 120.

In some embodiments, the etching process E1 is a gas phase etching process without breaking the basal plane of the middle layer of transition metal atoms MA. As shown in FIG. 3B, the middle layer of transition metal atoms MA is substantially intact after the etching process E1 is completed. That is, the etching process E1 only removes the chalcogen atoms CA at the top layer of TMD layer 110, but does not remove the transition metal atoms MA of the TMD layer 110. Furthermore, only portions of the chalcogen atoms CA of the top layer that are exposed by the openings O1 of the passivation layer 120 are removed, while other portions of the chalcogen atoms CA of the top layer that are covered by the passivation layer 120 remain bonded with the transition metal atoms MA after the etching process E1 is completed. Also, as the bottom layer of the TMD layer 110 is covered by the middle layer of transition metal atoms MA, the chalcogen atoms CA of the bottom layer of the TMD layer 110 are not removed by the etching process E1. Stated another way, the etching process E1 only removes the exposed portions of the chalcogen atoms CA of the top layer, while the etching process E1 does not etch through the TMD layer 110.

Figure 4A:
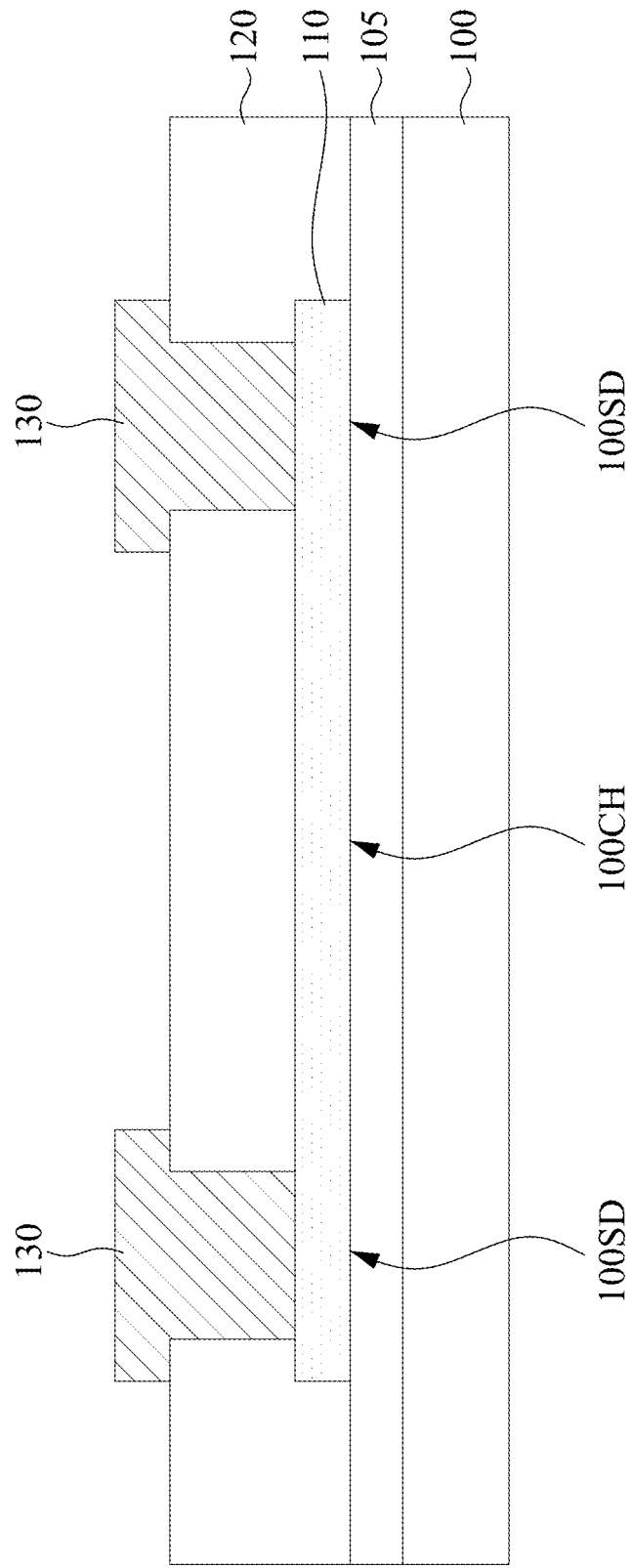
Figure 4B:
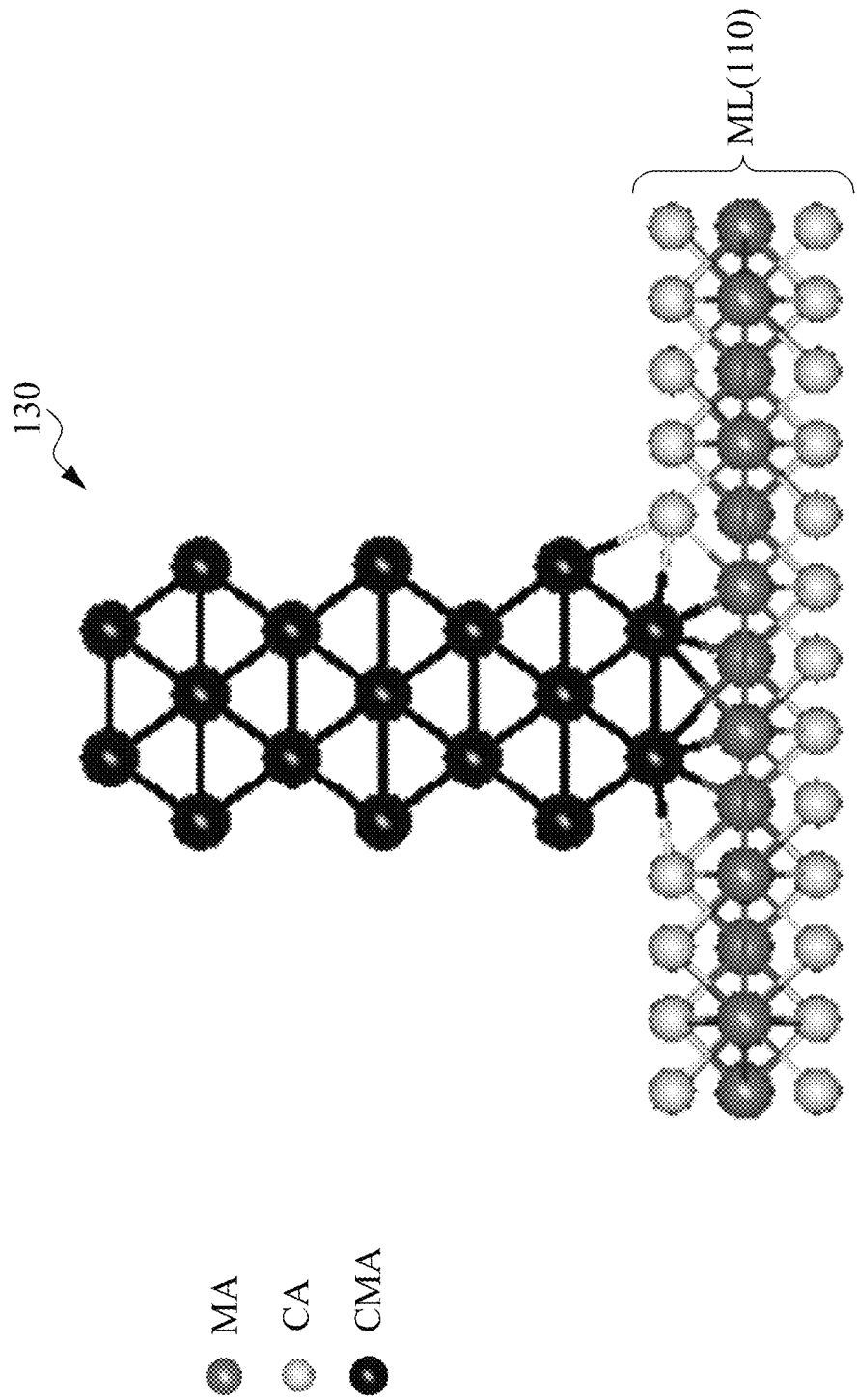

Reference is made to FIGS. 4A and 4B, in which FIG. 4A illustrates a cross-sectional view of an intermediate stage for fabricating a semiconductor device, and FIG. 4B illustrates a crystal structure of a monolayer of a 2-D material layer and a metal contact in accordance with some example embodiments. After the etching process E1 is completed, source/drain contacts 130 are formed in the openings O1 (see FIGS. 3A and 3B) of the passivation layer 120 and in contact with the source/drain regions 110SD of the 2-D material layer 110. In some embodiments, the source/drain contacts 130 may be formed by, for example, depositing a metal layer overfilling the openings O1 of the passivation layer 120, and then performing a patterning process to pattern the metal layer. In some embodiments, the source/drain contacts 130 may include Pt, Au, Ag, Cu, Ni, Al, W, or other suitable contact metals. The source/drain contacts 130 may be deposited by any suitable method, e.g., CVD, PECVD, PVD, ALD, PEALD, electroless plating and/or the like.

In some embodiments where the 2-D material layer 110 is made of TMD, as mentioned above, the TMD layer 110 undergoes an etching process E1 as described in FIGS. 3A and 3B, and the chalcogen atoms CA of the 2-D material layer 110 that are exposed by the openings O1 of the passivation layer 120 are removed to reveal the transition metal atoms MA of the 2-D material layer 110. As a result, the contact metal atoms CMA of the source/drain contacts 130 may form metallic bonds with the transition metal atoms MA of the 2-D material layer 110. In some other embodiments, the contact metal atoms CMA of the source/drain contacts 130 may also form chemical bonds with adjacent chalcogen atoms CA of the 2-D material layer 110. In some embodiments, the transition metal atoms MA of the 2-D material layer 110 and the contact metal atoms CMA of the source/drain contacts 130 are free of chalcogen atoms CA of the 2-D material layer 110 interposed therebetween. In some embodiments, the crystal structure of FIG. 4B may be obtained by suitable techniques, such as high resolution transmission electron microscop (HRTEM), scanning tunneling microscope (STM), or the like.

In some embodiments, because the transition metal atoms MA of the 2-D material layer 110 at the source/drain regions 110SD of the 2-D material layer 110 are bonded with the contact metal atoms CMA of the source/drain contacts 130, while the transition metal atoms MA of the 2-D material layer 110 at the channel region 110CH of the 2-D material layer 110 are still bonded with the chalcogen atoms CA of the 2-D material layer 110. Accordingly, the binding energy of the transition metal atoms MA of the 2-D material layer 110 at the source/drain regions 110SD of the 2-D material layer 110 may be different from the binding energy of the transition metal atoms MA of the 2-D material layer 110 at the channel region 110CH of the 2-D material layer 110. For example, the binding energy of the transition metal atoms MA of the 2-D material layer 110 at the source/drain regions 110SD of the 2-D material layer 110 is less than half of the binding energy of the transition metal atoms MA of the 2-D material layer 110 at the channel region 110CH of the 2-D material layer 110. In some embodiments, the binding energy of the transition metal atoms MA of the 2-D material layer 110 may be measured by X-ray Photoelectron Spectroscopy (XPS).

Because the contact metal atoms CMA of the source/drain contacts 130 can directly form metallic bonds with the transition metal atoms MA of the 2-D material layer 110, the contact resistance between the source/drain contacts 130 and the corresponding source/drain regions 110SD of the 2-D material layer 110 may be reduced. Accordingly, the device performance may be improved. However, if the chalcogen atoms CA of the 2-D material layer 110 are not removed as described in FIGS. 3A and 3B, the source/drain contacts 130 can only be connected to the 2-D material layer 110 throughout van der Waals force instead of forming metallic bonds with the 2-D material layer 110. In such situation, the device performance may be unsatisfied.

Figure 5:
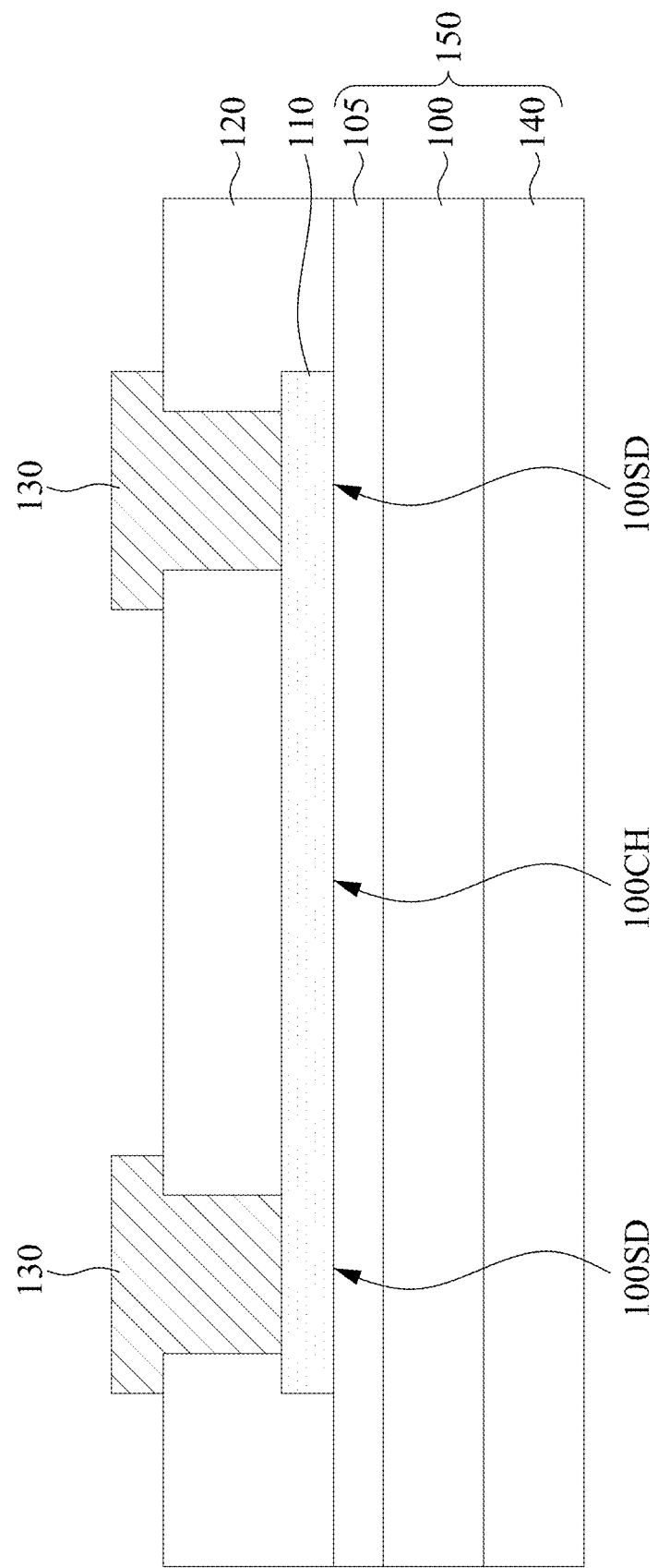

Reference is made to FIG. 5, in which FIG. 5 illustrates a cross-sectional view of an intermediate stage for fabricating a semiconductor device. A gate electrode 140 is formed on a back side of the substrate 100. In greater details, the gate electrode 140 is disposed on one side of the substrate 100 that is opposite to the gate dielectric layer 105, the 2-D material layers 110, the passivation layer 120, and the source/drain contacts 130. In some embodiments, the gate electrode 140 may be formed by, for example, flipping over the structure of FIG. 4A such that the backside of the substrate 100 faces upwards, and then depositing a metal layer over the backside of the substrate 100. The gate electrode 140 may be deposited by any suitable method, e.g., CVD, PECVD, PVD, ALD, PEALD, electroless plating and/or the like. In some embodiments, the gate electrode 140 may include metals such as Cu, Al, W, Co, Ru, or the like, or combinations thereof, or multi-layers thereof. In some embodiments, a chemical mechanism polishing (CMP) process is optionally performed to the back side of the substrate 100 to reduce the thickness of the substrate 100.

In some embodiments, the gate electrode 140, the substrate 100, the gate dielectric layer 105, the 2-D material layer 110, and the source/drain contacts 130 collectively form a transistor. In some embodiments, the gate electrode 140, the substrate 100, and the gate dielectric layer 105 collectively serve as a gate structure 150 of the transistor. The 2-D material layer 110 serves as a channel layer of the transistor. In some embodiments, because the gate structure 150 is disposed below the channel layer (2-D material layer 110) of the transistor, the transistor can also be referred to as a "bottom-gate" transistor.

Figure 6:
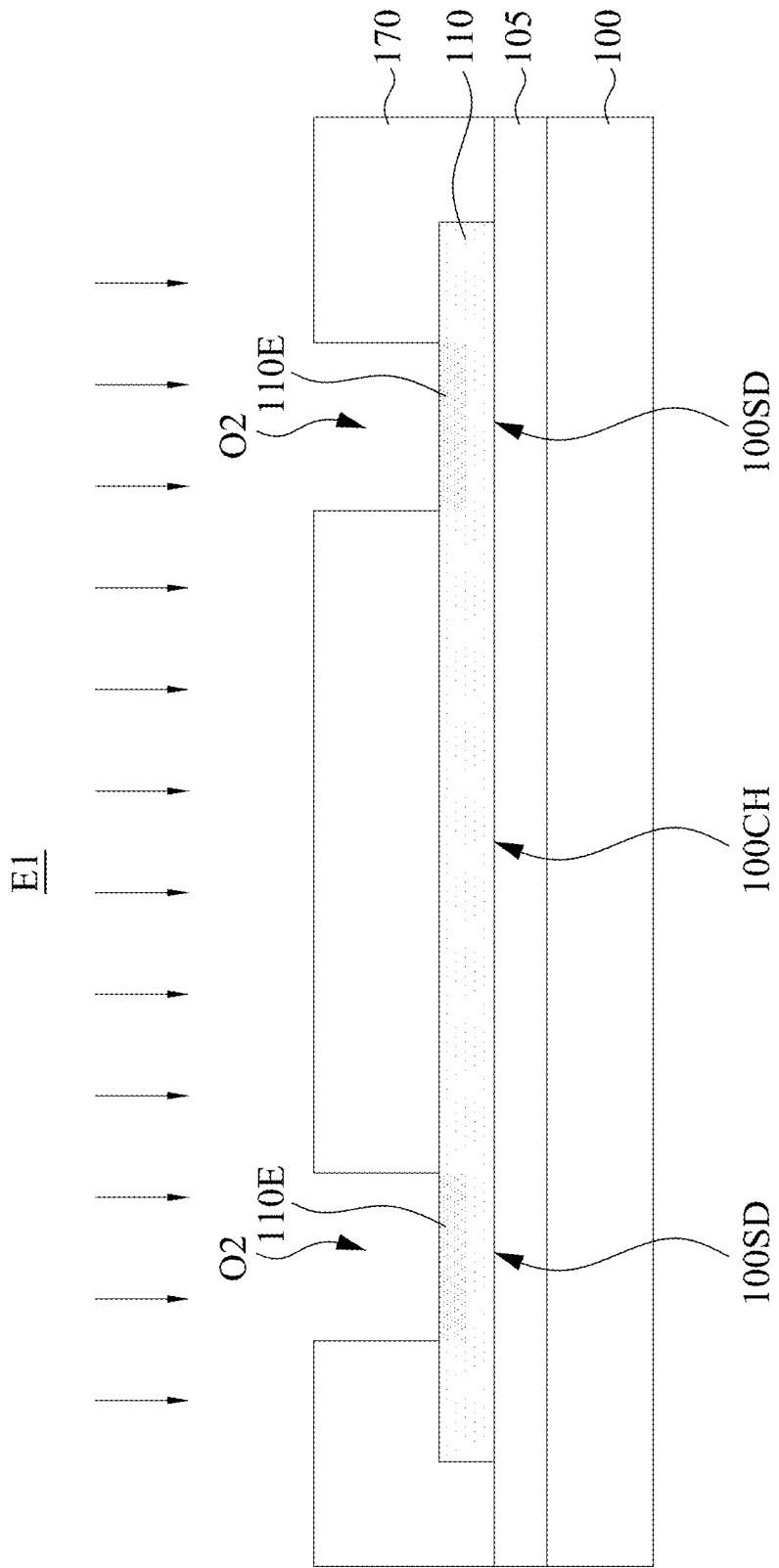
FIGS. 6 to 8 illustrate a method in various stages of fabricating a semiconductor device in accordance with some embodiments of the present disclosure.
Figure 7A:
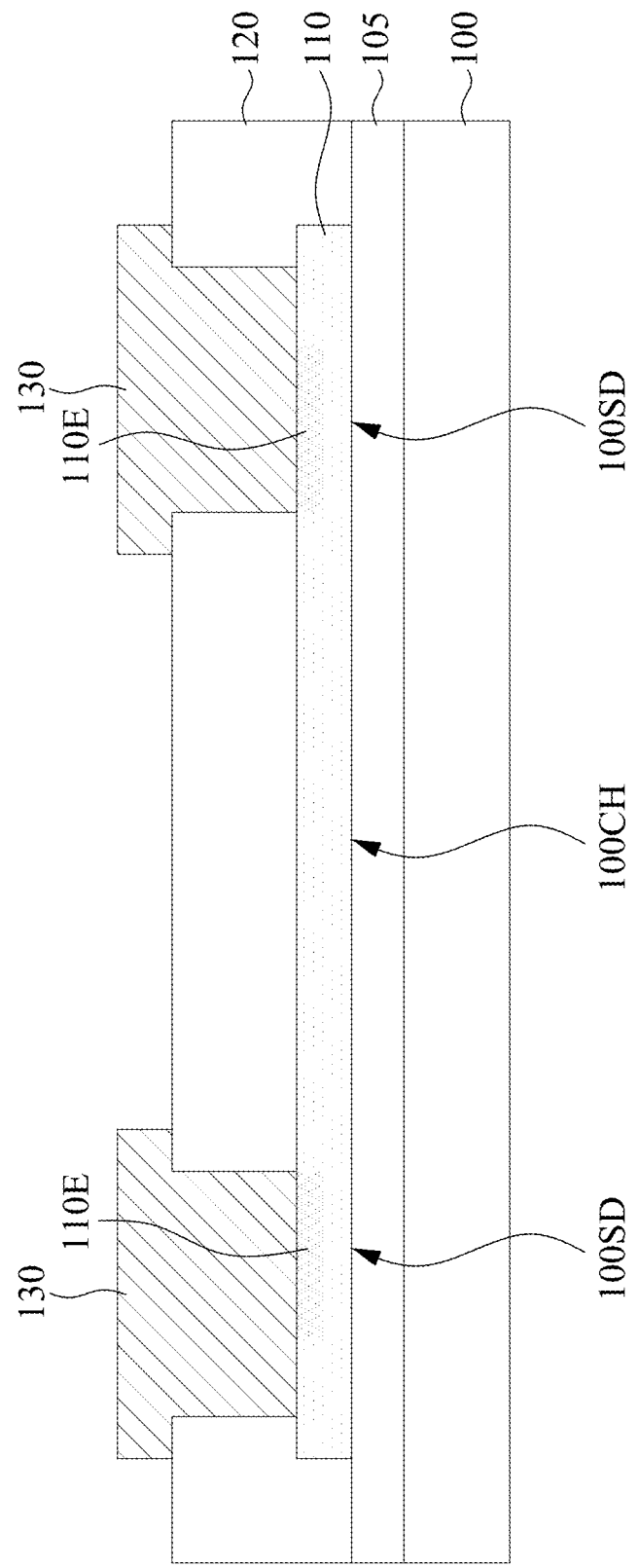
Figure 7B:
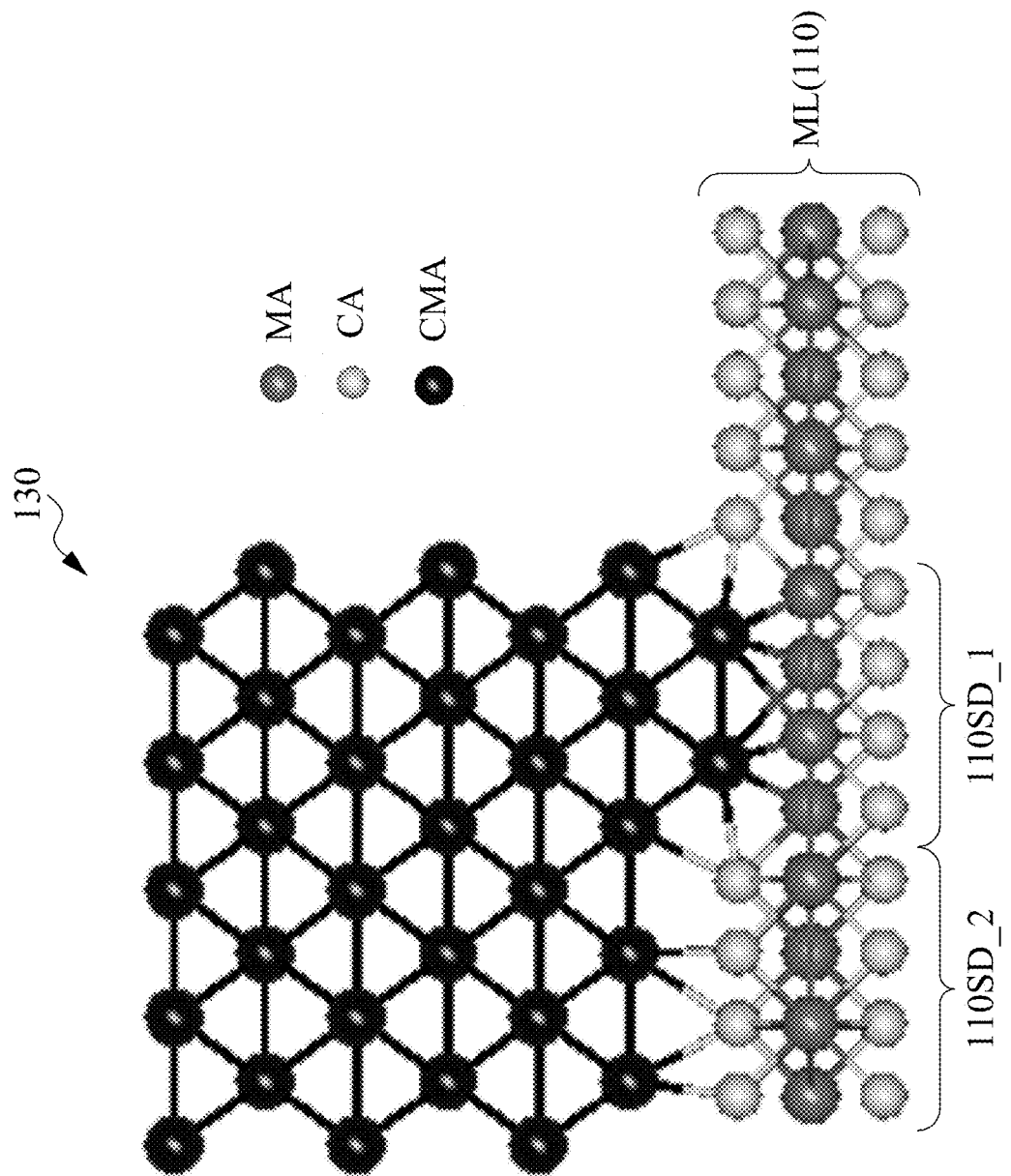
Figure 8:
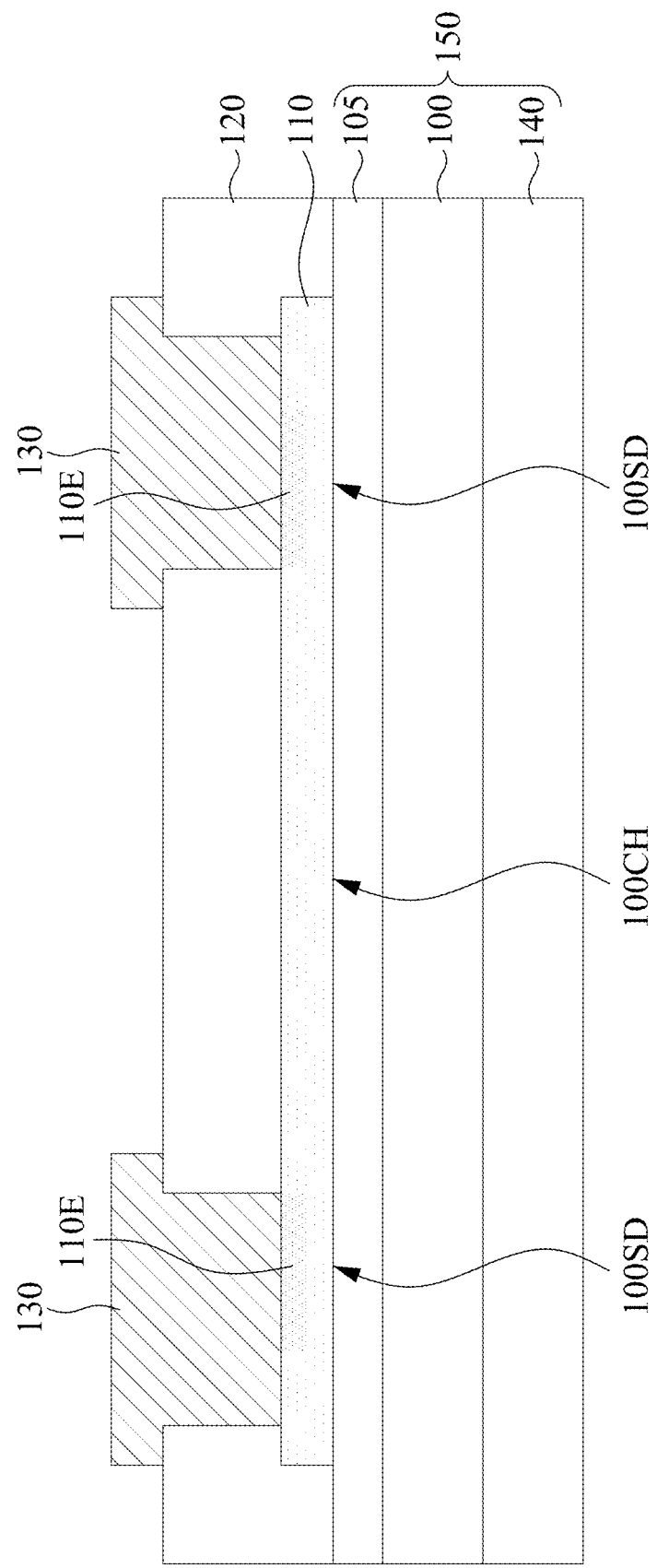

FIGS. 6 to 8 illustrate a method in various stages of fabricating a semiconductor device in accordance with some embodiments of the present disclosure. It is noted that some elements described in FIGS. 6 to 8 may be similar to those described with respect to FIGS. 1A to 5, such elements are labeled the same, and relevant details will not be repeated for simplicity.

Reference is made to FIG. 6. FIG. 6 is different from FIG. 1A, in that prior to forming the passivation layer 120, a patterned mask 170 is formed covering the 2-D material layer 110. The patterned mask 170 includes openings O2 that expose portions of the 2-D material layer 110. Then, an etching process E2 is performed to the 2-D material layer 110. In some embodiments where the 2-D material layer 110 is made of TMD, portions of the chalcogen atoms of the top layer that are exposed by the openings O2 of the patterned mask 170 are removed through the etching process E2. The etching process E2 is similar to the etching process E1 discussed in FIGS. 3A and 3B, and thus relevant details will not be repeated for simplicity. After the etching process E2 is completed, the 2-D material layer 110 includes etched portions 110E. Here, the "etched portion" of the 2-D material layer 110 may be referred to as the portion of the 2-D material layer 110 where the chalcogen atoms of the 2-D material layer 110 are removed.

Reference is made to FIGS. 7A and 7B, in which FIG. 7A illustrates a cross-sectional view of an intermediate stage for fabricating a semiconductor device, and FIG. 7B illustrates a crystal structure of a monolayer of a 2-D material layer and a metal contact in accordance with some example embodiments. After the etching process E2 of FIG. 6 is completed, the patterned mask 170 is removed. Then, a passivation layer 120 is formed covering the 2-D material layer 110, and source/drain contacts 130 are formed in the passivation layer 120. In some embodiments, each of the source/drain contacts 130 is wider than the underlying etched portion 110E of the 2-D material layer 110. That is, the source/drain contacts 130 may be in contact with portions of the 2-D material layer 110 that are not etched by the etching process E2 described in FIG. 6. In some embodiments, the source/drain contacts 130 may be formed in the passivation layer 120 by, for example, patterning the passivation layer 120 to form openings that are wider than the opening O2 of the patterned mask 170 of FIG. 6, depositing a metal layer in the openings, and then patterning the metal layer.

As shown in FIG. 7B, some of the contact metal atoms CMA of the source/drain contact 130 may form metallic bonds with the transition metal atoms MA of the 2-D material layer 110, which are exposed due to the etching process E2 of FIG. 6. On the other hand, because the source/drain contact 130 is wider than the etched portion 110E of the 2-D material layer 110, some of the contact metal atoms CMA of the source/drain contact 130 may vertically overlaps the chalcogen atoms CA. That is, a portion of the contact metal atoms CMA of the source/drain contact 130 may be vertically separated from the transition metal atoms MA of the 2-D material layer 110 by the chalcogen atoms CA of the 2-D material layer 110. This is because the chalcogen atoms CA at these portions are not removed during the etching process E2 described in FIG. 6.

In some embodiments, because a portion of the transition metal atoms MA of the 2-D material layer 110 at the source/drain regions 110SD of the 2-D material layer 110 are bonded with the contact metal atoms CMA of the source/drain contacts 130, while another portion of the transition metal atoms MA of the 2-D material layer 110 at the source/drain regions 110SD of the 2-D material layer 110 are still bonded with the chalcogen atoms CA of the 2-D material layer 110. Accordingly, as shown in FIG. 7B, the binding energy of the transition metal atoms MA of the 2-D material layer 110 at the first portion 110SD_1 of the source/drain regions 110SD may be different from the binding energy of the transition metal atoms MA of the 2-D material layer 110 at second portion 110SD_2 of the source/drain regions 110SD. In some embodiments, the binding energy of the transition metal atoms MA of the 2-D material layer 110 may be measured by X-ray Photoelectron Spectroscopy (XPS).

Reference is made to FIG. 8. A gate electrode 140 is formed on a backside of the substrate 100. The gate electrode 140, the substrate 100, the gate dielectric layer 105, the 2-D material layer 110, and the source/drain contacts 130 collectively form a transistor. In some embodiments, the gate electrode 140, the substrate 100, and the gate dielectric layer 105 collectively serve as a gate structure 150 of the transistor. The 2-D material layer 110 serves as a channel layer of the transistor. In some embodiments, because the gate structure 150 is disposed below the channel layer (2-D material layer 110) of the transistor, the transistor can also be referred to as a "bottom-gate" transistor.

FIGS. 9 to 12 illustrate a method in various stages of fabricating a semiconductor device in accordance with some embodiments of the present disclosure. It is noted that some elements described in FIGS. 9 to 12 may be similar to those described with respect to FIGS. 1A to 5, such elements are labeled the same, and relevant details will not be repeated for simplicity.

Figure 9:
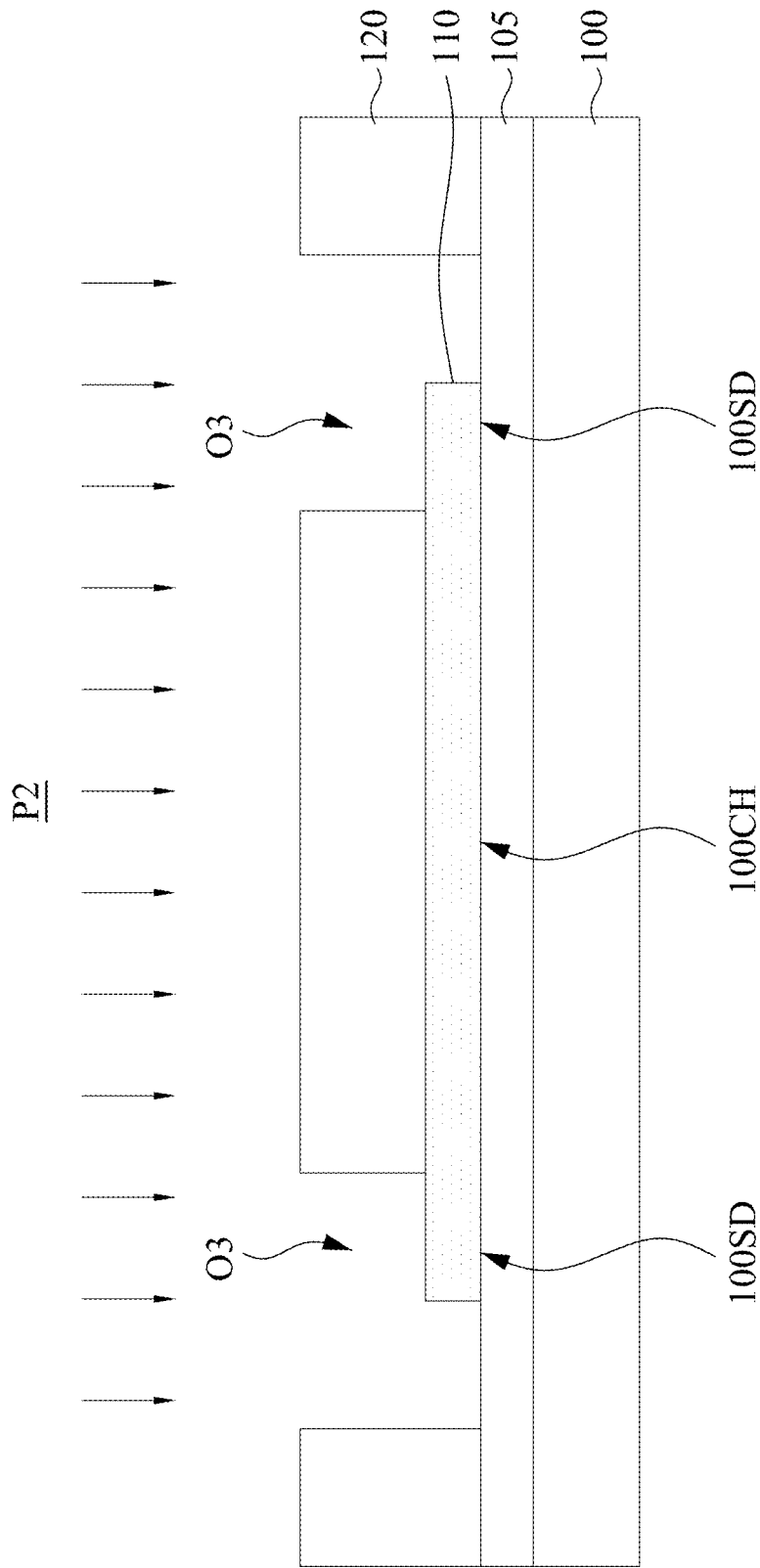
FIGS. 9 to 12 illustrate a method in various stages of fabricating a semiconductor device in accordance with some embodiments of the present disclosure.

Reference is made to FIG. 9. FIG. 9 is similar to FIG. 2, in which a patterning process P2 is performed to the passivation layer 120 to form openings O3 in the passivation layer 120. The difference between the patterning process P2 of FIG. 9 and the patterning process P1 of FIG. 2 is that, the patterning process P2 of FIG. 9 is performed such that each of the openings O3 exposes a respective edge of the 2-D material layer. Furthermore, the openings O3 may expose portions of the gate dielectric layer 105 that are uncovered by the 2-D material layer 110. In some embodiments, source/drain regions 110SD may be formed in the 2-D material layer 110 through the openings O3 of the passivation layer 120. In some embodiments, the source/drain regions 110SD are doped regions in the 2-D material layer 110.

Figure 10A:
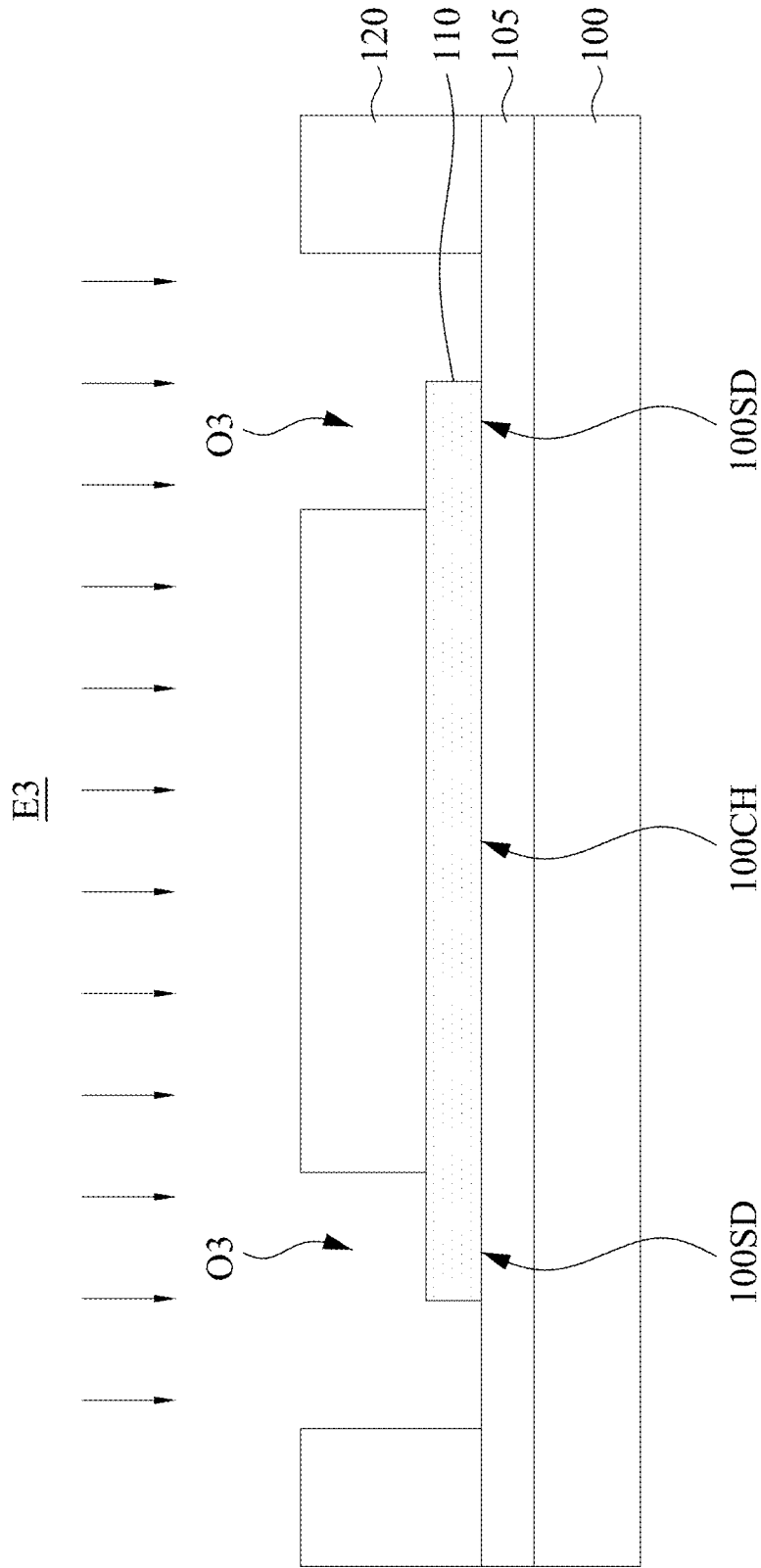
Figure 10B:
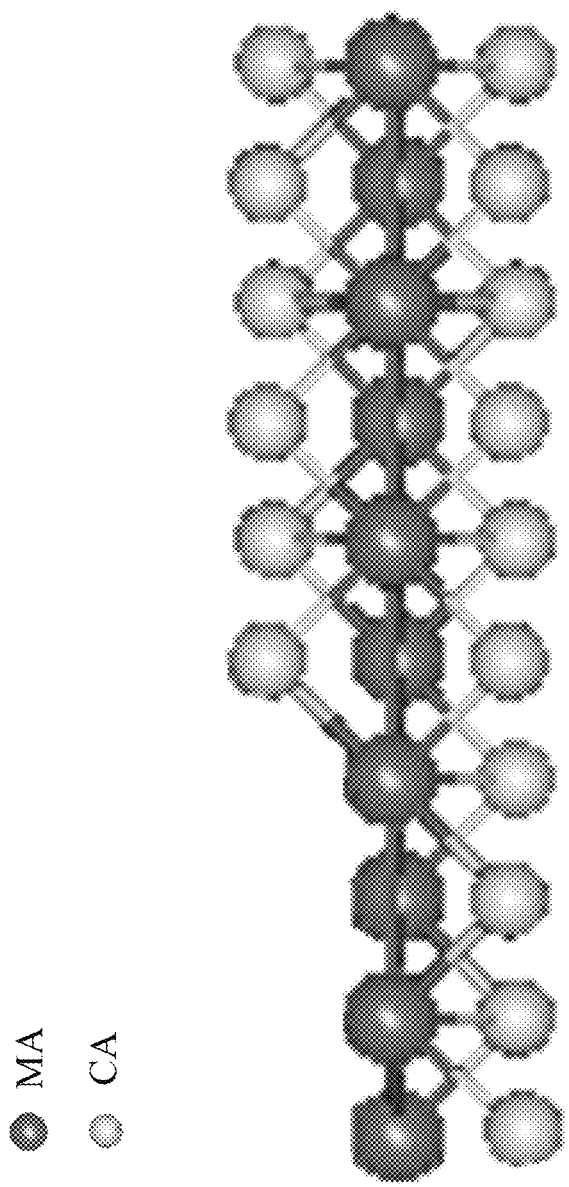

Reference is made to FIGS. 10A and 10B, in which FIG. 3A illustrates a cross-sectional view of an intermediate stage for fabricating a semiconductor device, and FIG. 3B illustrates a crystal structure of a monolayer of a 2-D material layer in accordance with some example embodiments. An etching process E3 is performed to the 2-D material layer 110. In some embodiments where the 2-D material layer 110 is made of TMD, portions of the chalcogen atoms CA of the top layer that are exposed by the openings O3 of the passivation layer 120 are removed through the etching process E3 as shown in FIG. 10B. The etching process E3 is similar to the etching process E1 discussed in FIGS. 3A and 3B, and thus relevant details will not be repeated for simplicity.

Figure 11A:
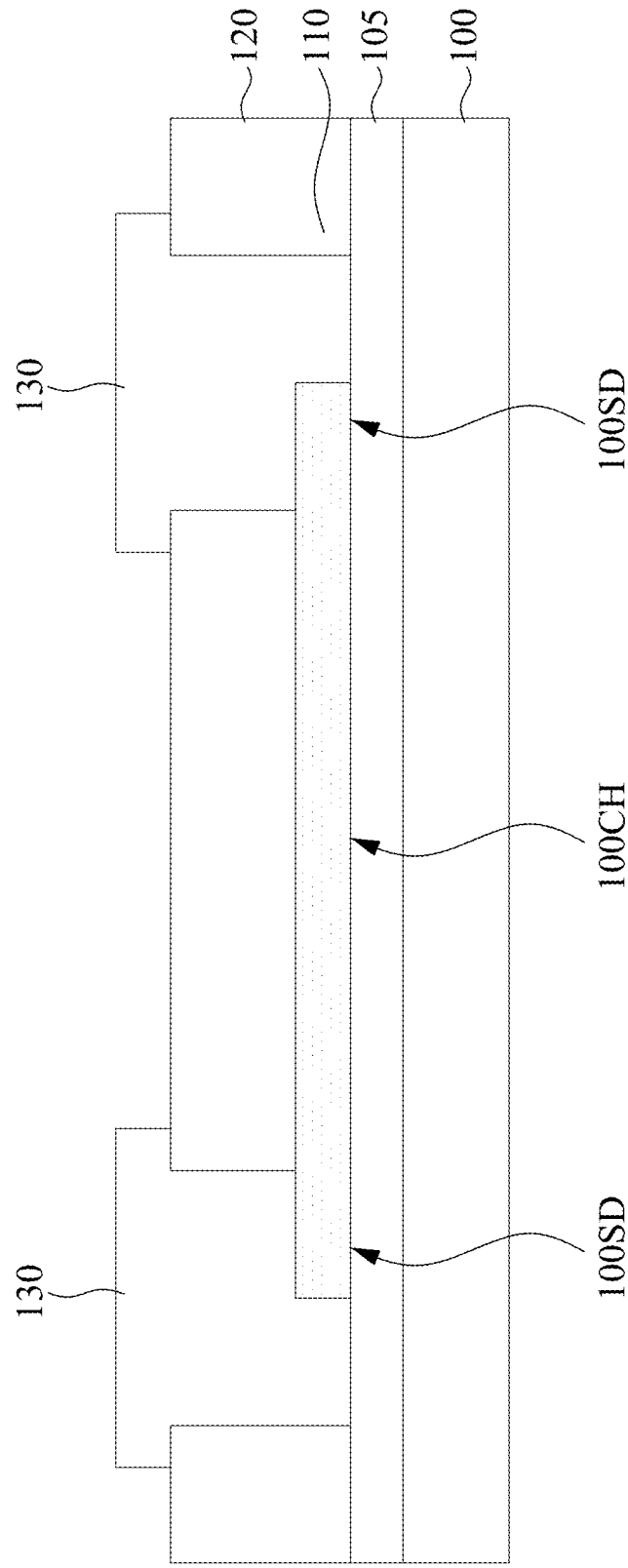
Figure 11B:
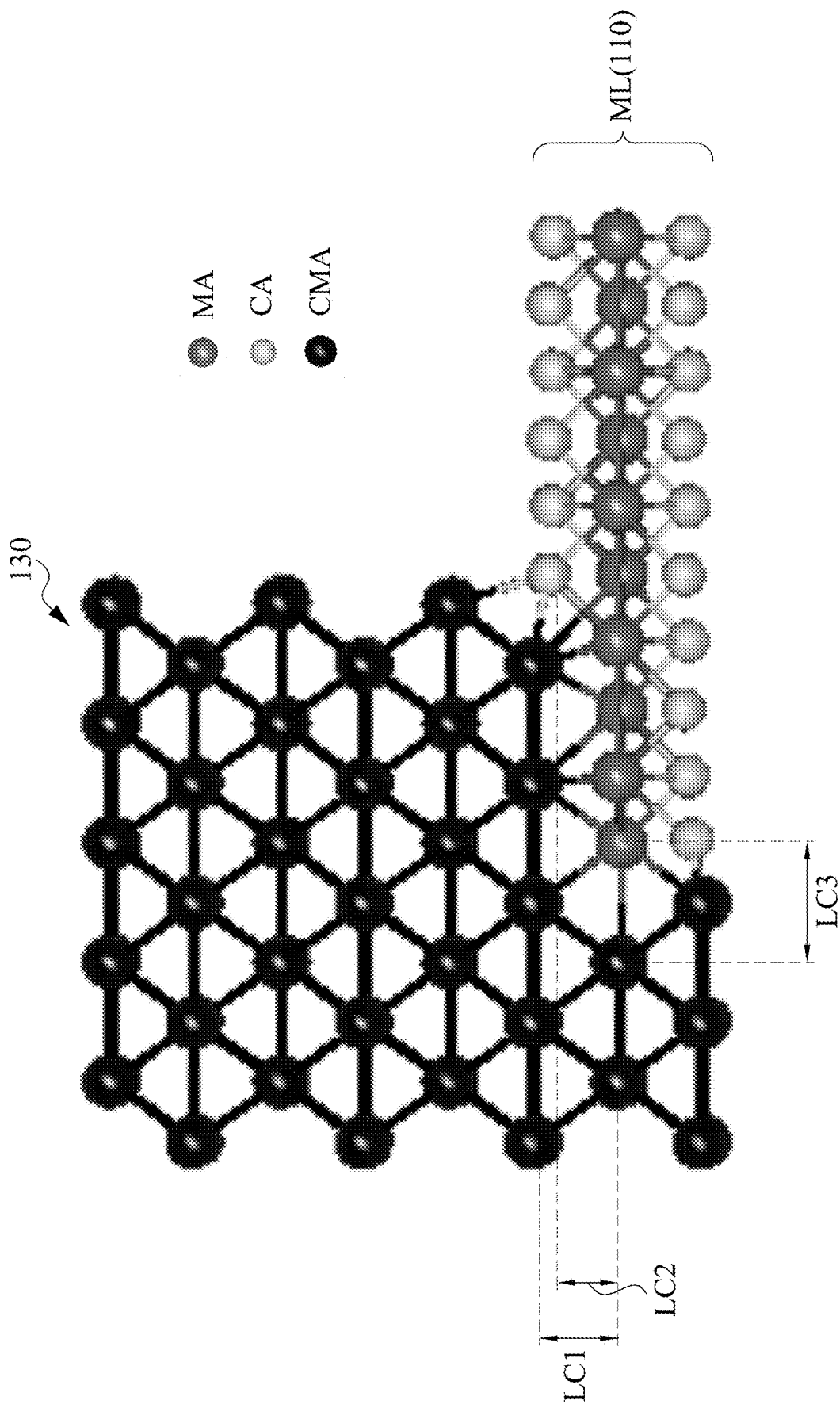

Reference is made to FIGS. 11A and 11B, in which FIG. 11A illustrates a cross-sectional view of an intermediate stage for fabricating a semiconductor device, and FIG. 11B illustrates a crystal structure of a monolayer of a 2-D material layer and a metal contact in accordance with some example embodiments. After the etching process E3 is completed, source/drain contacts 130 are formed in the openings O3 (see FIGS. 10A and 10B) of the passivation layer 120 and in contact with the source/drain regions 110SD of the 2-D material layer 110 and the gate dielectric layer 105.

As shown in FIG. 11B, in some embodiments where the 2-D material layer 110 is made of TMD, some of the contact metal atoms CMA of the source/drain contact 130 form metallic bonds with the transition metal atoms MA of the 2-D material layer 110, which are exposed due to the etching process E3 of FIGS. 10A and 10B. On the other hand, some of the contact metal atoms CMA of the source/drain contact 130 may form chemical bonds with adjacent chalcogen atoms CA at the top layer of the monolayer ML. Furthermore, some of the contact metal atoms CMA of the source/drain contact 130 may also form chemical bonds with chalcogen atoms CA at the bottom layer of the monolayer ML. This is because the openings O3 extend to a position that is level to a bottom surface of the 2-D material layer 110, which in turn will expose portions of the chalcogen atoms CA at the bottom layer of the monolayer ML at the edges of the 2-D material layer 110.

In some embodiments, because contact metal atoms CMA are connected to the transition metal atoms MA of the 2-D material layer 110, the vertical distance (e.g., along Y direction) between the contact metal atoms CMA and the transition metal atoms MA may be substantially equal to the lattice constant LC1 of the contact metal atoms CMA along the vertical direction (e.g., Y direction), which is greater than the lattice constant LC2 of the 2-D material layer 110 along the vertical direction (e.g., Y direction). If the chalcogen atoms CA are not removed from the 2-D material layer 110, the contact metal atoms CMA may overlie the chalcogen atoms CA, and the vertical distance (e.g., along Y direction) between the contact metal atoms CMA and the transition metal atoms MA may be greater than the lattice constant of the contact metal atoms CMA along the vertical direction (e.g., Y direction). Furthermore, the lateral distance (e.g., along X direction) between the contact metal atoms CMA and the transition metal atoms MA may be substantially equal to the lattice constant LC3 of the contact metal atoms CMA along the lateral direction (e.g., X direction).

Figure 12:
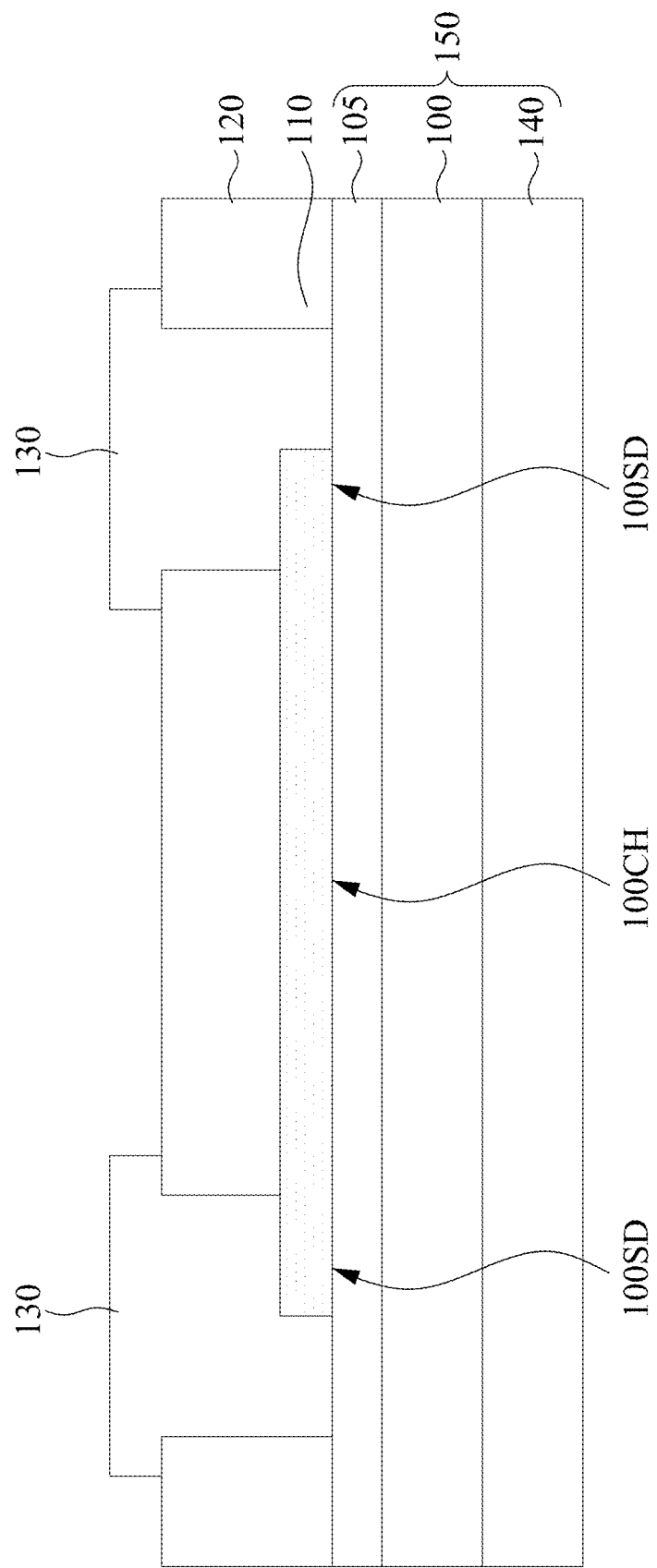

Reference is made to FIG. 12. A gate electrode 140 is formed on a backside of the substrate 100. The gate electrode 140, the substrate 100, the gate dielectric layer 105, the 2-D material layer 110, and the source/drain contacts 130 collectively form a transistor. In some embodiments, the gate electrode 140, the substrate 100, and the gate dielectric layer 105 collectively serve as a gate structure 150 of the transistor. The 2-D material layer 110 serves as a channel layer of the transistor. In some embodiments, because the gate structure 150 is disposed below the channel layer (2-D material layer 110) of the transistor, the transistor can be referred to as a "bottom-gate" transistor.

FIGS. 13 to 17 illustrate a method in various stages of fabricating a semiconductor device in accordance with some embodiments of the present disclosure. It is noted that some elements described in FIGS. 13 to 17 may be similar to those described with respect to FIGS. 1A to 5, such elements are labeled the same, and relevant details will not be repeated for simplicity.

Figure 13:
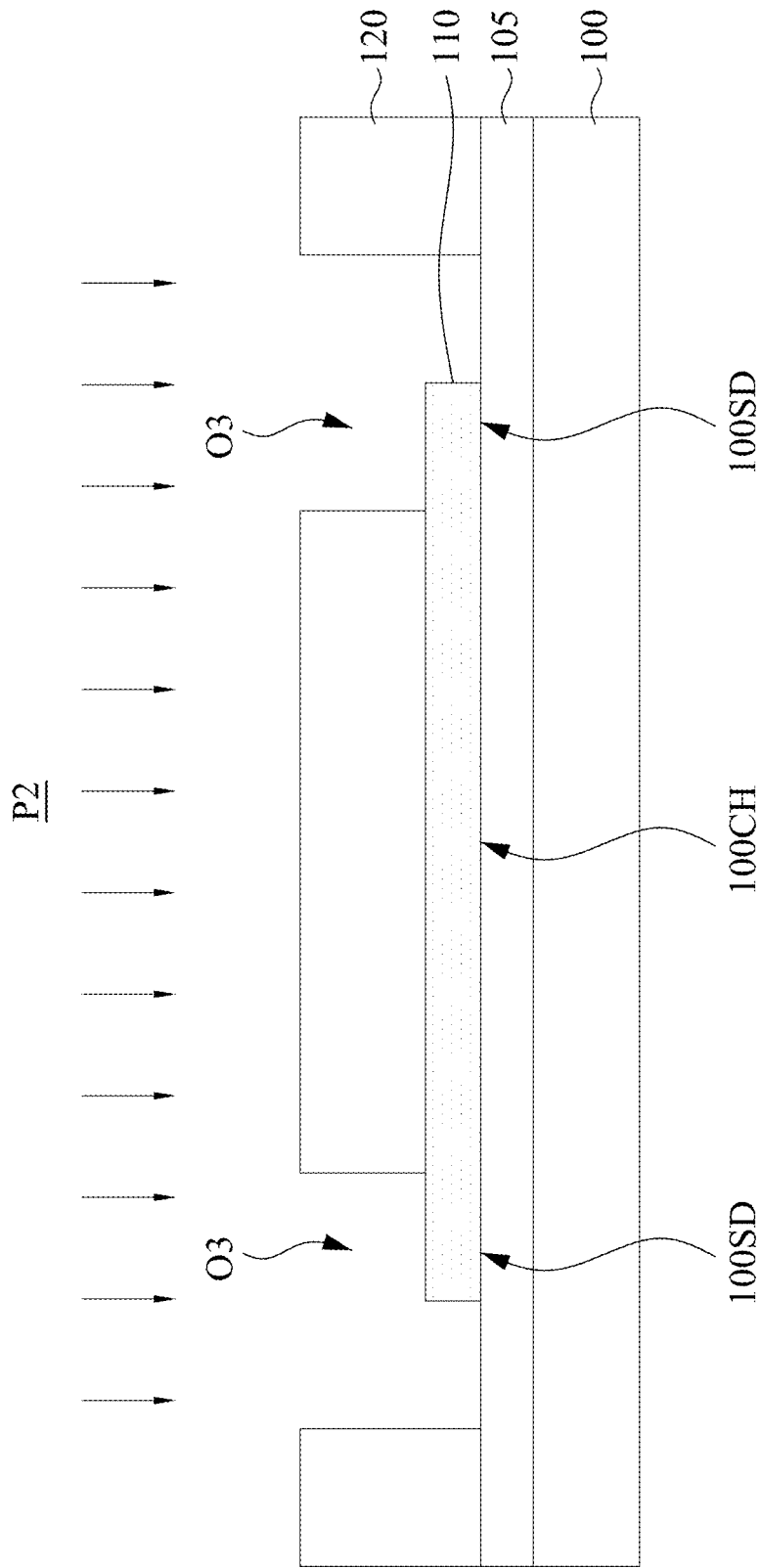
FIGS. 13 to 17 illustrate a method in various stages of fabricating a semiconductor device in accordance with some embodiments of the present disclosure.

Reference is made to FIG. 13. FIG. 13 is similar to FIG. 9, in which a patterning process P2 is performed to the passivation layer 120 to form openings O3 in the passivation layer 120. In some embodiments, the patterning process P2 of FIG. 13 is performed such that each of the openings O3 exposes a respective edge of the 2-D material layer. Furthermore, the openings O3 may expose portions of the gate dielectric layer 105 uncovered by the 2-D material layer 110. In some embodiments, source/drain regions 110SD may be formed in the 2-D material layer 110 through the openings O3 of the passivation layer 120. In some embodiments, the source/drain regions 110SD are doped regions in the 2-D material layer 110. The patterning process P2 may include etching process that is used to remove unwanted portions of the passivation layer 120. In some embodiments, the etchant used in the etching process of the patterning process P2 has higher etching rate to the passivation layer 120 than to the 2-D material layer and the gate dielectric layer 105. That is, the 2-D material layer 110 and the gate dielectric layer 105 may include higher etching resistance to the etching process of the patterning process P2 than the passivation layer 120.

Figure 14:
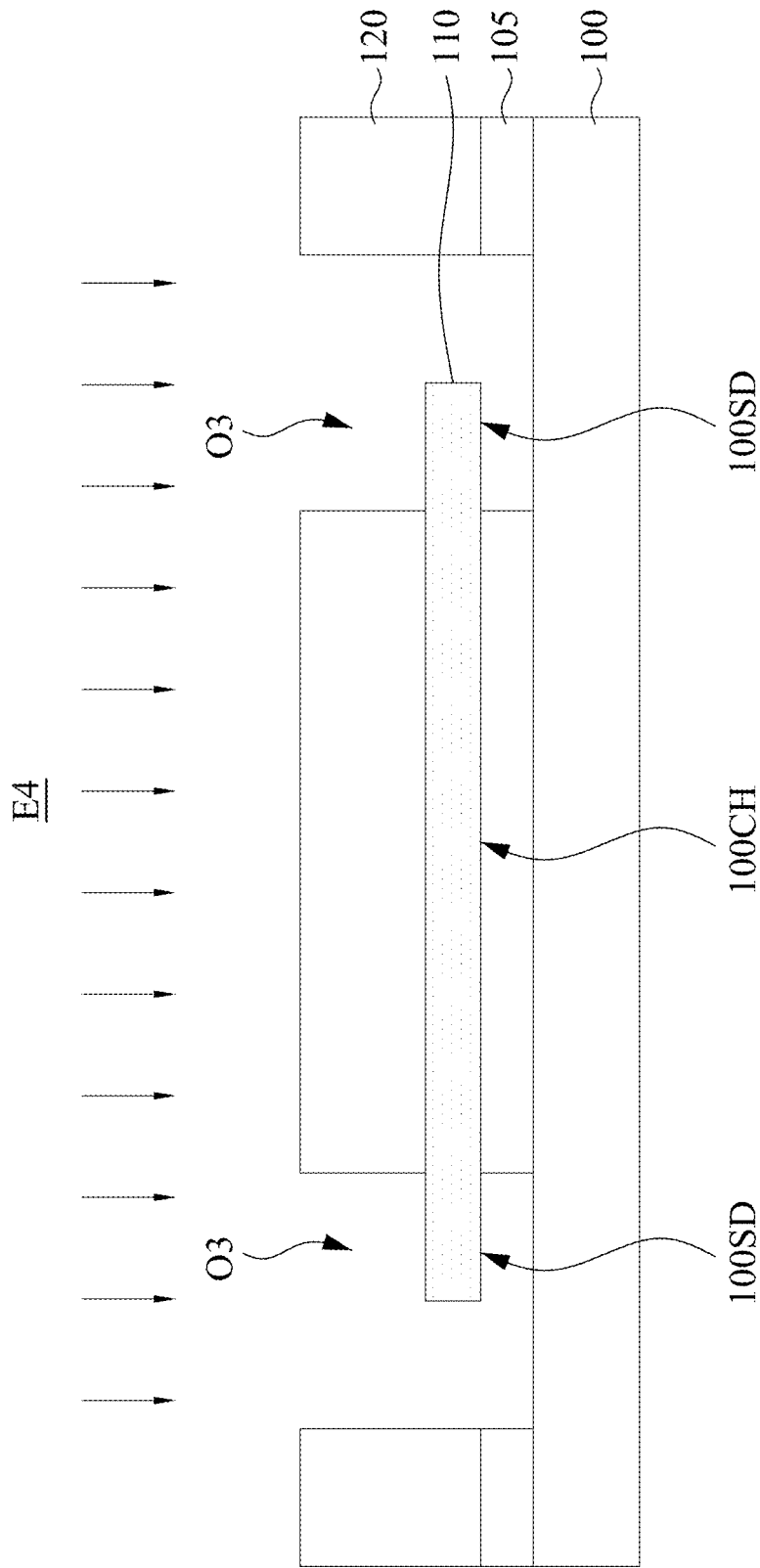

Reference is made to FIG. 14. An etching process E4 is performed to remove portions of the gate dielectric layer 105 through the openings O3 of the passivation layer 120, such that the openings O3 are extended downwardly into the gate dielectric layer 105. In greater details, the etching process E4 may remove portions of the gate dielectric layer 105 that are vertically below the 2-D material layer 110, such that bottom surfaces of the 2-D material layer 110 are exposed to openings O3 the after the etching process E4 is completed. In some embodiments, the etching process E4 may include etchant that is different from the etchant of the etching process of the patterning process P2 of FIG. 13. In some embodiments, the etchant used in the etching process E4 has higher etching rate to the gate dielectric layer 105 than to the 2-D material layer and the passivation layer 120. That is, the 2-D material layer 110 and the passivation layer 120 may include higher etching resistance to the etching process E4 than the gate dielectric layer 105. In some embodiments, after the etching process E4 is completed, the source/drain regions 110SD of the 2-D material layer 110 are suspended over the substrate 100. That is, at least three sides of the 2-D material layer 110 are exposed to the openings O3 of the passivation layer 120 as a result of the etching process E4.

Figure 15A:
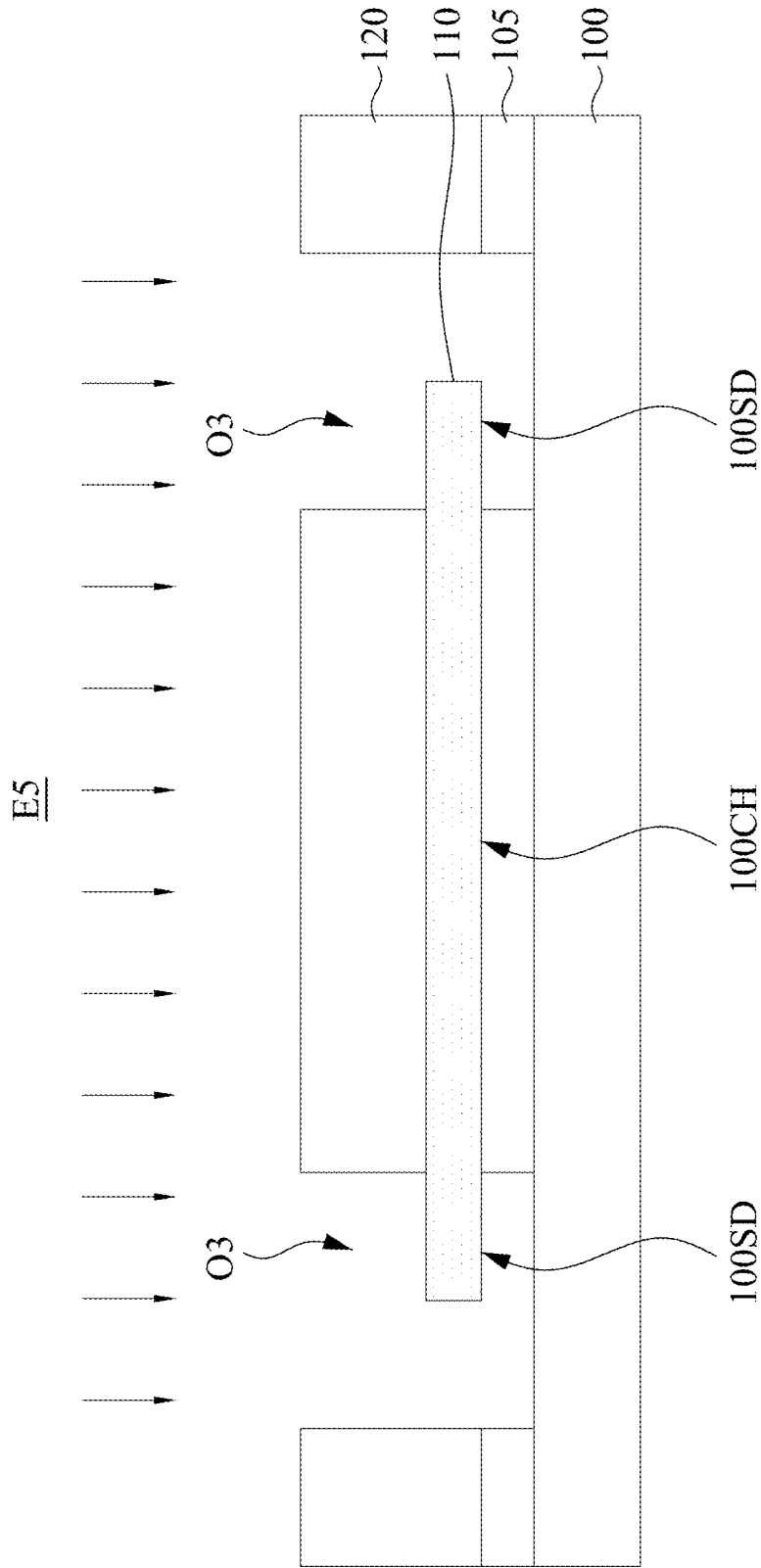
Figure 15B:
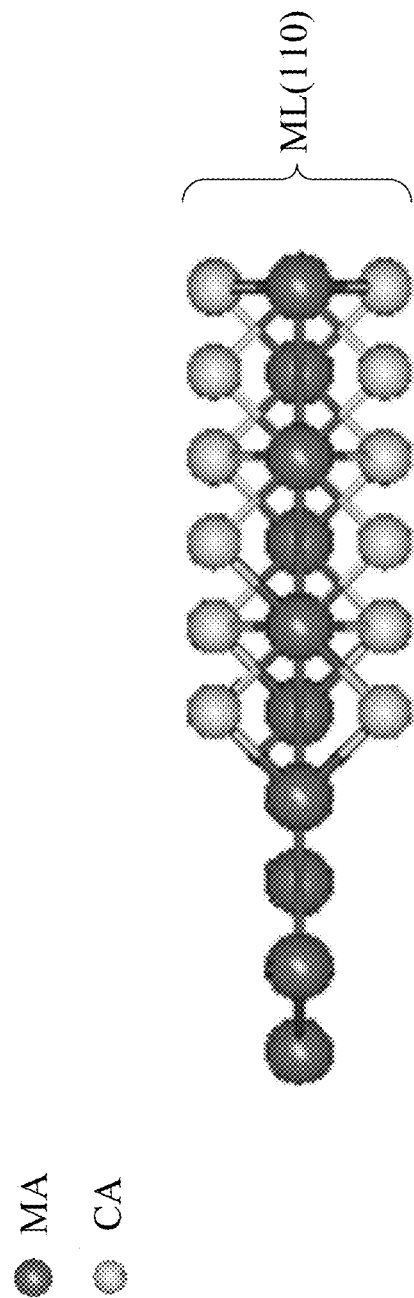

Reference is made to FIGS. 15A and 15B, in which FIG. 15A illustrates a cross-sectional view of an intermediate stage for fabricating a semiconductor device, and FIG. 15B illustrates a crystal structure of a monolayer of a 2-D material layer in accordance with some example embodiments. An etching process ES is performed to the 2-D material layer 110 through the openings O3 of the passivation layer 120. In some embodiments, the etching process E5 is performed to the source/drain regions 110SD of the 2-D material layer 110. In some embodiments, the etching process E5 may be performed using an accelerated ($H_2$) plasma under the combination of its energetic power, flow rate, pressure and temperature that lead to an incident kinetic energy of each plasma ion ranging from 5~6 eV (just above the dissociation energy per bond within a TMD). In some embodiments, the etchant of the etching process E5 is different from the etchant of the etching process E4 described in FIG. 14.

As shown in FIG. 15B, when the 2-D material layer 110 is made of TMD, the etching process E5 is performed to remove the chalcogen atoms CA of the TMD layer 110 exposed by the openings O3 of the passivation layer 120. As mentioned above, the TMD layer 110 may include a layer of transition metal atoms MA in the middle region, a top layer of chalcogen atoms CA over the layer of transition metal atoms MA, and a bottom layer of chalcogen atoms CA underlying the layer of transition metal atoms MA. The etching process E5 may remove the chalcogen atoms CA in the top layer through the openings O3 of the passivation layer 120, and may also remove chalcogen atoms CA in the bottom layer through the openings O3 of the passivation layer 120. This is because the top surface and the bottom surface of the 2-D material layer 110 are exposed as a result of the etching process E5 of FIG. 14. In some embodiments, the bonding (e.g., polar-covalent bond) between the chalcogen atoms CA of the top and bottom layers and the transition metal atoms MA may be broken through thermal cracking (e.g. the etching process E5). Accordingly, after the etching process E5 is completed, the top side and the bottom side of the transition metal atoms MA of the TMD layer 110 may be exposed through the openings O3 of the passivation layer 120.

In some embodiments, the etching process E5 is a gas phase etching process without breaking the basal plane of the layer of transition metal atoms MA. As shown in FIG. 15B, the middle layer of transition metal atoms MA is substantially intact after the etching process E5 is completed. That is, the etching process E5 only removes the chalcogen atoms CA of the TMD layer 110, but does not remove the transition metal atoms MA of the TMD layer 110. Also, portions of the TMD layer 110 are covered by passivation layer 120 and the gate dielectric layer 105 during the etching process E5. Accordingly, the etching process E5 only removes portions of the chalcogen atoms CA that are exposed, while the etching process E5 does not remove the chalcogen atoms CA that are covered by the passivation layer 120 and the gate dielectric layer 105.

Figure 16B:
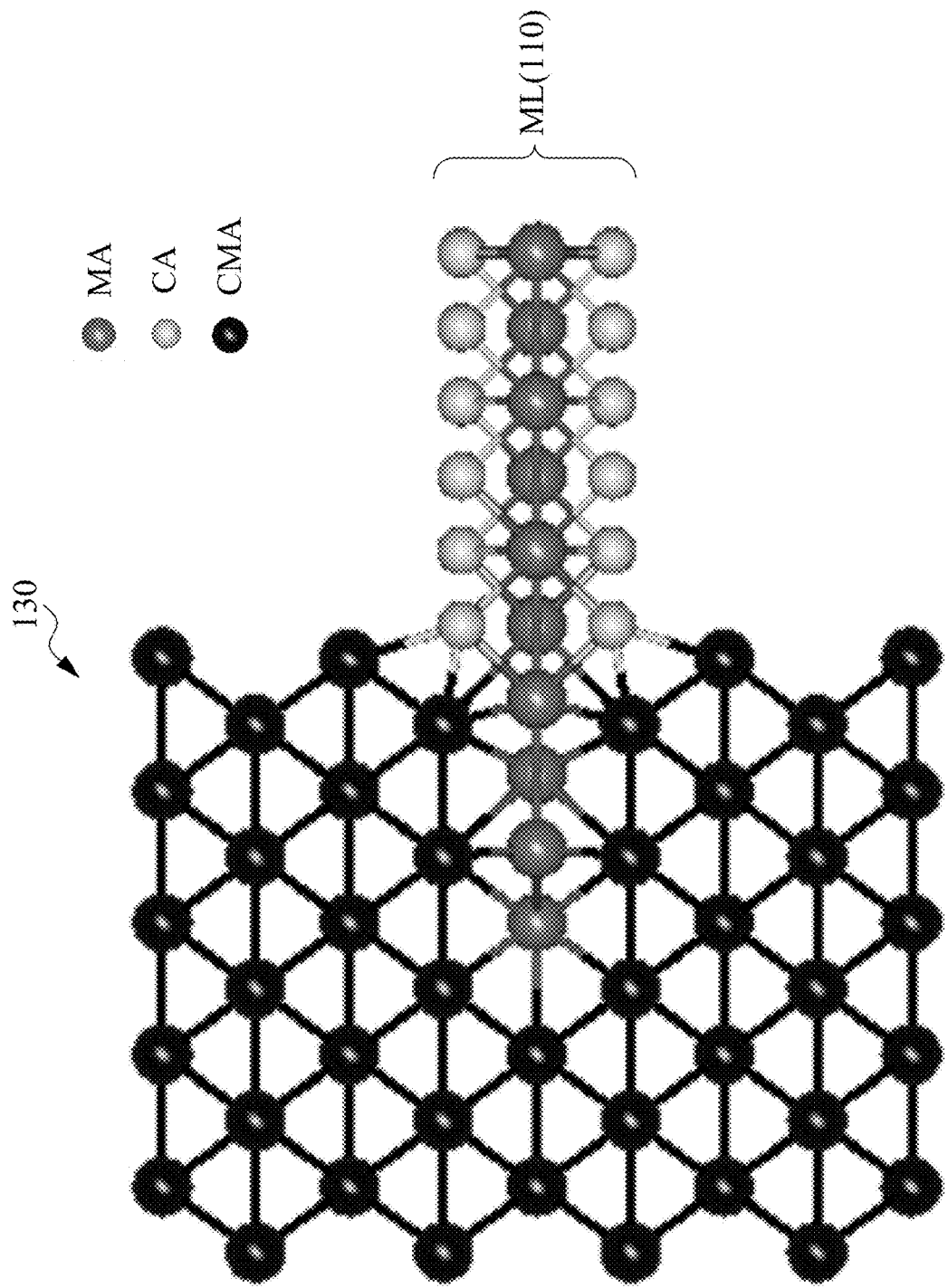

Reference is made to FIGS. 16A and 16B, in which FIG. 16A illustrates a cross-sectional view of an intermediate stage for fabricating a semiconductor device, and FIG. 16B illustrates a crystal structure of a monolayer of a 2-D material layer and a metal contact in accordance with some example embodiments. After the etching process E5 is completed (see FIGS. 15A and 15B), source/drain contacts 130 are formed in the openings O3 (see FIGS. 15A and 15B) of the passivation layer 120 and in contact with the source/drain regions 110SD of the 2-D material layer 110. In some embodiments, the source/drain contacts 130 may extend from the top surface of the 2-D material layer 110, through the sidewalls of the 2-D material layer 110, to the bottom surface of the 2-D material layer 110. That is, portions of the source/drain contacts 130 may extend to a position vertically between the substrate 100 and the 2-D material layer 110. The source/drain contacts 130 may be in contact with the sidewalls of the gate dielectric layer 105 and the top surface of the substrate 100.

In some embodiments where the 2-D material layer 110 is made of TMD, as mentioned above, the TMD layer 110 undergoes an etching process E5 as described in FIGS. 15A and 15B, and the chalcogen atoms CA of the 2-D material layer 110 that are exposed by the openings O3 of the passivation layer 120 are removed to reveal the transition metal atoms MA of the 2-D material layer 110. As a result, the contact metal atoms CMA of the source/drain contacts 130 may form metallic bonds with the transition metal atoms MA of the 2-D material layer 110. In some embodiments, the contact metal atoms CMA may form metallic bonds with the transition metal atoms MA from top side of the layer of transition metal atoms MA and from bottom side of the layer of transition metal atoms MA. In some other embodiments, the contact metal atoms CMA of the source/drain contacts 130 may also form chemical bonds with adjacent chalcogen atoms CA of the 2-D material layer 110. In some embodiments, the contact metal atoms CMA may form chemical bonds with the chalcogen atoms CA at the top layer of the monolayer ML and the chalcogen atoms CA at the bottom layer of the monolayer ML.

Figure 17:
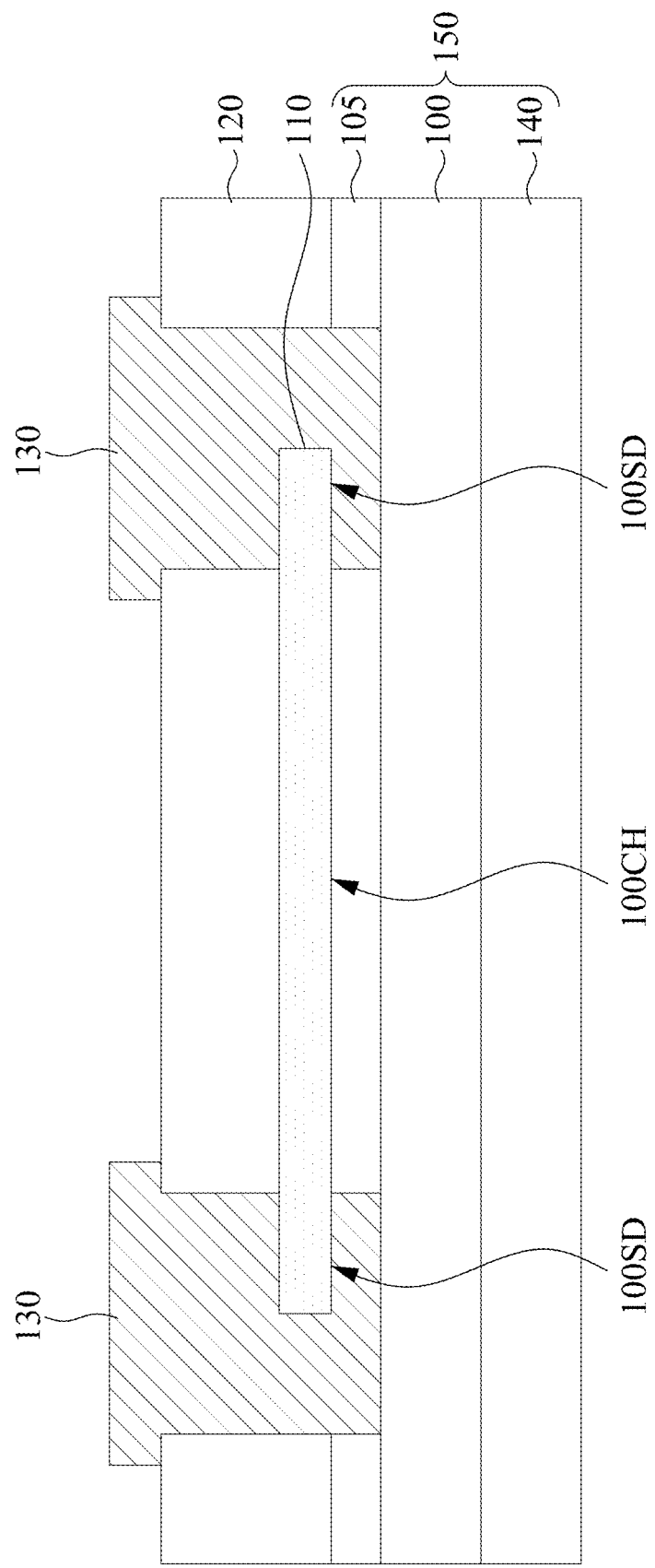

Reference is made to FIG. 17. A gate electrode 140 is formed on a backside of the substrate 100. The gate electrode 140, the substrate 100, the gate dielectric layer 105, the 2-D material layer 110, and the source/drain contacts 130 collectively form a transistor. In some embodiments, the gate electrode 140, the substrate 100, and the gate dielectric layer 105 collectively serve as a gate structure 150 of the transistor. The 2-D material layer 110 serves as a channel layer of the transistor. In some embodiments, because the gate structure 150 is disposed below the channel layer (2-D material layer 110) of the transistor, the transistor can be referred to as a "bottom-gate" transistor.

FIGS. 18A to 22 illustrate a method in various stages of fabricating a semiconductor device in accordance with some embodiments of the present disclosure. It is noted that some elements described in FIGS. 18A to 22 may be similar to those described with respect to FIGS. 1A to 5, such elements are labeled the same, and relevant details will not be repeated for simplicity.

Figure 18A:
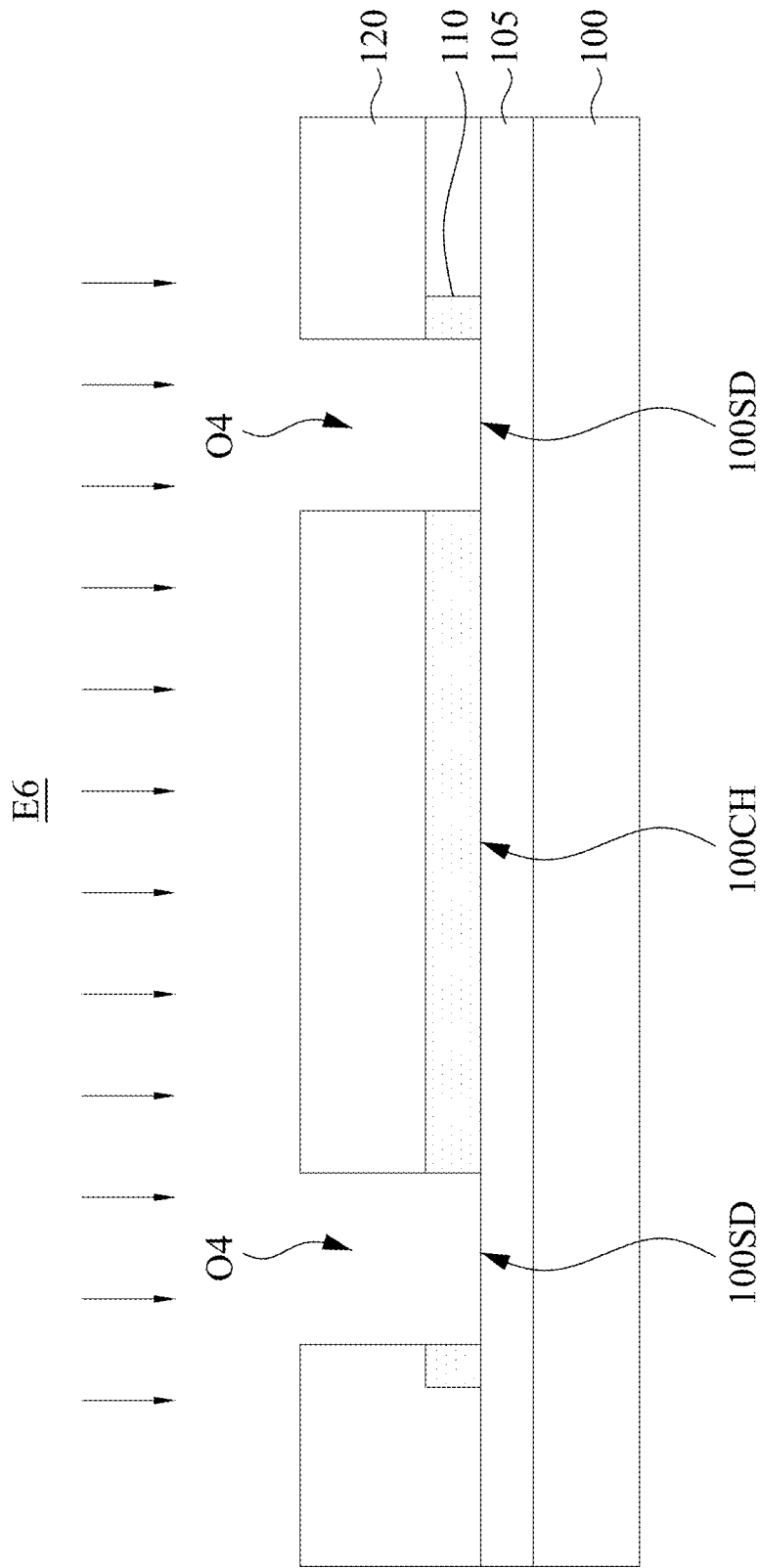
FIGS. 18A to 22 illustrate a method in various stages of fabricating a semiconductor device in accordance with some embodiments of the present disclosure.
Figure 18B:
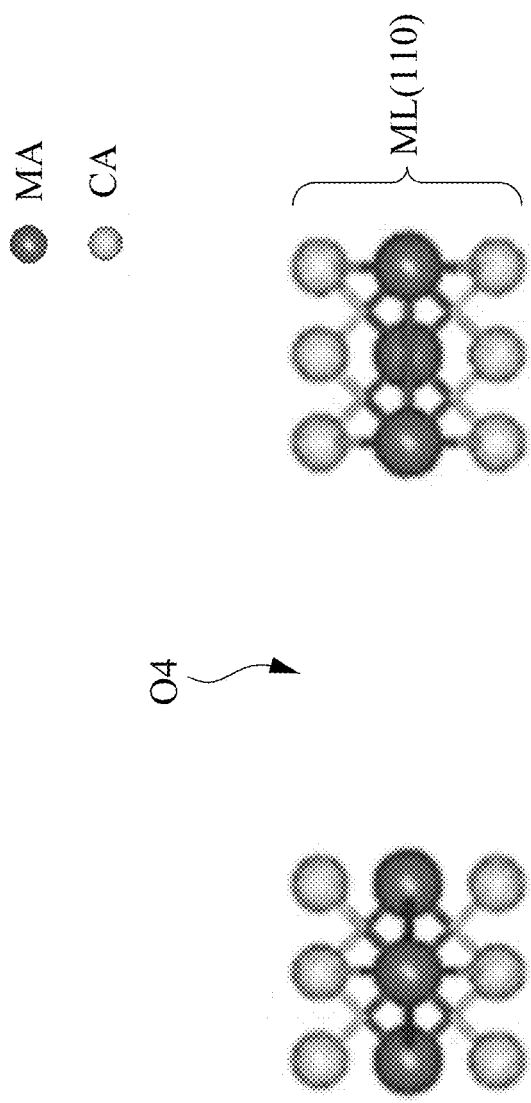

Reference is made to FIGS. 18A and 18B, in which FIG. 18A illustrates a cross-sectional view of an intermediate stage for fabricating a semiconductor device, and FIG. 18B illustrates a crystal structure of a monolayer of a 2-D material layer in accordance with some example embodiments. An etching process E6 may be performed to the structure shown in FIG. 2, so as to remove portions of the 2-D material layer 110 that are exposed by the openings O1 (see FIG. 2). In some embodiments, the etching process E6 etches through the 2-D material layer 110 to form openings O4 that expose the gate dielectric layer 105. In some embodiments, the etching process E6 may be a plasma dry etching process using Ar plasma.

As shown in FIG. 18B, when the 2-D material layer 110 is made of TMD, the TMD layer 110 may include a layer of transition metal atoms MA in the middle region, a top layer of chalcogen atoms CA over the middle layer of transition metal atoms MA, and a bottom layer of chalcogen atoms CA underlying the middle layer of transition metal atoms MA. In some embodiments, the etching process E6 may remove the chalcogen atoms CA and the transition metal atoms MA that are vertically exposed by the openings O1 (see FIG. 2). In greater details, portions of the chalcogen atoms CA at the top layer and the bottom layer of the monolayer ML, and portions of the transition metal atoms MA in the middle region monolayer ML are etched away. Accordingly, some of the chalcogen atoms CA at the top layer, some of the chalcogen atoms CA at the bottom layer, and some of the transition metal atoms MA in the middle region monolayer ML are exposed to the openings O4.

Figure 19A:
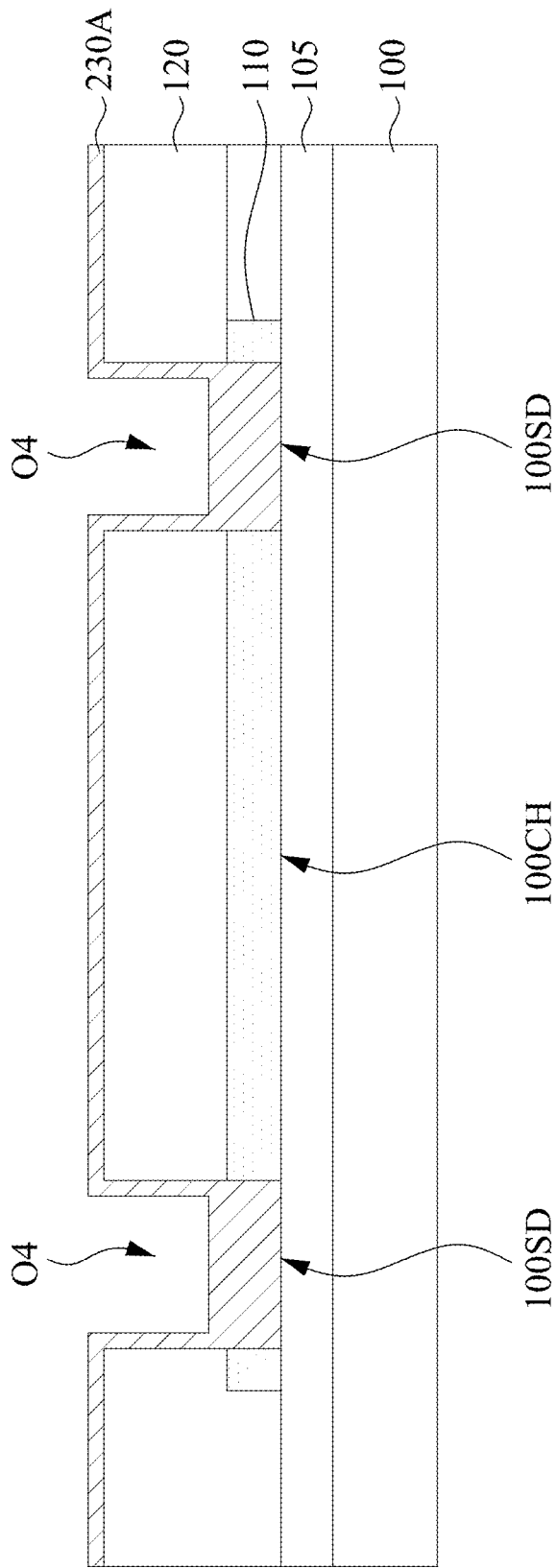
Figure 19B:
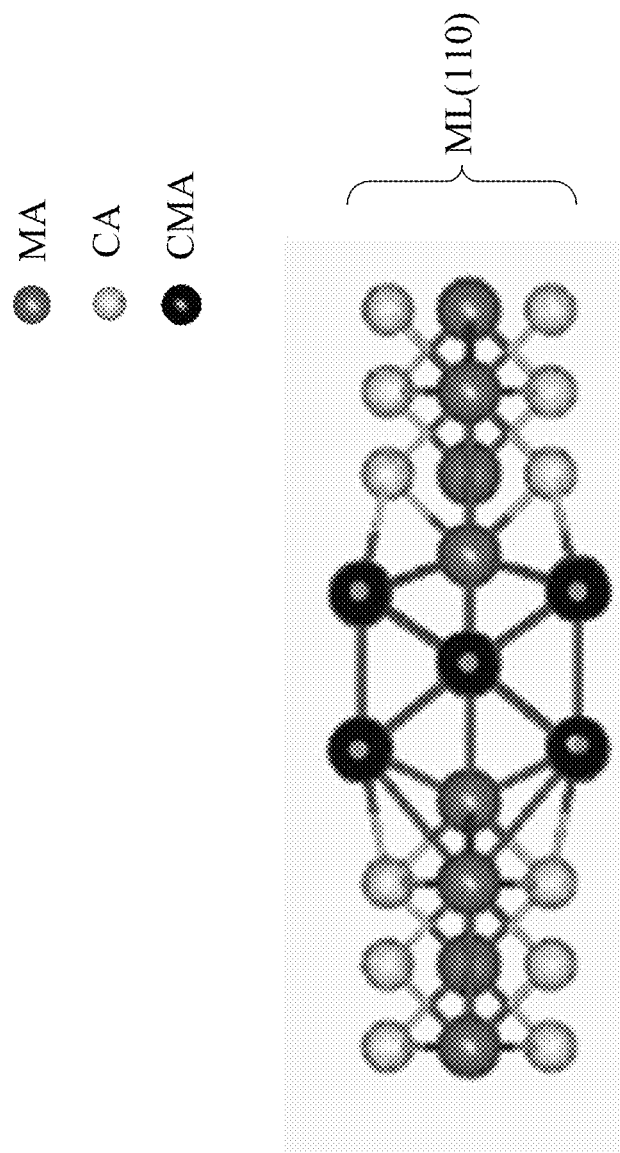

Reference is made to FIGS. 19A and 19B, in which FIG. 19A illustrates a cross-sectional view of an intermediate stage for fabricating a semiconductor device, and FIG. 19B illustrates a crystal structure of a monolayer of a 2-D material layer and a metal contact in accordance with some example embodiments. After the etching process E6 is completed (see FIGS. 18A and 18B), a first metal layer 230A is deposited in the openings O4. The first metal layer 230A may be deposited by any suitable method, e.g., CVD, PECVD, PVD, ALD, PEALD, electrochemical plating (ECP), electroless plating and/or the like. In some embodiments, the first metal layer 230A may include Pt, Au, Ag, Cu, Ni, Al, W, Mo, or other suitable contact metals. In some embodiments where the 2-D material layer 110 is made of TMD, the first metal layer 230A may include metal that is the same as the transition metal of the 2-D material layer 110. For example, if the 2-D material layer 110 is made of $WS_2$, $WSe_2$, or $WTe_2$, the first metal layer 230A may include W. If the 2-D material layer 110 is made of $MoS_2$, $MoSe_2$, or $MoTe_2$, the first metal layer 230A may include Mo. If the 2-D material layer 110 is made of $PtS_2$, $PtSe_2$, or $PtTe_2$, the first metal layer 230A may include Pt.

Reference is made to FIG. 19B. As mentioned above, the TMD layer 110 undergoes an etching process E6 as described in FIGS. 18A and 18B, the contact metal atoms CMA of the first metal layer 230A may form metallic bonds with the transition metal atoms MA of the 2-D material layer 110. In some other embodiments, the contact metal atoms CMA of the first metal layer 230A may also form chemical bonds with the chalcogen atoms CA at the top layer and the bottom layer of the monolayer ML that are exposed to the openings O4 (see FIGS. 18A and 18B).

Figure 20:
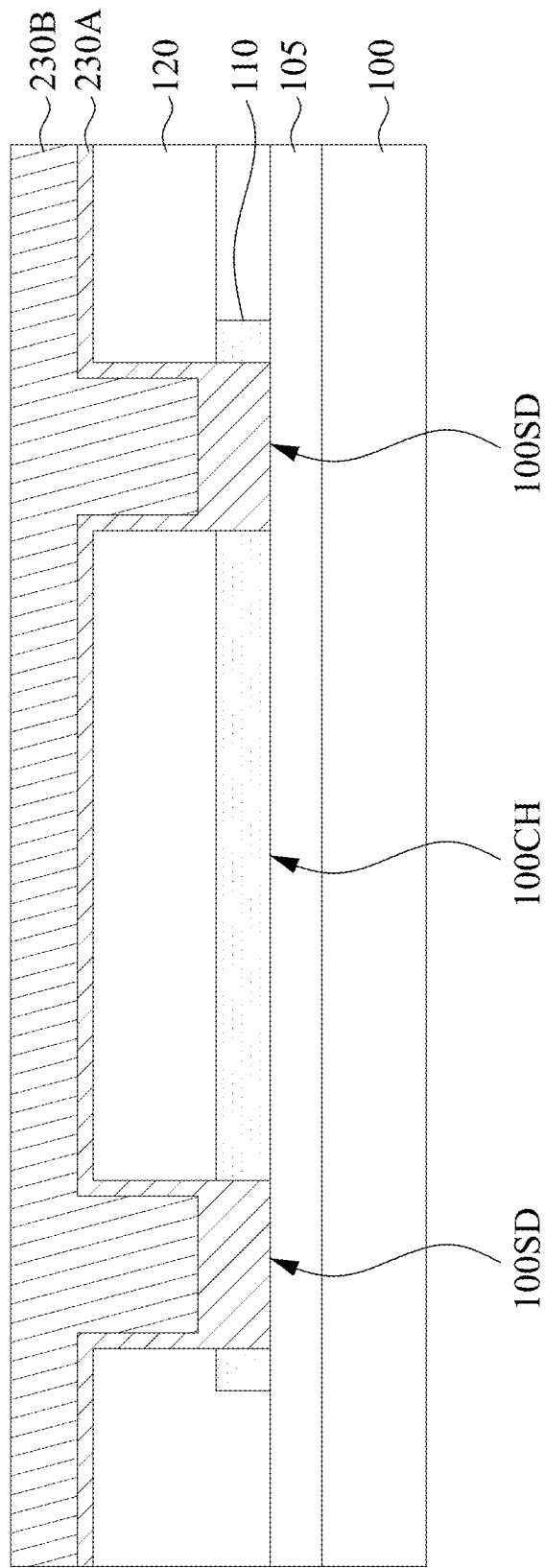

Reference is made to FIG. 20. A second metal layer 230B is deposited in the openings O4 and over the first metal layer 230A. The second metal layer 230B may be deposited by any suitable method, e.g., CVD, PECVD, PVD, ALD, PEALD, electrochemical plating (ECP), electroless plating and/or the like. In some embodiments, the second metal layer 230B may include Pt, Au, Ag, Cu, Ni, Al, W, Mo, or other suitable contact metals. In some embodiments where the 2-D material layer 110 is made of TMD, the first metal layer 230A may include metal that is the same as the transition metal of the 2-D material layer 110, while the second metal layer 230B may include metal that is different from the transition metal of the 2-D material layer 110. For example, if the 2-D material layer 110 is made of $WS_2$, $WSe_2$, or $WTe_2$, the second metal layer 230B may include metal different from W. If the 2-D material layer 110 is made of $MoS_2$, $MoSe_2$, or $MoTe_2$, the second metal layer 230B may include metal different from Mo. If the 2-D material layer 110 is made of $PtS_2$, $PtSe_2$, or $PtTe_2$, the second metal layer 230B may include metal different from Pt. In some embodiments, the second metal layer 230B may include a higher work function value than a work function value of the first metal layer 230A and a work function value of transition metal of the 2-D material layer 110.

Figure 21:
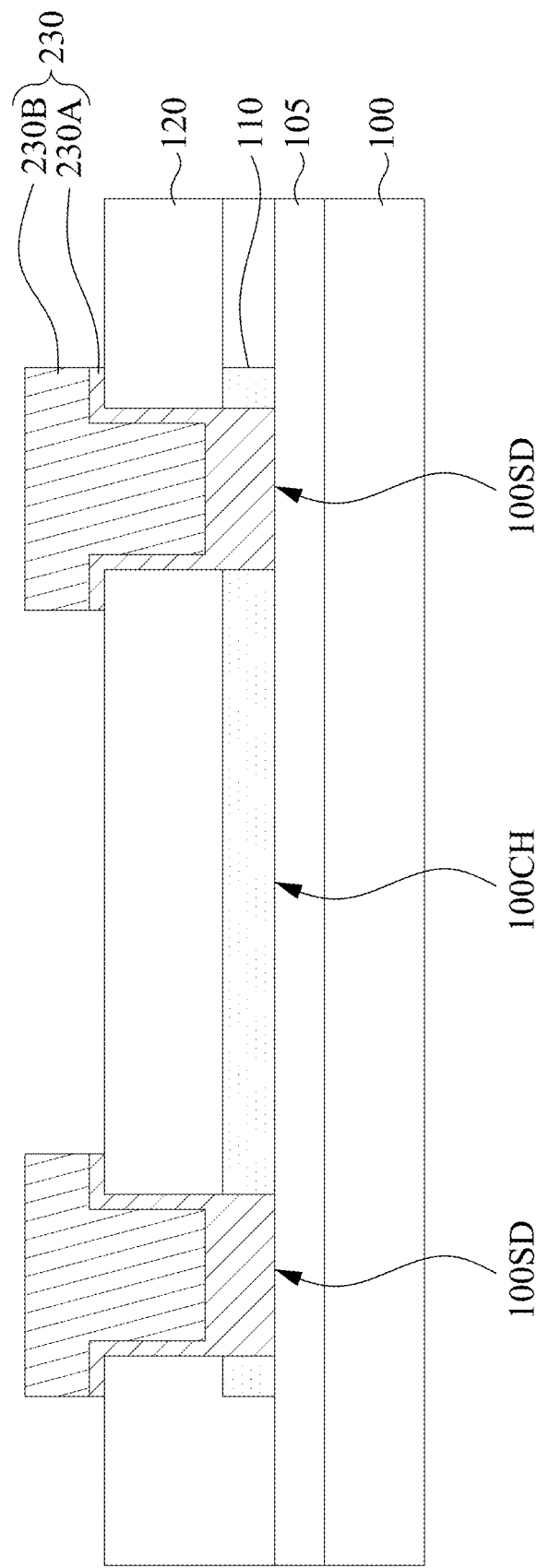

Reference is made to FIG. 21. The first metal layer 230A and the second metal layer 230B are patterned to form source/drain contacts 230. In some embodiments, each of the source/drain contacts 230 includes a remaining portion of the first metal layer 230A and a remaining portion of the second metal layer 230B. In some embodiments, the first metal layer 230A and the second metal layer 230B may be patterned by, for example, forming a patterned mask having openings exposing unwanted portions of the first metal layer 230A and the second metal layer 230B, performing an etching process to remove the unwanted portions of the first metal layer 230A and the second metal layer 230B, and them removing the patterned mask.

Figure 22:
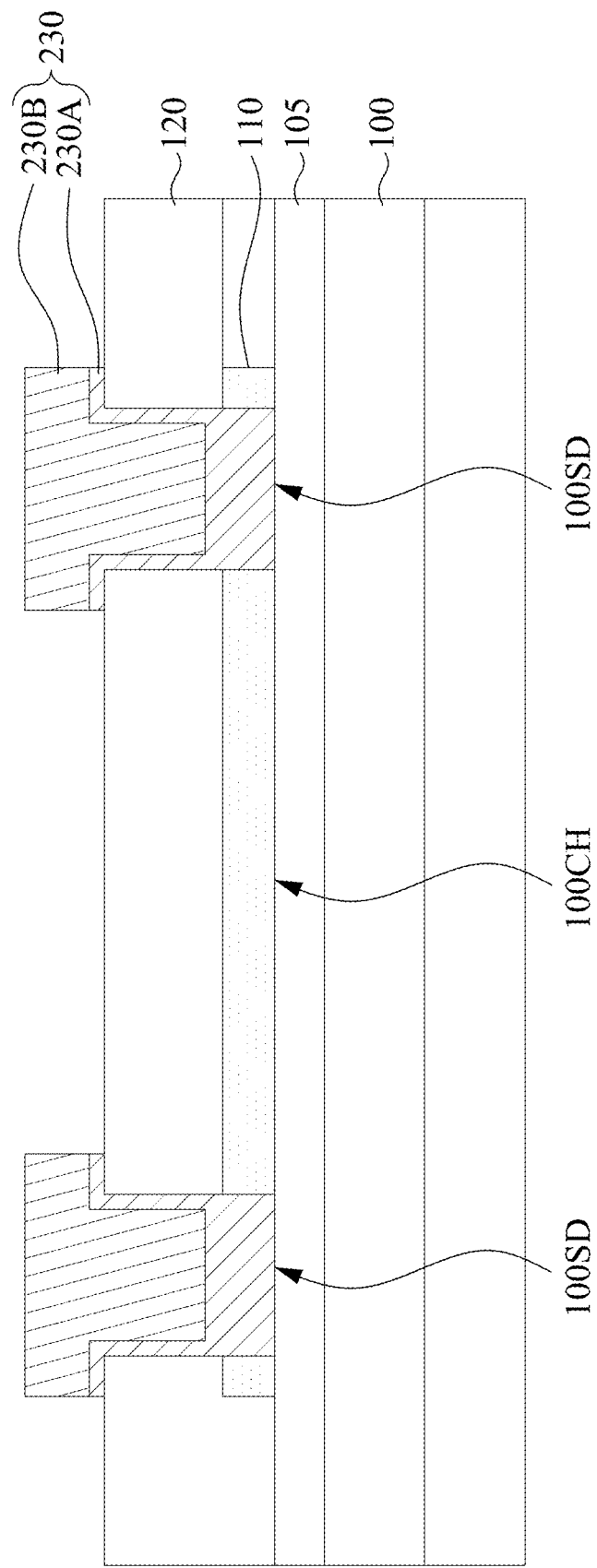

Reference is made to FIG. 22. A gate electrode 140 is formed on a backside of the substrate 100. The gate electrode 140, the substrate 100, the gate dielectric layer 105, the 2-D material layer 110, and the source/drain contacts 230 collectively form a transistor. In some embodiments, the gate electrode 140, the substrate 100, and the gate dielectric layer 105 collectively serve as a gate structure 150 of the transistor. The 2-D material layer 110 serves as a channel layer of the transistor. In some embodiments, because the gate structure 150 is disposed below the channel layer (2-D material layer 110) of the transistor, the transistor can be referred to as a "bottom-gate" transistor.

Figure 23E:
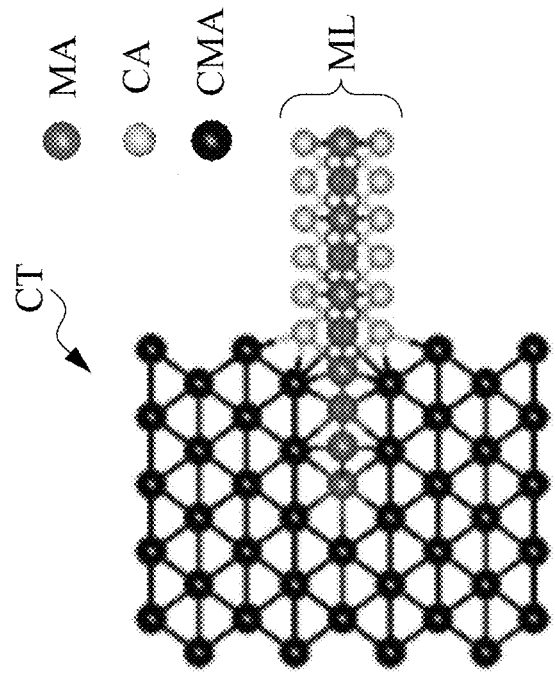

FIGS. 23A, 23B, 23C, 23D, and 23E illustrate crystal structures of a monolayer of a 2-D material layer and a metal contact in accordance with some example embodiments. In greater details, FIGS. 23A, 23B, 23C, 23D, 23E each illustrates a crystalline relationship between a TMD layer and a contact in atomic scale. FIG. 24 illustrates simulation results of currents under fixed voltage in accordance with some example embodiments.

FIG. 23A is an example where a contact CT is disposed on a top side of a TMD monolayer ML, in which the chalcogen atoms CA of the TMD monolayer ML are not removed, and thus the contact metal atoms CMA are connected to the chalcogen atoms CA through van der Waals force.

FIG. 23B is an example where a contact CT is disposed on an edge side of a TMD monolayer ML, in which the chalcogen atoms CA of the TMD monolayer ML are not removed, while the contact metal atoms CMA can form metallic bonds with the exposed transition metal atoms MA at the edge side of the TMD monolayer ML.

FIG. 23C is an example where a contact CT is disposed on a top side of a TMD monolayer ML, such as the embodiments described in FIGS. 1A to 5 and/or FIGS. 6 to 8. In such embodiments, some of the chalcogen atoms CA of the TMD monolayer ML are removed, and may be replaced with the contact metal atoms CMA. Thus, the contact metal atoms CMA can form metallic bonds with the exposed transition metal atoms MA from the top side of the TMD monolayer ML. It is noted that in FIG. 23C, the contact metal atoms CMA may form more metallic bonds with the exposed transition metal atoms MA than FIG. 23B.

Figure 23D:
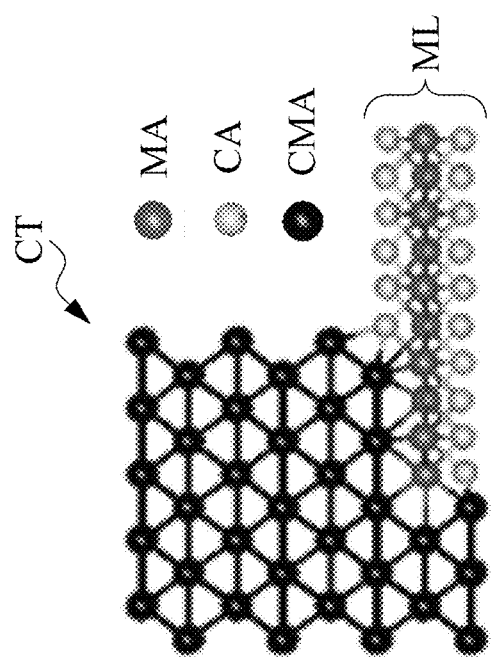
Figure 24:
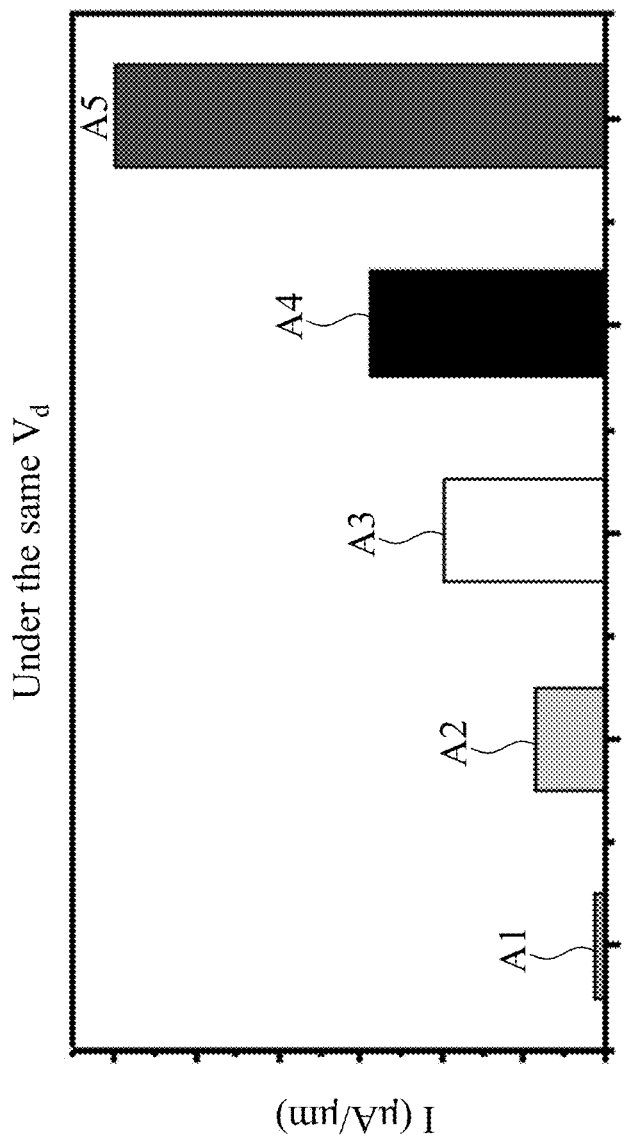
FIG. 24 illustrates simulation results of currents under fixed voltage in accordance with some example embodiments.

FIG. 23D is an example where a contact CT is disposed on a top side of a TMD monolayer ML and extending to an edge side of the TMD monolayer ML, such as the embodiments described in FIGS. 9 to 12. In such embodiments, some of the chalcogen atoms CA of the TMD monolayer ML are removed, and may be replaced with the contact metal atoms CMA. Thus, the contact metal atoms CMA can form metallic bonds with the exposed transition metal atoms MA from the top side of the TMD monolayer ML and from the edge side of the TMD monolayer ML. It is noted that in FIG. 23D, the contact metal atoms CMA may form more metallic bonds with the exposed transition metal atoms MA than FIG. 23C.

FIG. 23E is an example where a contact CT is disposed on a top side of a TMD monolayer ML and extending to an edge side and a bottom side of the TMD monolayer ML, such as the embodiments discussed in FIGS. 13 to 17. In such embodiments, some of the chalcogen atoms CA of the TMD monolayer ML are removed from the top side and the bottom side of the TMD monolayer ML, and may be replaced with the contact metal atoms CMA. Thus, the contact metal atoms CMA can form metallic bonds with the exposed transition metal atoms MA from the top side, the edge side, and the bottom side of the TMD monolayer ML. It is noted that in FIG. 23E, the contact metal atoms CMA may form more metallic bonds with the exposed transition metal atoms MA than FIG. 23D.

As shown in FIG. 24, shown there are simulated currents of five conditions A1, A2, A3, A4, and A5 under fixed voltage, in which conditions A1, A2, A3, A4, and A5 are simulation results of the structures of FIGS. 23A, 23B, 23C, 23D, and 23E, respectively. In condition A3 where the chalcogen atoms CA are replaced with contact metal atoms CMA from one side of the TMD monolayer ML, the simulated current is higher than the simulated currents of conditions A1 and A2. Moreover, the structure of condition A4 (FIG. 23D) has more contact area than the structure of condition A3 (FIG. 23C) by contacting the edge side of the TMD monolayer ML. Accordingly, the current of condition A4 is substantially equal to the sum of the current of condition A2 and condition A3. Furthermore, the structure of condition A5 (FIG. 23E) has more contact area (more than twice) with the TMD monolayer ML than the structure of condition A4 (FIG. 23D). Accordingly, the current of condition A5 is higher than twice the current of condition A4. As a result, it can be seen that when the chalcogen atoms CA of the TMD monolayer ML are replaced with the contact metal atoms CMA of the contact CT, the current can be improved. Also, when the contact CT is in contact with more sides of the TMD monolayer ML, the contact area between the contact CT and the TMD monolayer ML will be increased, and the current can be improved.

Figure 26:
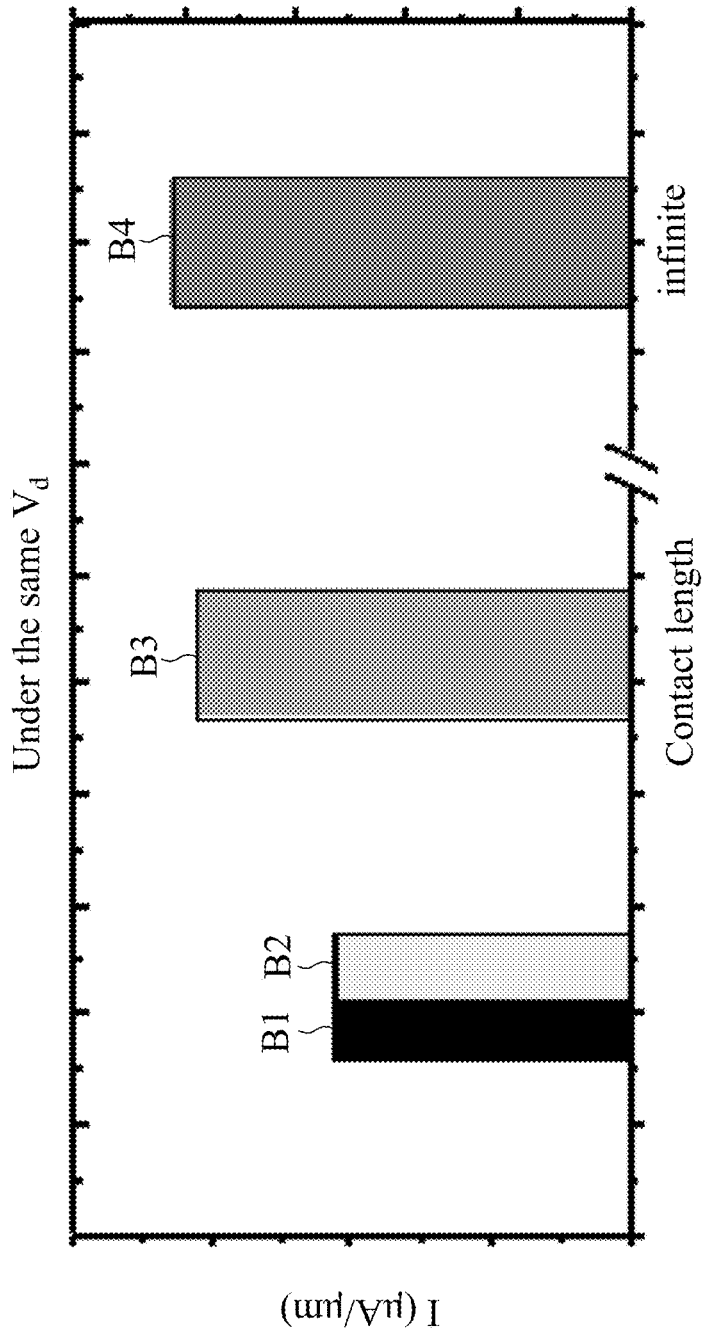
FIG. 26 illustrates simulation results of currents under fixed voltage in accordance with some example embodiments.
Figure 28B:
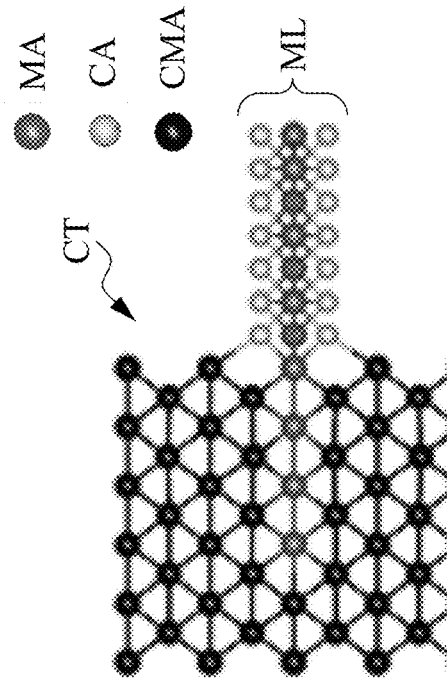
FIGS. 28A, 28B, 28C, and 28D illustrate crystal structures of a monolayer of a 2-D material layer and a metal contact in accordance with some example embodiments.
Figure 28D:
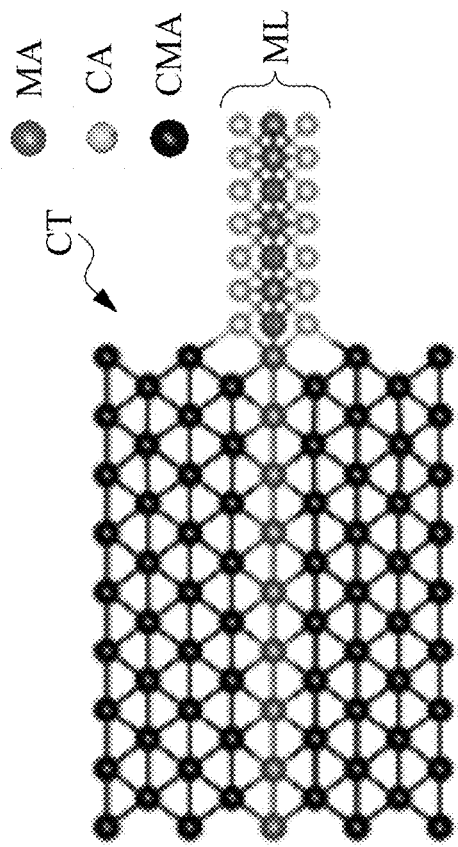
Figure 28A:
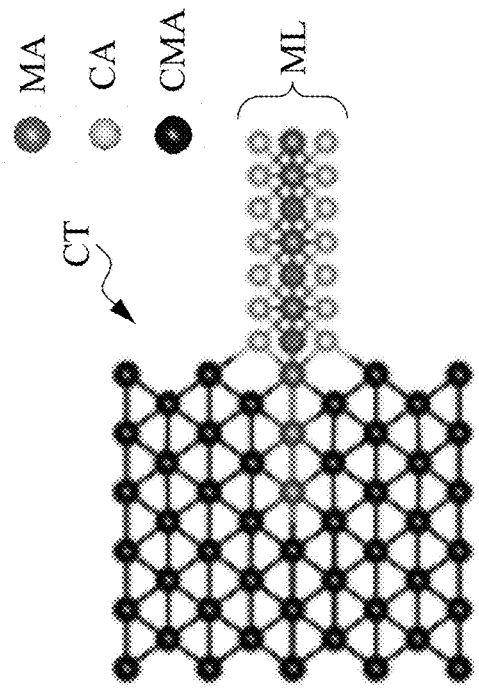
Figure 28C:
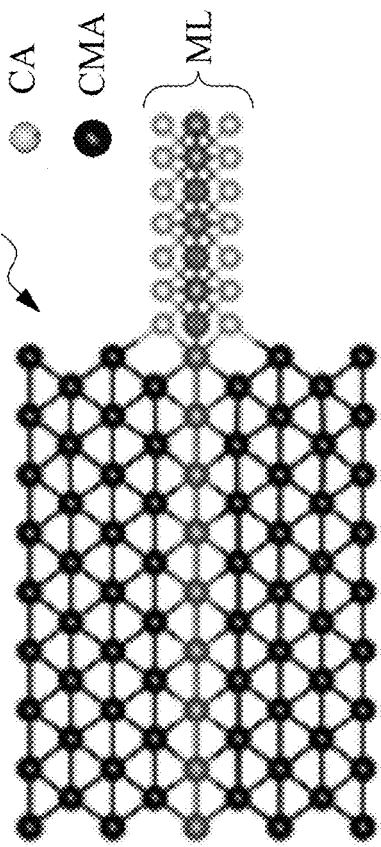

FIGS. 25A, 25B, and 25C illustrate crystal structures of a monolayer of a 2-D material layer and a metal contact in accordance with some example embodiments. FIG. 26 illustrates simulation results of currents under fixed voltage in accordance with some example embodiments.

On the left side of FIG. 25A, shown there is a crystal structure of a TMD monolayer ML where 2 columns of the chalcogen atoms CA of the TMD monolayer ML are removed. On the right side of FIG. 25A, shown there is a cross-sectional view where a contact CT is formed over the TMD monolayer ML and the removed chalcogen atoms CA of the TMD monolayer ML are replaced with 1 contact metal atom CMA (or 1 column of contact metal atoms CMA). In some embodiments, the contact length between the contact CT and the TMD monolayer ML may be in a range from about $3.0 \times 10^{-4}$ μm to about $3.25 \times 10^{-4}$ μm, such as $3.125 \times 10^{-4}$ μm.

On the left side of FIG. 25B, shown there is a crystal structure of a TMD monolayer ML where 4 columns of the chalcogen atoms CA of the TMD monolayer ML are removed. On the right side of FIG. 25B, shown there is a cross-sectional view where a contact CT is formed over the TMD monolayer ML and the removed chalcogen atoms CA of the TMD monolayer ML are replaced with 2 contact metal atoms CMA (or 2 columns of contact metal atoms CMA). In some embodiments, the contact length between the contact CT and the TMD monolayer ML may be in a range from about $6.0 \times 10^{-4}$ μm to about $6.5 \times 10^{-4}$ μm, such as $6.25 \times 10^{-4}$ μm.

On the left side of FIG. 25C, shown there is a crystal structure of a TMD monolayer ML where infinite columns (e.g., macroscopic numbers of columns) of the chalcogen atoms CA of the TMD monolayer ML are removed. On the right side of FIG. 25B, shown there is a cross-sectional view where a contact CT is formed over the TMD monolayer ML and the removed chalcogen atoms CA of the TMD monolayer ML are replaced with contact metal atoms CMA.

As shown in FIG. 26, shown there are simulated currents of four conditions B1, B2, B3, and B4 under fixed voltage, in which condition B1 is simulation result of the structure of FIG. 23B (side contact only), and condition B2, B3, B4 are simulation results of the structures of FIGS. 25A, 25B, and 25C, respectively. The result shows that current will increase when more chalcogen atoms CA of the TMD monolayer ML are replaced with contact metal atoms CMA of the contact CT. That is, when the contact length between the contact metal atoms CMA and the transition metal atoms MA increases, the current will increase accordingly. Moreover, conditions B1 and B2 have substantially the same current value, this is because the structures of these two conditions (e.g., the structures of FIGS. 23B and 25A) have substantially same contact area between the contact metal atoms CMA and the transition metal atoms MA. The result further shows that when the contact area between the contact metal atoms CMA and the transition metal atoms MA increases, the current will increase.

FIGS. 27A and 27B illustrate crystal structures of a monolayer of a 2-D material layer in accordance with some example embodiments. FIG. 27A illustrates side view (top of FIG. 27A) and a top view (bottom of FIG. 27A) of a crystal structure of a TMD monolayer ML where chalcogen atoms CA are removed from both top side and bottom side of the TMD monolayer ML, such as the embodiments discussed in FIGS. 13 to 17. FIG. 27B illustrates side view (top of FIG. 27B) and a top view (bottom of FIG. 27B) of a crystal structure of the TMD monolayer ML when the contact is formed over the TMD monolayer ML, such as the embodiments discussed in FIGS. 13 to 17. It is noted that the contact metal atoms of the contact is not illustrated in FIG. 27B for brevity.

In the embodiments of FIGS. 27A and 27B, the chalcogen atoms CA are removed from both top side and bottom side of the TMD monolayer ML, this can reduce contact resistance between the TMD monolayer ML and the contact formed on the TMD monolayer ML. This is because the exposed transition metal atoms MA of the TMD monolayer ML will reconstruct and relax during forming the contact. For example, the contact is made of Pt, and the TMD monolayer ML is made of $WS_2$, in which the crystalline orientation of Pt is (110). The exposed W atoms (the transition metal atoms MA) will change their arrangement as indicated by arrows of FIG. 27A. In FIG. 27B, the exposed W atoms will be dragged by Pt metal to align with the Pt atoms, as shown in dash-block of FIG. 27B. This is because after the W atoms lose W—S bonds, the exposed W atoms of the TMD monolayer ML may fall into the lattice site of Pt metal.

Figure 29:
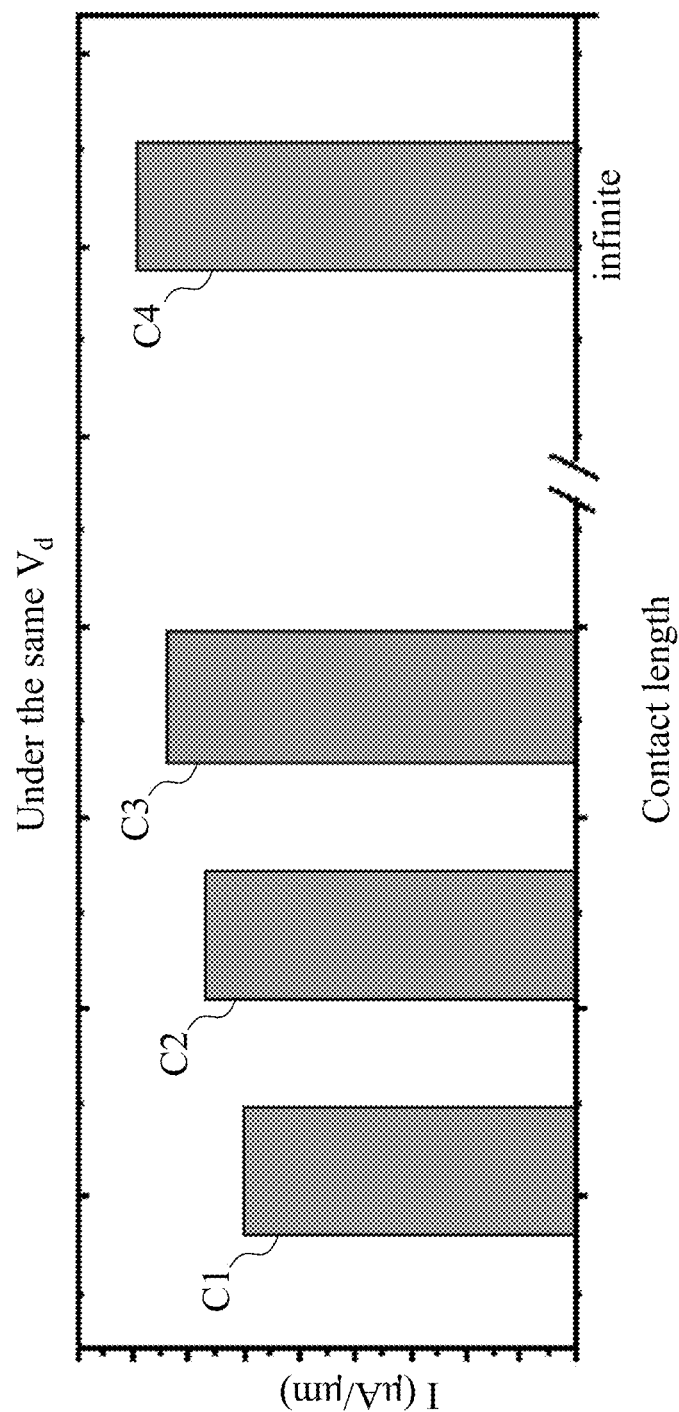
FIG. 29 illustrates simulation results of currents under fixed voltage in accordance with some example embodiments.
Figure 30A:
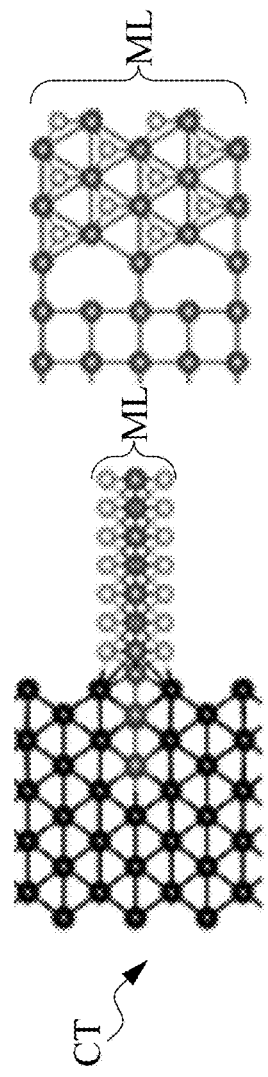
FIGS. 30A, 30B, 30C, 30D, 30E, and 30F illustrate crystal structures of a monolayer of a 2-D material layer and a metal contact in accordance with some example embodiments.
Figure 30B:
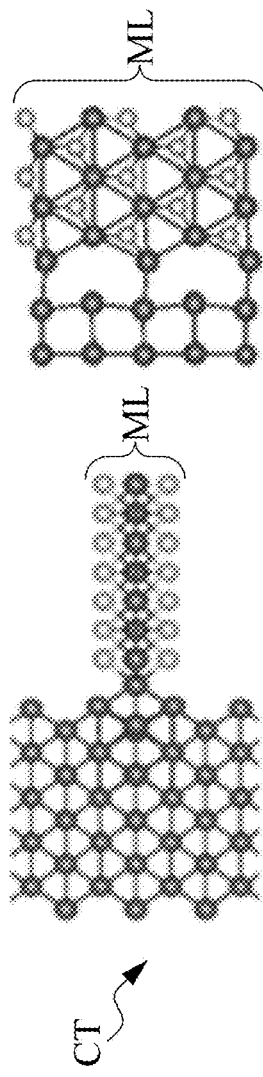
Figure 30C:
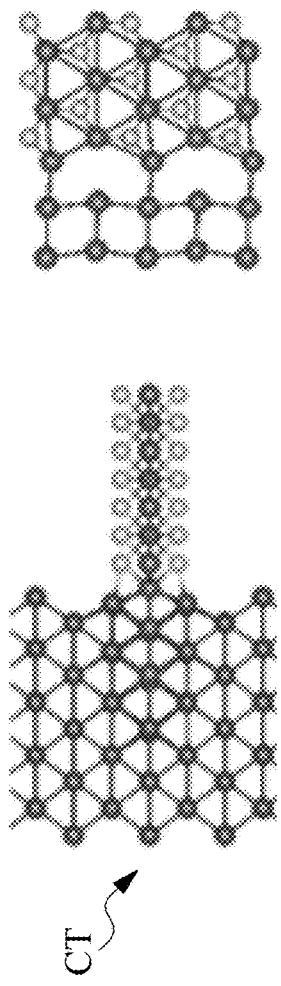
Figure 30D:
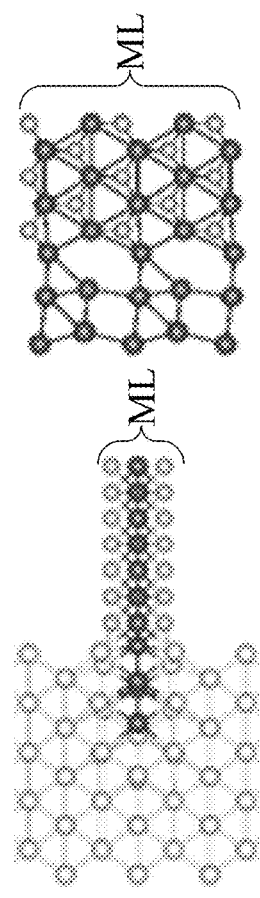
Figure 30E:
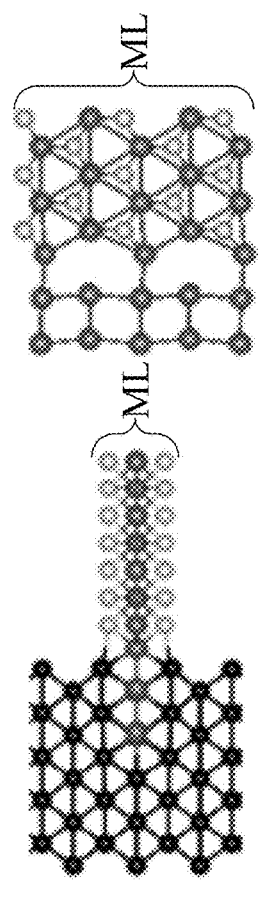
Figure 30F:
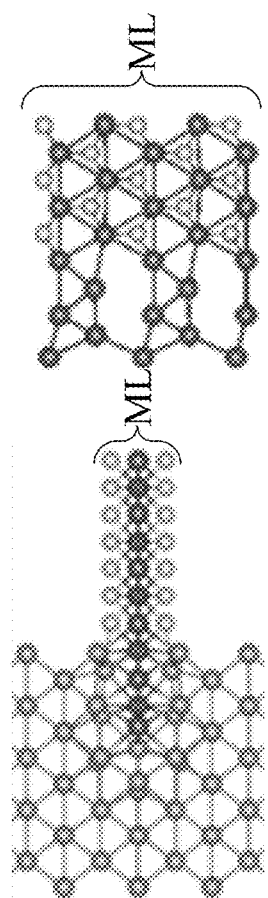

FIGS. 28A, 28B, 28C, and 28D illustrate crystal structures of a monolayer of a 2-D material layer and a metal contact in accordance with some example embodiments. FIG. 29 illustrates simulation results of currents under fixed voltage in accordance with some example embodiments.

FIGS. 28A, 28B, 28C, and 28D are examples where a contact CT is in contact with on a top side, and edge side, and a bottom side of a TMD monolayer ML, such as the embodiments discussed in FIGS. 13 to 17. The difference among FIGS. 28A, 28B, 28C, and 28D is that, the contact length between the contact metal atoms CMA and the transition metal atoms MA increases from FIGS. 28A, 28B, 28C, to 28D. That is, the contact metal atoms CMA are bonded with more transition metal atoms MA from FIGS. 28A, 28B, 28C, to 28D.

As shown in FIG. 29, shown there are simulated currents of four conditions C1, C2, C3, and C4 under fixed voltage, in which condition C1, C2, C3, and C4 are simulation results of the structures of FIGS. 28A, 28B, 28C, and 28D, respectively. The result shows that the current will increase when the contact length between the contact metal atoms CMA and the transition metal atoms MA increases. Furthermore, when the contact length is approached to infinite (e.g., FIG. 28D), the current will converge at a stable current.

Figure 31:
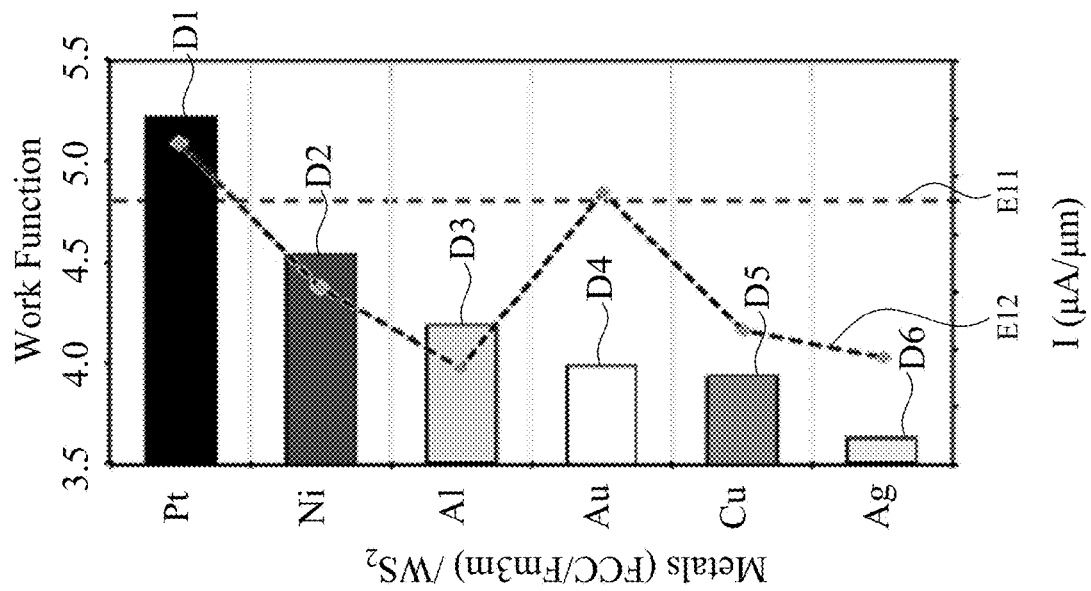
FIG. 31 illustrates simulation results of currents under fixed voltage in accordance with some example embodiments.

FIGS. 30A, 30B, 30C, 30D, 30E, and 30F illustrate crystal structures of a monolayer of a 2-D material layer and a metal contact in accordance with some example embodiments. In greater details, on the left side of FIGS. 30A, 30B, 30C, 30D, 30E, and 30F, shown there are side views of crystal structures of TMD monolayer ML and contact CT under different conditions. On the right side of FIGS. 30A, 30B, 30C, 30D, 30E, and 30F, shown there are top views of crystal structures of the TMD monolayer ML under different conditions. FIG. 31 illustrates simulation results of currents under fixed voltage in accordance with some example embodiments.

The TMD monolayers ML of FIGS. 30A, 30B, 30C, 30D, 30E, and 30F are made of the same material, such as $WS_2$ in some embodiments. However, the contacts CT of FIGS. 30A, 30B, 30C, 30D, 30E, and 30F are made of different materials. For example, the contacts CT of FIGS. 30A, 30B, 30C, 30D, 30E, and 30F may be Pt, Ni, Al, Au, Cu, Ag, respectively, in which these metals all include face-centered cubic (FCC) crystalline structure. As shown in right sides of FIGS. 30A, 30B, 30C, 30D, and 30E, after relax, the exposed W atoms may reconstruct and relax, and fall into the crystal structures of these metals (e.g., Pt, Ni, Al, Au, Cu). However, as shown in right side of FIG. 30F, the exposed W atoms do not fall into the crystal structure of the metal (e.g., Ag).

As shown in FIG. 31, shown there are simulated currents of six conditions D1, D2, D3, D4, D5, and D6 under fixed voltage, in which condition D1, D2, D3, D4, D5, and D6 are simulation results of the structures of FIGS. 30A, 30B, 30C, 30D, 30E, and 30F, respectively. The result shows that after the transition metal atoms MA are boned with the contact metal atoms CMA, only when the transition metal atoms MA are effectively twisted to have similar crystalline arrangement as the contact metal atoms CMA, the current may be improved, such as the examples of FIGS. 30A, 30B, 30C, 30D, and 30E.

FIG. 31 further illustrates curves E11 and E12. The curve E11 is a work function value of the transition metal of the TMD monolayer, such as W in such embodiments. On the other hand, the curve E12 is a work function tendency of the contact metals of FIGS. 30A, 30B, 30C, 30D, 30E, and 30F, such as Pt, Ni, Al, Au, Cu, Ag. It can be seen that when the work function value of the contact metal is greater than the work function value of the transition metal of the TMD monolayer, the current may be significantly improved, such as condition D1. As a result, referring back to FIGS. 1A to 22, if the source/drain contacts 130 (or the second metal layer 230B) include metals that have higher work function value than the work function value of the transition metal of the 2-D material layer 110, the current of the transistor may be improved.

Figure 33:
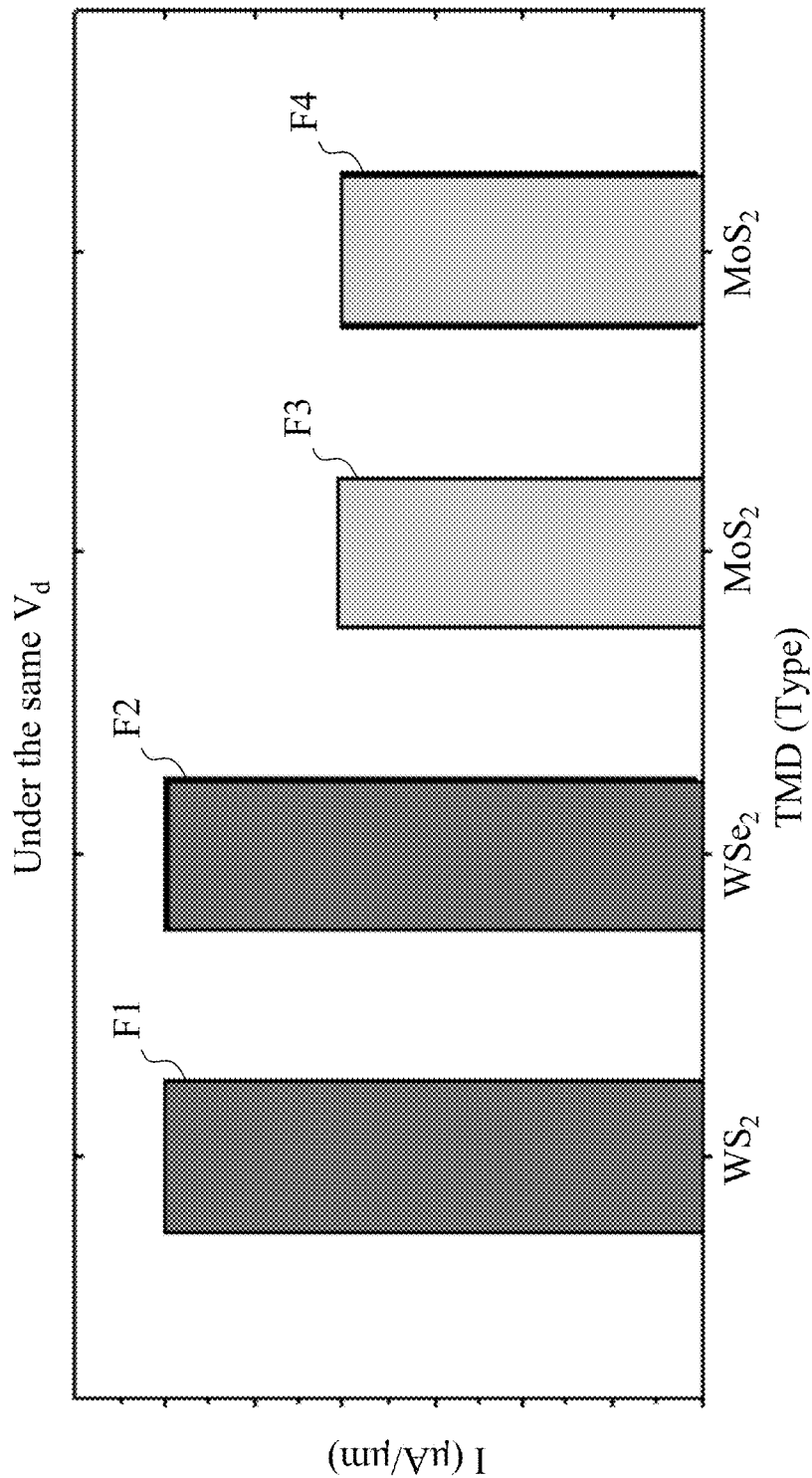
FIG. 33 illustrates simulation results of currents under fixed voltage in accordance with some example embodiments.

FIGS. 32A, 32B, 32C, and 32D illustrate crystal structures of a monolayer of a 2-D material layer and a metal contact in accordance with some example embodiments. FIG. 33 illustrates simulation results of currents under fixed voltage in accordance with some example embodiments.

The contacts CT of FIGS. 32A, 32B, 32C, and 32D are made of the same material, such as Pt in some embodiments. However, the TMD monolayers ML of FIGS. 32A, 32B, 32C, and 32D are made of different materials. For example, the TMD monolayers ML of FIGS. 32A, 32B, 32C, and 32D are made of $WS_2$, $WSe_2$, $MoSe_2$, and $MoS_2$, respectively. It is noted that, the exposed W atoms and the exposed Se atoms of the TMD monolayers ML will fall into the crystalline arrangement as the contact metal atoms (Pt).

As shown in FIG. 33, shown there are simulated currents of four conditions F1, F2, F3, and F4 under fixed voltage, in which conditions F1, F2, F3, and F4 are simulation results of the structures of FIGS. 32A, 32B, 32C, and 32D, respectively. In comparison of conditions F1 and F2, the currents of conditions F1 and F2 are substantially the same. Similarly, in comparison of conditions F3 and F4, the currents of conditions F3 and F4 are substantially the same. Accordingly, it can be seen that the materials of chalcogen atoms CA (e.g., S or Se) do not significantly affect the currents based on the same transition metal (e.g., W or Mo).

Figure 34A:
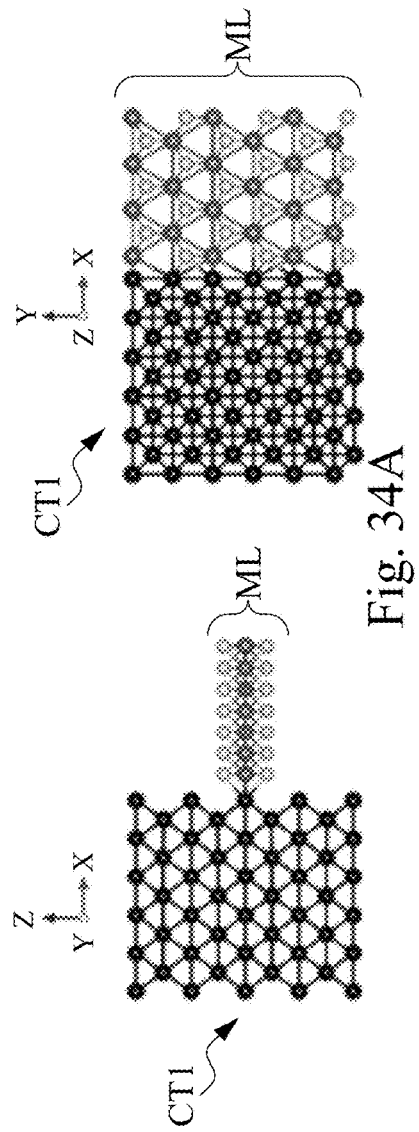
FIGS. 34A, 34B, and 34C illustrate crystal structures of a monolayer of a 2-D material layer and a metal contact in accordance with some example embodiments.
Figure 34B:
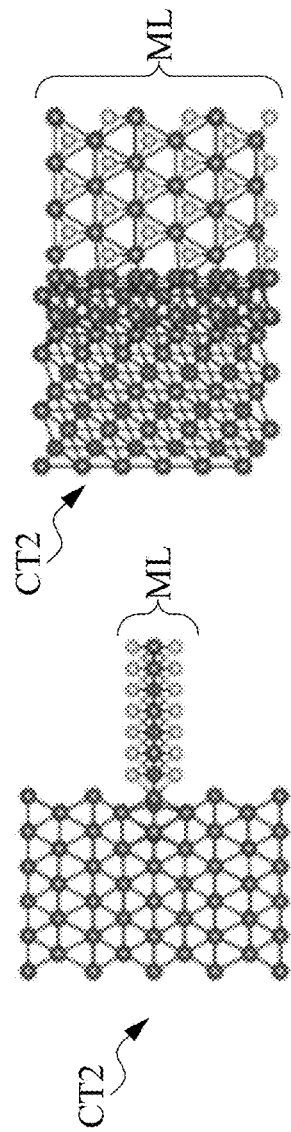
Figure 34C:
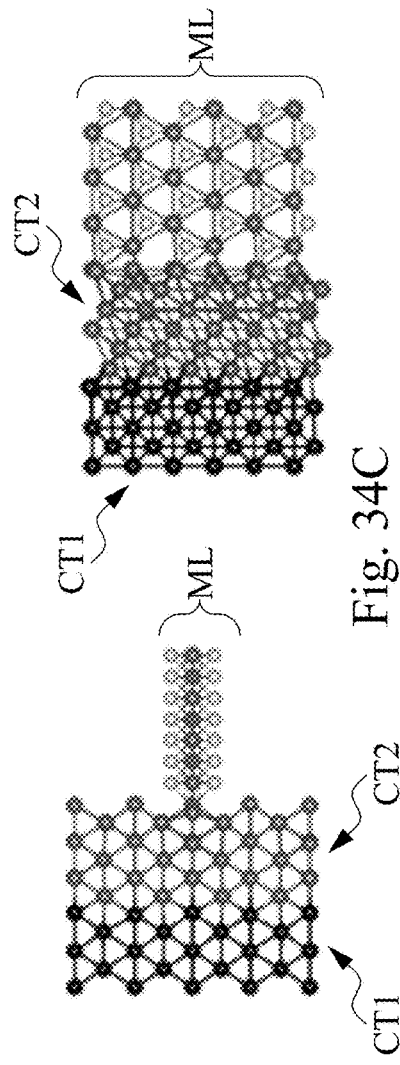
Figure 35:
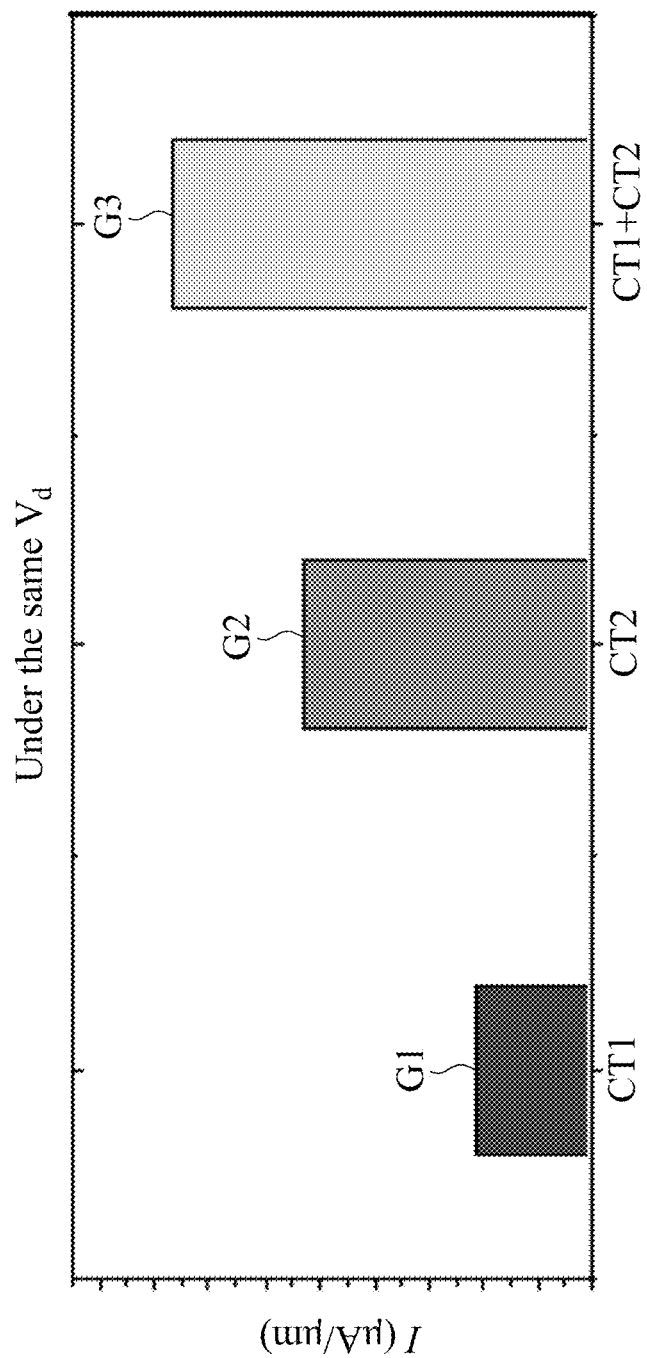
FIG. 35 illustrates simulation results of currents under fixed voltage in accordance with some example embodiments.

FIGS. 34A, 34B, and 34C illustrate crystal structures of a monolayer of a 2-D material layer and a metal contact in accordance with some example embodiments. FIG. 35 illustrates simulation results of currents under fixed voltage in accordance with some example embodiments.

The TMD monolayer ML of FIGS. 34A, 34B, and 34C are made of the same material, such as $WS_2$ in some embodiments. However, the contacts of FIGS. 34A, 34B, and 34C are different. For example, in FIG. 34A, a contact CT1 is connected to the TMD monolayer ML via side contact, in which the contact CT1 may include a first metal, such as Pt. In FIG. 34B, a contact CT2 is connected to the TMD monolayer ML via side contact, in which the contact CT2 may include a second metal, such as W, in which the second metal is different from the first metal of contact CT1. In some embodiments, the second metal may be the same as the transition metal of the TMD monolayer ML, such as W. In FIG. 34C, a multi-metal contact is connected to the TMD monolayer ML, in which the contact CT2 is connected to the TMD monolayer ML, and the contact CT1 is connected to the contact CT2.

As shown in FIG. 35, shown there are simulated currents of three conditions G1, G2, and G3 under fixed voltage, in which conditions G1, G2, and G3 are simulation results of the structures of FIGS. 34A, 34B, and 34C, respectively. In comparison of G1 and G2, it can be seen that when the contact metal (e.g., CT2) is the same as the transition metal of the TMD monolayer ML, the current may be improved. Moreover, in comparison of G1, G2, and G3, it can be seen that the current of condition G3 (e.g., about 1536 µA/µm) is greater than the sum of the current of condition G1 (e.g., about 428 µA/µm) and the current of condition G2 (e.g., about 1052 µA/µm). That is, when a multi-metal contact is used, the contact resistance may be reduced and the current can be further improved.

FIGS. 36A, 36B, 36C, and 36D illustrate crystal structures of a monolayer of a 2-D material layer and a metal contact in accordance with some example embodiments. FIG. 37 illustrates simulation results of currents under fixed voltage in accordance with some example embodiments. The left sides of 36A, 36B, 36C, and 36D illustrate side views of crystal structures of TMD monolayer and contact under different conditions, and the right sides of 36A, 36B, 36C, and 36D illustrate perspective views of crystal structures of TMD monolayer and contact under different conditions.

Figure 36A:
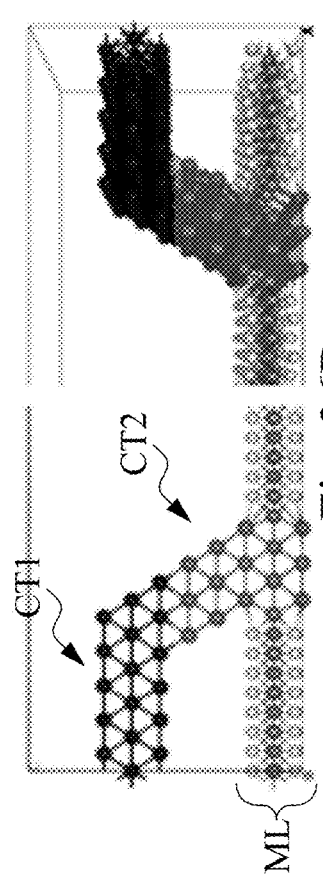
FIGS. 36A, 36B, 36C, and 36D illustrate crystal structures of a monolayer of a 2-D material layer and a metal contact in accordance with some example embodiments.
Figure 36B:
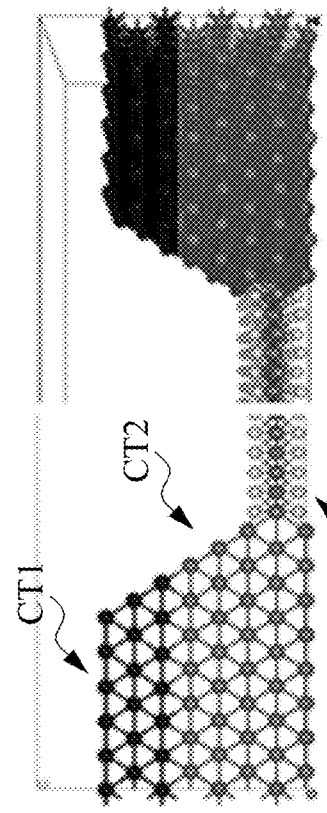
Figure 36C:
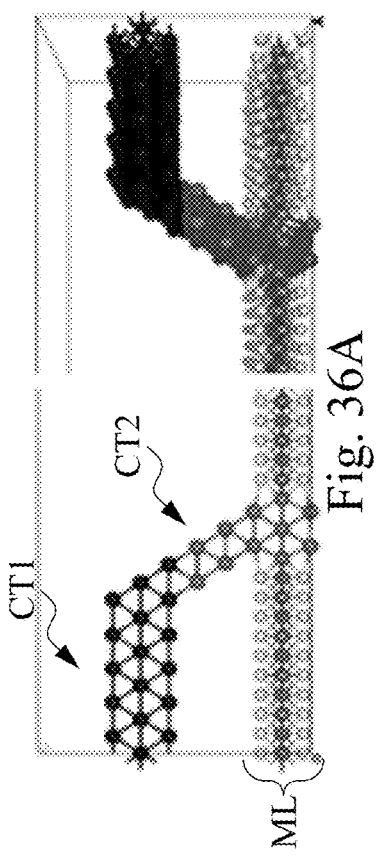
Figure 36D:
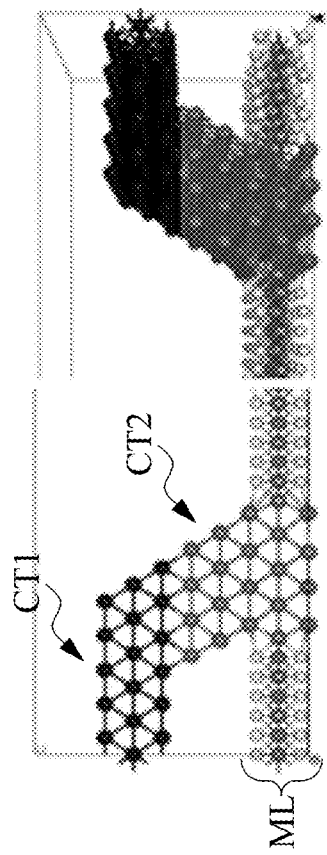
Figure 37:
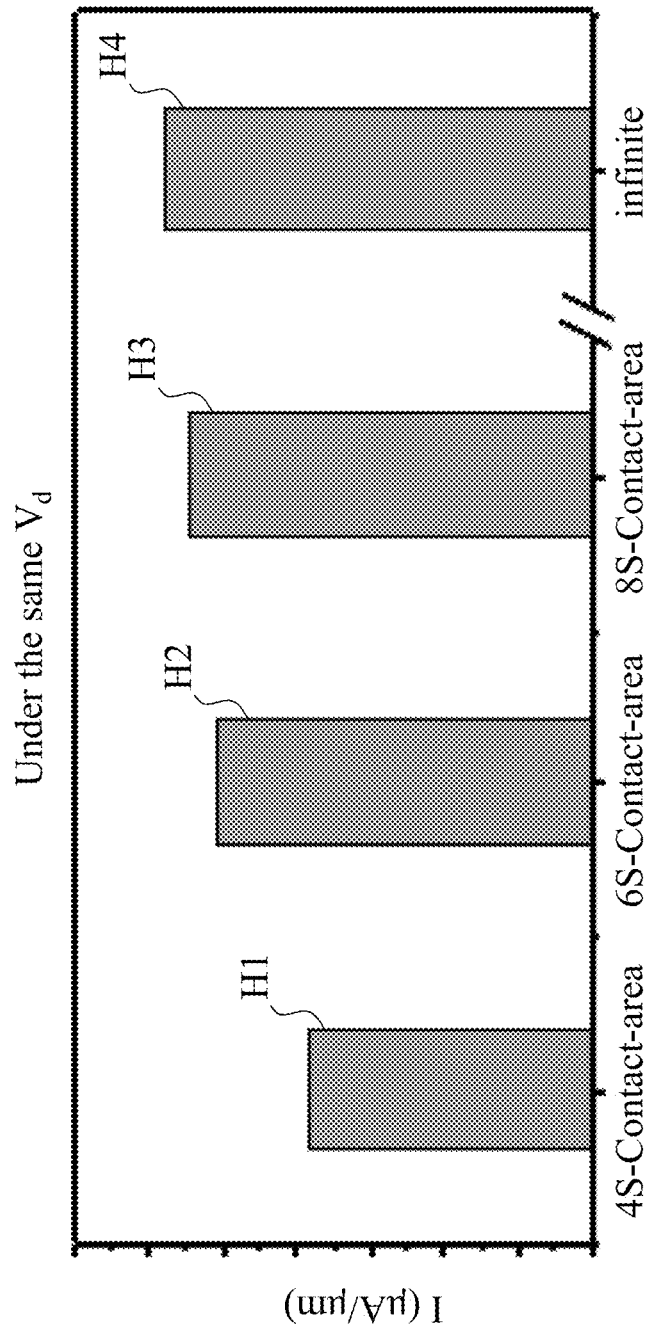
FIG. 37 illustrates simulation results of currents under fixed voltage in accordance with some example embodiments.

FIGS. 36A, 36B, 36C, and 36D illustrate structures where a TMD monolayer ML is first etched to form an opening extending through the TMD monolayer ML, a contact CT2 is then filled in the opening, and a contact CT1 is formed over the contact CT2. The structures of FIGS. 36A, 36B, 36C, and 36D are similar to the embodiments of FIGS. 18A to 22. For example, the contact CT2 may be similar to the first metal layer 230A discussed in FIGS. 18A to 22, and the contact CT1 may be similar to the second metal layer 230B discussed in FIGS. 18A to 22. The difference among FIGS. 36A, 36B, 36C, and 36D is that the length of the contact CT2 increases from FIGS. 36A to 36D, and the contact area between contact CT2 and contact CT1 increases from FIGS. 36A to 36D. In some embodiments, FIG. 36A is an embodiment where 2 columns of the chalcogen atoms of the TMD monolayer ML are removed, FIG. 36B is an embodiment where 4 columns of the chalcogen atoms of the TMD monolayer ML are removed, FIG. 36C is an embodiment where 6 columns of the chalcogen atoms of the TMD monolayer ML are removed, and FIG. 36D is an embodiment where infinite columns (e.g., macroscopic numbers of columns) of the chalcogen atoms of the TMD monolayer ML are removed.

As shown in FIG. 37, shown there are simulated currents of three conditions H1, H2, H3, and H4 under fixed voltage, in which conditions H1, H2, H3, and H4 are simulation results of the structures of FIGS. 36A, 36B, 36C, and 36D, respectively. It can be seen that when the contact area between contact CT2 and contact CT1 increases, the current can be improved.

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. One advantage is that chalcogen atoms are removed from source/drain regions of a TMD channel layer prior to forming source/drain contacts, such that the metal atoms of the source/drain contacts may form metallic bonds with transition metal atoms of the TMD channel layer, which will increase the contact area between source/drain contacts and the source/drain regions of the TMD channel layer, such that the current of a transistor can be improved. Another advantage is that, when chalcogen atoms are removed from more sides of the TMD channel layer, the contact area between source/drain contacts and the source/drain regions of the TMD channel layer will be increased, and the current of a transistor can be improved. Yet another advantage is that, when a work function value of the metal atoms of the source/drain contacts is greater than a work function value of the transition metal atoms of the TMD channel layer, the current of a transistor can be improved. Yet another advantage is that, when the metal atoms of the source/drain contacts is the same as the transition metal atoms of the TMD channel layer, the current of a transistor can be improved. Yet another advantage is that, when the source/drain contacts are a multi-metal structure, the current of a transistor can be improved.

In some embodiments of the present disclosure, a semiconductor device includes a substrate, a 2-D material layer, source/drain contacts, and a gate electrode. The 2-D material layer is over the substrate, the 2-D material layer includes source/drain regions and a channel region between the source/drain regions, in which the 2-D material layer is made of a transition metal dichalcogenide (TMD). The source/drain contacts are in contact with source/drain regions of the 2-D material layer, in which a binding energy of transition metal atoms at the channel region of the 2-D material layer is different from a binding energy of the transition metal atoms at the source/drain regions of the 2-D material layer. The gate electrode is over the substrate. In some embodiments, along a vertical direction, metal atoms of the source/drain contacts and the transition metal atoms at the source/drain regions of the 2-D material layer are free of chalcogen atoms interposed therebetween. In some embodiments, metal atoms of the source/drain contacts are the same as the transition metal atoms of the 2-D material layer. In some embodiments, a work function value of a metal of the source/drain contacts is larger than a work function value of a transition metal of the 2-D material layer. In some embodiments, one of the source/drain contacts is in contact with a top surface of the 2-D material layer and a sidewall of the 2-D material layer. In some embodiments, one of the source/drain contacts is in contact with a top surface of the 2-D material layer, a sidewall of the 2-D material layer, and a bottom surface of the 2-D material layer. In some embodiments, one of the source/drain contacts has a portion extending to a bottom surface of the 2-D material layer, and wherein along a vertical direction, metal atoms of the portion of the one of the source/drain contacts and the transition metal atoms at the source/drain regions of the 2-D material layer are free of chalcogen atoms interposed therebetween. In some embodiments, the semiconductor device further includes a gate dielectric layer vertically between the 2-D material layer and the substrate, and the gate electrode is disposed on a back side of the substrate that is opposite to the gate dielectric layer. In some embodiments, a binding energy of the transition metal atoms at a first portion of the source/drain regions of the 2-D material layer of the 2-D material layer is different from a binding energy of the transition metal atoms at a second portion of the source/drain regions of the 2-D material layer of the 2-D material layer.

In some embodiments of the present disclosure, a semiconductor device includes a substrate, a 2-D material layer, source/drain contacts, and a gate electrode. The 2-D material layer is over the substrate, in which the 2-D material layer is made of a transition metal dichalcogenide (TMD). The source/drain contacts are over the substrate, in which each of the source/drain contacts extends through the 2-D material layer, and wherein each of the source/drain contacts comprises a first metal layer and a second metal layer over the first metal layer. The gate electrode is over the substrate. In some embodiments, the first metal layer is made of a same metal as a transition metal of the 2-D material layer. In some embodiments, the second metal layer is made of a different metal than the transition metal of the 2-D material layer. In some embodiments, a work function value of the second metal layer is larger than a work function value of the transition metal of the 2-D material layer. In some embodiments, the semiconductor device further includes a gate dielectric layer vertically between the substrate and the 2-D material layer, in which the source/drain contacts are in contact with the gate dielectric layer. In some embodiments, the gate dielectric layer and the gate electrode are on opposite sides of the substrate.

In some embodiments of the present disclosure, a method includes forming a 2-D material layer over a substrate, wherein a monolayer of the 2-D material layer comprises a middle layer of transition metal atoms, a top layer of chalcogen atoms, and a bottom layer of chalcogen atoms; forming a passivation layer over the 2-D material layer, in which the passivation layer comprises openings exposing source/drain regions of the 2-D material layer; performing an etching process to remove chalcogen atoms from the top layer of the monolayer of the 2-D material layer through the openings of the passivation layer; forming source/drain contacts in the openings of the passivation layer; and forming a gate electrode over the substrate. In some embodiments, the method further includes removing chalcogen atoms from the bottom layer of the monolayer of the 2-D material layer, while leaving the middle layer of transition metal atoms intact. In some embodiments, the etching process etches through the 2-D material layer, and forming the source/drain contacts includes depositing a first metal layer in the openings of the passivation layer, wherein the first metal layer is made of a same material as a transition metal of the 2-D material layer; and depositing a second metal layer over the first metal layer, in which the second metal layer is made of a different material than the first metal layer. In some embodiments, the openings of the passivation layer exposes sidewalls of the 2-D material layer, and the source/drain contacts are in contact with the sidewalls of the 2-D material layer. In some embodiments, after the etching process is completed, the middle layer of transition metal atoms remains substantially intact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a 2-D material layer over the substrate, the 2-D material layer comprising source/drain regions and a channel region between the source/drain regions, wherein the 2-D material layer is made of a transition metal dichalcogenide (TMD);
   source/drain contacts in contact with the source/drain regions of the 2-D material layer, wherein a binding energy of transition metal atoms at the channel region of the 2-D material layer is different from a binding energy of the transition metal atoms at the source/drain regions of the 2-D material layer, and wherein along a vertical direction, metal atoms of the source/drain contacts and the transition metal atoms at the source/drain regions of the 2-D material layer are free of chalcogen atoms interposed therebetween; and
   a gate electrode over the substrate.

2. The semiconductor device of claim 1, wherein metal atoms of the source/drain contacts are the same as the transition metal atoms of the 2-D material layer.

3. The semiconductor device of claim 1, wherein a work function value of a metal of the source/drain contacts is larger than a work function value of a transition metal of the 2-D material layer.

4. The semiconductor device of claim 1, wherein one of the source/drain contacts is in contact with a top surface of the 2-D material layer and a sidewall of the 2-D material layer.

5. The semiconductor device of claim 1, wherein one of the source/drain contacts is in contact with a top surface of the 2-D material layer, a sidewall of the 2-D material layer, and a bottom surface of the 2-D material layer.

6. The semiconductor device of claim 1, wherein one of the source/drain contacts has a portion extending to a bottom surface of the 2-D material layer, and wherein along the vertical direction, metal atoms of the portion of the one of the source/drain contacts and the transition metal atoms at the source/drain regions of the 2-D material layer are free of chalcogen atoms interposed therebetween.

7. The semiconductor device of claim 1, further comprising a gate dielectric layer vertically between the 2-D material layer and the substrate, and the gate electrode is disposed on a back side of the substrate that is opposite to the gate dielectric layer.

8. The semiconductor device of claim 1, wherein a binding energy of the transition metal atoms at a first portion of the source/drain regions of the 2-D material layer is different from a binding energy of the transition metal atoms at a second portion of the source/drain regions of the 2-D material layer.

9. A semiconductor device, comprising:
a substrate;
a 2-D material layer over the substrate, wherein the 2-D material layer is made of a transition metal dichalcogenide (TMD);
source/drain contacts over the substrate, wherein each of the source/drain contacts extends through the 2-D material layer, wherein each of the source/drain contacts comprises a first metal layer in contact with a respective source/drain region of the 2-D material layer and a second metal layer over the first metal layer, and wherein metal atoms of the first metal layer of each of the source/drain contacts and transition metal atoms at the respective source/drain region of the 2-D material layer are free of chalcogen atoms interposed therebetween; and
a gate electrode over the substrate.

10. The semiconductor device of claim 9, wherein the first metal layer is made of a same metal as a transition metal of the 2-D material layer.

11. The semiconductor device of claim 10, wherein the second metal layer is made of a different metal than the transition metal of the 2-D material layer.

12. The semiconductor device of claim 11, wherein a work function value of the second metal layer is larger than a work function value of the transition metal of the 2-D material layer.

13. The semiconductor device of claim 9, further comprising a gate dielectric layer vertically between the substrate and the 2-D material layer, wherein the source/drain contacts are in contact with the gate dielectric layer.

14. The semiconductor device of claim 13, wherein the gate dielectric layer and the gate electrode are on opposite sides of the substrate.

15. The semiconductor device of claim 9, wherein the first metal layer cups an underside of the second metal layer.

16. A method, comprising:
forming a 2-D material layer over a substrate, wherein a monolayer of the 2-D material layer comprises a middle layer of transition metal atoms, a top layer of chalcogen atoms, and a bottom layer of chalcogen atoms;
forming a passivation layer over the 2-D material layer, wherein the passivation layer comprises openings exposing source/drain regions of the 2-D material layer;
performing an etching process to remove chalcogen atoms from the top layer of the monolayer of the 2-D material layer through the openings of the passivation layer;
forming source/drain contacts in the openings of the passivation layer; and
forming a gate electrode over the substrate.

17. The method of claim 16, further comprising removing chalcogen atoms from the bottom layer of the monolayer of the 2-D material layer, while leaving the middle layer of transition metal atoms intact.

18. The method of claim 16, wherein the etching process etches through the 2-D material layer, and forming the source/drain contacts comprises:
depositing a first metal layer in the openings of the passivation layer, wherein the first metal layer is made of a same material as a transition metal of the 2-D material layer; and
depositing a second metal layer over the first metal layer, wherein the second metal layer is made of a different material than the first metal layer.

19. The method of claim 18, wherein the openings of the passivation layer exposes sidewalls of the 2-D material layer, and the source/drain contacts are in contact with the sidewalls of the 2-D material layer.

20. The method of claim 16, wherein after the etching process is completed, the middle layer of transition metal atoms remains substantially intact.

* * * * *